US011393987B2

(12) United States Patent
Stengel et al.

(10) Patent No.: US 11,393,987 B2
(45) Date of Patent: Jul. 19, 2022

(54) ORGANIC ELECTROLUMINESCENT DEVICE

(71) Applicant: Merck Patent GmbH, Darmstadt (DE)

(72) Inventors: Ilona Stengel, Gorxheimertal (DE); Frank Voges, Bad Duerkheim (DE); Teresa Mujica-Fernaud, Darmstadt (DE); Henning Seim, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 309 days.

(21) Appl. No.: 16/489,728

(22) PCT Filed: Feb. 27, 2018

(86) PCT No.: PCT/EP2018/054772
§ 371 (c)(1),
(2) Date: Aug. 29, 2019

(87) PCT Pub. No.: WO2018/158232
PCT Pub. Date: Sep. 7, 2018

(65) Prior Publication Data
US 2019/0372025 A1 Dec. 5, 2019

(30) Foreign Application Priority Data

Mar. 1, 2017 (EP) .................................... 17158613

(51) Int. Cl.
*H01L 51/50* (2006.01)
*H01L 51/00* (2006.01)
*C07F 9/94* (2006.01)
*H01L 51/56* (2006.01)

(52) U.S. Cl.
CPC ............ *H01L 51/0077* (2013.01); *C07F 9/94* (2013.01); *H01L 51/006* (2013.01); *H01L 51/0003* (2013.01); *H01L 51/0008* (2013.01); *H01L 51/0055* (2013.01); *H01L 51/0056* (2013.01); *H01L 51/0058* (2013.01); *H01L 51/5012* (2013.01); *H01L 51/5016* (2013.01); *H01L 51/5056* (2013.01); *H01L 51/5088* (2013.01); *H01L 51/56* (2013.01); *H01L 2251/558* (2013.01)

(58) Field of Classification Search
None
See application file for complete search history.

(56) References Cited

U.S. PATENT DOCUMENTS

| 9,112,175 | B2 | 8/2015 | Murano et al. |
| 9,156,868 | B2 | 10/2015 | Zeika et al. |
| 9,455,416 | B2 | 9/2016 | Diez et al. |
| 9,917,272 | B2 | 3/2018 | Voges et al. |
| 10,305,047 | B2 | 5/2019 | Maltenberger et al. |
| 2007/0007882 | A1* | 1/2007 | Fukuoka ............ H01L 51/0051 313/503 |
| 2014/0299849 | A1 | 10/2014 | Jeon et al. |
| 2014/0361286 | A1 | 12/2014 | Jaeger et al. |
| 2015/0102311 | A1 | 4/2015 | Diez et al. |
| 2015/0200378 | A1 | 7/2015 | Reusch et al. |
| 2016/0072078 | A1* | 3/2016 | Lee ..................... H01L 51/0071 257/40 |
| 2016/0181540 | A1 | 6/2016 | Kessler et al. |
| 2017/0331053 | A1 | 11/2017 | Voges et al. |

FOREIGN PATENT DOCUMENTS

| CN | 104718636 A | 6/2015 | |
| CN | 106058064 A | 10/2016 | |
| DE | 10-2012-208235 A1 * | 11/2013 | ............ H01L 51/56 |
| DE | 102012208235 A1 | 11/2013 | |
| DE | 102013215342 A1 | 2/2015 | |
| EP | 1806795 A1 | 7/2007 | |
| KR | 10-2015-0041097 A | 4/2015 | |
| WO | WO-200149806 A1 | 7/2001 | |
| WO | WO-2008128519 A2 | 10/2008 | |
| WO | WO-2013182389 A2 | 12/2013 | |
| WO | WO-2014056565 A1 | 4/2014 | |
| WO | WO-2016062368 A1 | 4/2016 | |
| WO | 2016/107667 A1 | 7/2016 | |
| WO | WO-2016188609 A1 | 12/2016 | |
| WO | 2018/158232 A1 | 9/2018 | |

OTHER PUBLICATIONS

Huang, D., et al., "Bismuth Interfacial Doping of Organic Small Molecules for High Performance n-type Thermoelectric Materials", Angewandte Chemie International Edition, vol. 55, No. 36, (2016), pp. 10672-10675.

International Search Report for PCT/EP2018/054772 dated May 9, 2018.

Pecqueur, S., et al., "Wide Band-Gap Bismuth-based p-Dopants for Opto-Electronic Applications", Angewandte Chemie International Edition, vol. 55, No. 35, (2016), pp. 10493-10497.

Written Opinion of the International Searching Authority for PCT/EP2018/054772 dated May 9, 2018.

* cited by examiner

*Primary Examiner* — Gregory D Clark
(74) *Attorney, Agent, or Firm* — Faegre Drinker Biddle & Reath LLP

(57) ABSTRACT

The present invention relates to an organic electroluminescent device comprising a hole-injection layer comprising a metal complex as a main component and a method for producing the organic electroluminescent device.

17 Claims, No Drawings

ORGANIC ELECTROLUMINESCENT DEVICE

CROSS-REFERENCE TO RELATED APPLICATIONS

This application is a national stage application (under 35 U.S.C. § 371) of PCT/EP2018/054772, filed Feb. 27, 2018, which claims benefit of European Application No. 17158613.4, filed Mar. 1, 2017, both of which are incorporated herein by reference in their entirety.

The present application relates to an organic electroluminescent device (OLEDs) comprising a hole-injection layer comprising a bismuth or gallium complex as a main component and a method for producing the organic electroluminescent device.

The structure of OLEDs in which organic semiconductors are employed as functional materials is well known. Generally, an OLED comprises an anode, a cathode and an organic light emitting unit. The last one comprises several functional layers like, for example, hole- or electron-injection layers, hole- or electron-transport layers and organic light emitting layers.

In the case of OLEDs, there is considerable interest in improving the performance data, in particular lifetime, efficiency and operating voltage.

The efficiency and lifetime of OLEDs are determined, inter alia, by the charge-carrier balance of electrons and holes in the device. This balance becomes established through the charge-carrier distribution and the associated field distribution in the device.

Efficient hole-injection is a major challenge in the fabrication of OLEDs. The absolute value of the work function of commonly used transparent anode material indium-tin oxide is typically below the absolute value of the highest occupied molecular orbital (HOMO) energies of common hole-transport materials.

Thus, there is a barrier for hole-injection into the hole-transport layer, which leads to an increase in the operating voltage of the OLED. This issue is typically approached by either doping the hole-transport layer with a p-dopant (for example like in WO 2014/056565), or by applying an acceptor-layer in between the anode and the hole-transport layer (for example like in WO 2001/49806). A p-dopant is a dopant and therefore it represents the (or one of the) component present in lower amount in the corresponding layer.

Metal complexes, in particular bismuth complexes (for example as described in WO 2013/182389), have recently been shown to work efficiently as p-dopants.

The use of hole-injection layers instead of p-doped layers is known from the prior art (for example in WO 2001/49806). For example, hole-injection layers consisting of HATCN (as described in WO 2001/49806) are well-known.

However, there is still a need for new hole-injection systems, which lead to a decrease in the operating voltage when employed in an OLED. A decrease in the operating voltage leads in return to an OLED having better performances in terms of lifetime and efficiency.

Surprisingly, it has now been found that it is possible to use a thin layer of a bismuth or gallium complex as a hole-injection layer in an OLED in order to efficiently lower the operating voltage of the OLED. At the same time, the required amount of metal complex is smaller than when the metal complex is used as a p-dopant in a thick layer. Furthermore, the fabrication of the OLED, when the metal complex is deposited as a neat hole-injection layer via an evaporation process, is simplified, as only one evaporation source is needed.

The present application thus relates to an organic electroluminescent device comprising:
  a cathode;
  an anode;
  at least one emitting layer arranged between the cathode and the anode;
  at least one hole-transport layer arranged between the anode and the at least one emitting layer; and
  at least one hole-injection layer arranged between the anode and the at least one hole-transport layer,
  where the at least one hole-injection layer comprises at least 90% by weight, based on the total weight of the hole-injection layer, of at least one bismuth or gallium complex,
  where the reduction potential of the bismuth or gallium complex is higher than or equal to −3.5 V and lower than or equal to 0.5 V vs. Fc/Fc$^+$, determined by cyclic voltammetry.

The organic electroluminescent device according to the invention comprises at least one hole-injection layer. A hole-injection layer for the purposes of the present invention is taken to mean a layer, which simplifies or facilitates the transfer of holes, i.e. positive charges, from the anode into an organic layer.

In accordance with a preferred embodiment, the at least one hole-injection layer comprises at least 95% by weight, more preferably at least 99% by weight, based on the total weight of the hole-injection layer, of at least one bismuth or gallium complex. It is particularly preferably that the at least one hole-injection layer consists of a neat layer of at least one bismuth or gallium complex.

In accordance with a preferred embodiment, the bismuth complex or the gallium complex according to the invention has a reduction potential higher than or equal to −3.0 V and lower than or equal to 0 V vs. Fc/Fc$^+$, as determined by cyclic voltammetry. Preferably, the reduction potential of the bismuth complex or gallium complex is higher than or equal to −2.5 V and lower than or equal to −0.5 V vs. Fc/Fc$^+$, as determined by cyclic voltammetry. Very preferably, the reduction potential of the bismuth complex or gallium complex is higher than or equal to −2.5 V and lower than or equal to −1.5 V vs Fc/Fc$^+$, as determined by cyclic voltammetry.

Cyclic voltammetry (CV) is a type of potentiodynamic electrochemical measurement, in which the working electrode potential is ramped linearly versus time. A computer controlled Metrohm MicroAutolab Typ III potentiostat is used and the data is analyzed by the Nova 1.10 software. In accordance with the present invention, cyclic voltammetry is measured in dry organic solvents (preferably THF or DCM) at concentrations of $10^{-3}$ mol/l under argon. Tetrabutylammonium hexafluorophosphate (TBAHFP) is added as electrolyte at concentrations of 0.1 mol/l. An Au wire (diam. 2 or 3 mm) serves as working electrode, Ag/AgCl with an ethylene glycol based saltbridge serves as reference electrode and a Pt wire serves as counter electrode. Ferrocene (Fc/Fc$^+$) is added as internal reference.

In accordance with a preferred embodiment, the hole-injection layer has a thickness of from 0.5 to 50 nm, preferably from 0.5 to 25 nm, very preferably from 1 to 5 nm, particularly preferably from 1 to 3 nm.

It is furthermore preferred that the hole-injection layer is adjacent to the anode on the anode side and adjacent to the hole-transport layer on the cathode side.

In accordance with a preferred embodiment of the invention, the metal complex is a bismuth complex comprising a ligand of the following structure:

(L-1)

where $R^{11}$ and $R^{12}$ are selected, identically or differently, from the group consisting of O, S, Se, NH and $NR^{14}$, where $R^{14}$ is an alkyl or aryl group; where $R^{14}$ and $R^{13}$ may form a ring with one other; and $R^{13}$ is selected from the group consisting of a straight-chain alkyl, alkoxy or thioalkyl group having 1 to 40 C atoms, an alkenyl or alkinyl group having 2 to 40 C atoms, a branched or cyclic alkyl, alkoxy or thioalkyl group having 3 to 40 C atoms, each of which may be substituted by one or more radicals R, where in each case one or more non-adjacent $CH_2$ groups may be replaced by RC=CR, C≡C, $Si(R)_2$, C=O, C=S, C=NR, P(=O)(R), SO, $SO_2$, NR, O, S or CONR and where one or more H atoms may be replaced by D, F, Cl, Br, I or CN, an aromatic or heteroaromatic ring system having 5 to 60 aromatic ring atoms, which may in each case be substituted by one or more radicals R, an aryloxy or heteroaryloxy group having 5 to 60 aromatic ring atoms, which may be substituted by one or more radicals R, an aralkyl or heteroaralkyl group having 5 to 60 aromatic ring atoms, which may in each case be substituted by one or more radicals R, and a diarylamino group, diheteroarylamino group or arylheteroarylamino group having 10 to 40 aromatic ring atoms, which may be substituted by one or more radicals R; where $R^{13}$ may form a ring with at least one of the radical $R^{12}$; and R is on each occurrence, identically or differently, H, D, F or, a straight-chain alkyl group having 1 to 20 C atoms or a branched or cyclic alkyl group having 3 to 20 C atoms, where one or more H atoms in the straight-chain, branched or cyclic alkyl groups may be replaced by F, an aromatic or heteroaromatic ring system having 5 to 20 aromatic ring atoms, in which one or more H atoms in the aromatic or heteroaromatic ring system may be replaced by F; where two or more substituents R may also form a mono- or polycyclic, aliphatic or aromatic ring system with one another.

Preferably, $R^{11}$ and $R^{12}$ are selected, identically or differently, from the group consisting of O, S and Se. More preferably, $R^{11}$ and $R^{12}$ are O.

Preferably, $R^{13}$ is selected from the group consisting of an aromatic or heteroaromatic ring system having 5 to 40 aromatic ring atoms, which may in each case be substituted by one or more radicals R, an aryloxy or heteroaryloxy group having 5 to 40 aromatic ring atoms, which may be substituted by one or more radicals R; where $R^{13}$ may form a ring with at least one of the radical $R^{12}$. More preferably, $R^{13}$ is selected from the group consisting of an aromatic or heteroaromatic ring system having 5 to 13 aromatic ring atoms, which may in each case be substituted by one or more radicals R. Very preferably, $R^{13}$ is a benzene group, which may in each case be substituted by one or more radicals R.

Preferably, R is on each occurrence, identically or differently, H, F, a straight-chain alkyl group having 1 to 10 C atoms or a branched or cyclic alkyl group having 3 to 10 C atoms, where one or more H atoms in the straight-chain, branched or cyclic alkyl groups may be replaced by F, an aromatic or heteroaromatic ring system having 5 to 10 aromatic ring atoms, in which one or more H atoms in the aromatic or heteroaromatic ring system may be replaced by F; where two or more substituents R may also form a mono- or polycyclic, aliphatic or aromatic ring system with one another. More preferably, R is on each occurrence, identically or differently, H, F, a straight-chain alkyl group having 1 to 10 C atoms, where one or more H atoms in the straight-chain alkyl group may be replaced by F.

Preferably, the bismuth complex is selected from bismuth (III) acetates and bismuth(III) benzoates, more preferably from bismuth(III) benzoates.

More preferably, the bismuth complex corresponds to a complex of the formula (P-1):

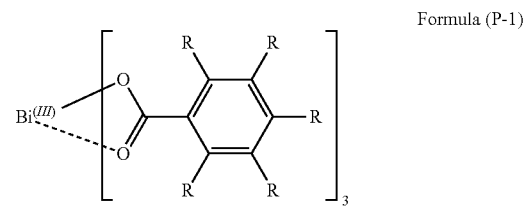

Formula (P-1)

where R has the same definition as above.

In accordance with a preferred embodiment, at least one group R, in the groups of formulae (L-1) and (P-1), is F or a straight-chain alkyl group having 1 to 10 C atoms, preferably 1 to 5 C atoms, more preferably 1 to 3 C atoms, where at least one H atom in the straight-chain alkyl group is replaced by F.

Examples of suitable bismuth or gallium complexes for use in the organic electroluminescent device in the hole-injection layer, are shown below:

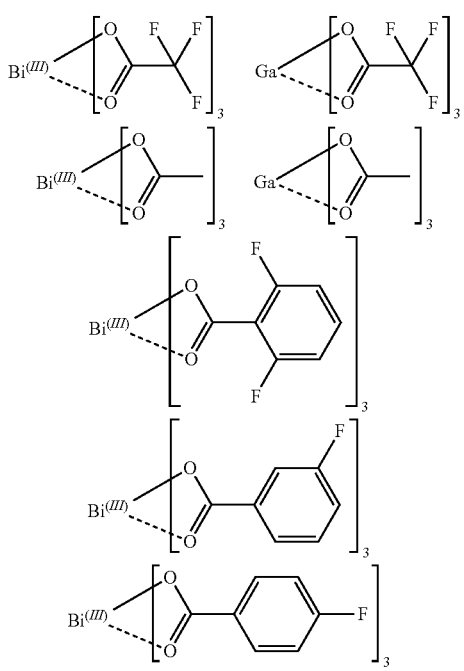

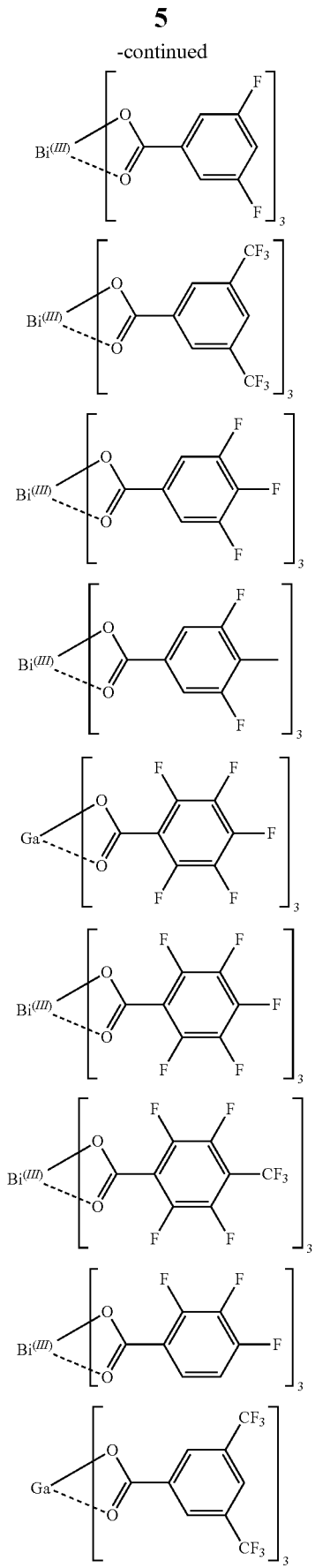

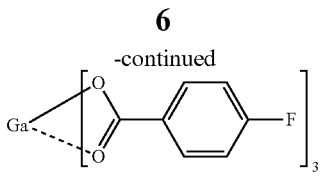

The anode of the organic electroluminescent device preferably consists of a material having a high work function. Both electrodes must be highly conducting to provide ample currents during device operation, and at least one electrode must be transparent enough to out-couple the emitted light. The anode is preferably transparent and has a work function of greater than 4.5 eV vs. vacuum. Suitable materials for the anode are conductive mixed metal oxides like indium tin oxide (ITO) or indium zinc oxide (IZO).

The cathode of the organic electroluminescent device according to the invention preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag or Al, can also be used in addition to the said metals, in which case combinations of the metals, such as, for example, Ca/Ag, Mg/Ag or Ba/Ag, are generally used. It may also be preferred to introduce a thin interlayer of a material having a high dielectric constant between a metallic cathode and the organic semiconductor. Suitable for this purpose are, for example, alkali metal fluorides or alkaline-earth metal fluorides, but also the corresponding oxides or carbonates (for example LiF, $Li_2O$, $BaF_2$, MgO, NaF, CsF, $Cs_2CO_3$, etc.). Furthermore, lithium quinolinate (LiQ) can be used for this purpose. The layer thickness of this layer is preferably between 0.5 and 5 nm.

The organic electroluminescent device according to the invention comprises at least one hole-transport layer.

A hole-transport layer for the purposes of the present application is taken to mean an organic layer which has hole-transporting properties. In particular, it is taken to mean an organic layer which is located between the anode and the emitting layer and has hole-transporting properties. A hole-transport material is correspondingly taken to mean a material having hole-transporting properties. Hole-transport materials are capable of transporting holes, i.e. positive charges, which are injected, in the case of the present invention, from the hole-injection layer.

Suitable hole-transport materials which are present in the at least one hole-transport layer are indenofluorenamine derivatives (for example in accordance with WO 06/122630 or WO 06/100896), the amine derivatives disclosed in EP 1661888, hexaazatriphenylene derivatives (for example in accordance with WO 01/049806), amine derivatives containing condensed aromatic ring systems (for example in accordance with U.S. Pat. No. 5,061,569), the amine derivatives disclosed in WO 95/09147, monobenzoindenofluorenamines (for example in accordance with WO 08/006449), dibenzoindenofluorenamines (for example in accordance with WO 07/140847), spirobifluorene-monotriarylamines (for example in accordance with WO 2012/034627), spirobifluorenetetrakistriarylamines, for example spiro-TAD or spiro-TTB, fluorenamines (for example in accordance with EP 2875092, EP 2875699 and EP 2875004), spirodibenzopyranamines (for example in accordance with WO 2013/

083216) and dihydroacridine derivatives (for example in accordance with WO 2012/150001).

The hole-transport material is preferably selected from triarylamine compounds, preferably monotriarylamine compounds, particularly preferably from monotriarylamine compounds from the structure classes mentioned above.

Alternatively, it may also be preferred for the hole-transport material to be selected from bistriarylamine compounds or polytriarylamine compounds, for example tetrakistriarylamine compounds.

Preferably, the hole-transport layer comprises at least one triarylamine, which corresponds to a compound of formula (1) or to a polymer comprising at least one structural unit of the formula (2):

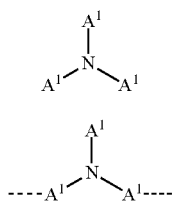

Formula (1)

Formula (2)

Where $A^1$ is on each occurrence, identically or differently, a mono- or polycyclic, aromatic or heteroaromatic ring system having 5 to 60 aromatic ring atoms, preferably 5 to 30 aromatic ring atoms, which may be substituted by one or more radicals $R^1$;

$R^1$ is on each occurrence, identically or differently, H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R_2$, $OSO_2R_2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C=CR^2$, $C\equiv C$, $Si(R^2)_2$, $C=O$, $C=S$, $C=NR^2$, $P(=O)(R^2)$, SO, $SO_2$, $NR^2$, O, S or $CONR^2$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or an aralkyl or heteroaralkyl group having 5 to 60 aromatic ring atoms, which may be substituted by one or more radicals $R^2$, or a diarylamino group, diheteroarylamino group or arylheteroarylamino group having 10 to 40 aromatic ring atoms, which may be substituted by one or more radicals $R^2$, where two or more radicals $R^1$ here may also form a mono- or polycyclic, aliphatic or aromatic ring system with one another;

$R^2$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents $R^2$ may also form a mono- or polycyclic, aliphatic or aromatic ring system with one another; and the dashed lines in formula (2) represent bonds to adjacent structural units in the polymer.

More preferably, the hole-transport layer comprises at least one monotriarylamine of one of the formulae (T-1) to (T-7),

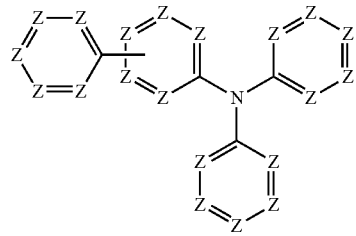

Formula (T-1)

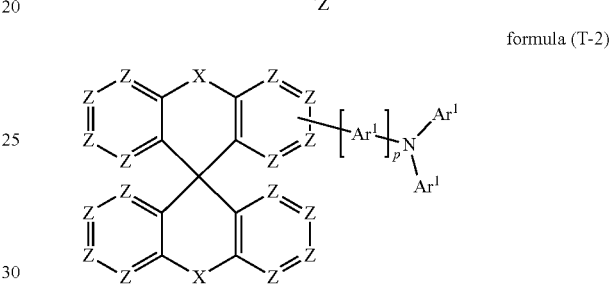

formula (T-2)

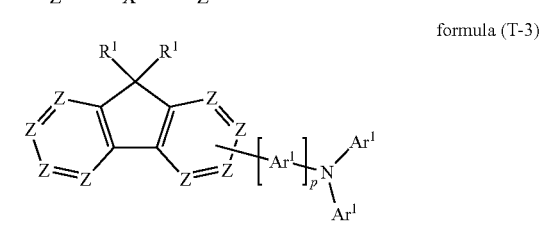

formula (T-3)

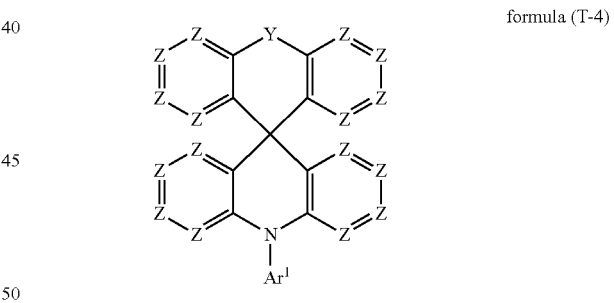

formula (T-4)

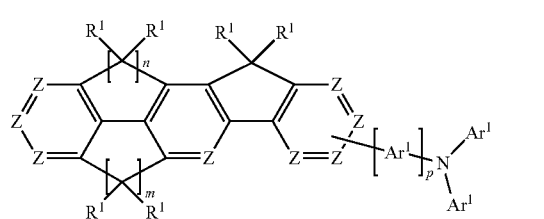

formula (T-5)

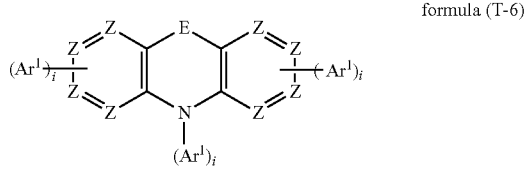

formula (T-6)

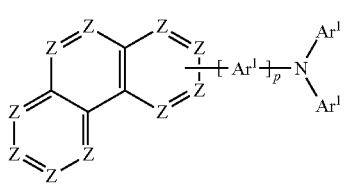

formula (T-7)

where R¹ has the same definition as above and where:

Ar¹ is on each occurrence, identically or differently, a mono- or polycyclic, aromatic or heteroaromatic ring system having 5 to 60 aromatic ring atoms, which may be substituted by one or more radicals R¹;

Z is on each occurrence, identically or differently, N or CR¹, where Z is equal to C if a substituent is bonded;

X, Y are on each occurrence, identically or differently, a single bond, O, S, Se, BR¹, C(R¹)₂, Si(R¹)₂, NR¹, PR¹, C(R¹)₂—C(R¹)₂ or CR¹═CR¹;

E is O, S, Se, BR¹, C(R¹)₂, Si(R¹)₂, NR¹, PR¹, C(R¹)₂—C(R¹)₂ or CR¹═CR¹;

i is on each occurrence, identically or differently, 0 or 1, where the sum of all i is at least equal to 1;

p is equal to 0 or 1;

m, n are, identically or differently, 0 or 1, where the sum of m and n is equal to 1 or 2.

The hole-transport layer comprises more preferably at least one monotriarylamine of one of the formulae (T-1), (T-2), (T-3) and (T-5).

It is particularly preferable that the hole-transport layer comprises at least one monotriarylamine of the formula (T-2).

It is very particularly preferable that the hole-transport layer comprises at least one monotriarylamine of the formula (T-2), selected from the formulae (T-2-1), (T-2-2), (T-2-3) and (T-2-4), Formula (T-2-1)

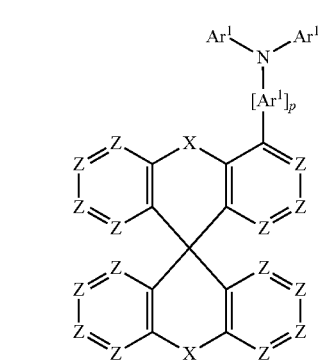

Formula (T-2-2)

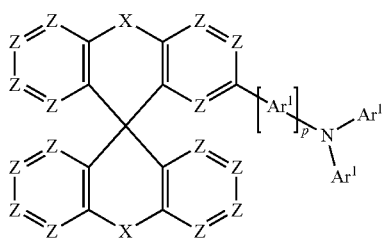

Formula (T-2-3)

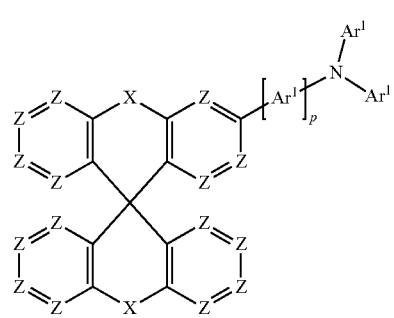

Formula (T-2-4)

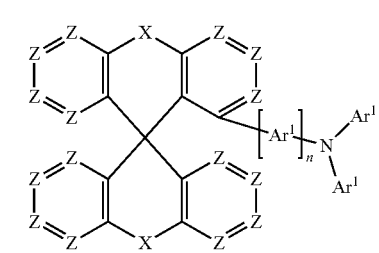

where the symbols and indices have the same meaning as above.

Among formulae (T-2-1) and (T-2-4), formula (T-2-1) is preferred.

For the above-mentioned formulae (T-1) to (T-7) as well as (T-2-1) to (T-2-4), it is preferred for not more than three groups Z in a ring to be equal to N. It is generally preferred for Z to be equal to CR¹.

The group X is preferably selected on each occurrence, identically or differently, from a single bond, C(R¹)₂, O and S and is particularly preferably a single bond.

The group Y is preferably selected from O and C(R¹)₂ and is particularly preferably O.

The group E is preferably selected from C(R¹)₂, O and S and is particularly preferably C(R¹)₂.

The group Ar¹ is preferably selected on each occurrence, identically or differently, from aromatic or heteroaromatic ring systems having 6 to 30 aromatic ring atoms, which may be substituted by one or more radicals R¹. Ar¹ is particularly preferably selected from aryl or heteroaryl groups having 6 to 18 aromatic ring atoms, which may be substituted by one or more radicals R¹.

R¹ is preferably selected on each occurrence, identically or differently, from H, D, F, Cl, Br, I, C(═O)R², CN, Si(R²)₃, N(R²)₂, NO₂, P(═O)(R²)₂, S(═O)R², S(═O)₂R², a straight-chain alkyl, alkoxy or thioalkyl group having 1 to 20 C atoms or a branched or cyclic alkyl, alkoxy or thioalkyl group having 3 to 20 C atoms or an alkenyl or alkynyl group having 2 to 20 C atoms, where the above-mentioned groups may each be substituted by one or more radicals R² and where one or more CH₂ groups in the above-mentioned groups may be replaced by —R²C═CR²—, —C≡C—, Si(R²)₂, C═O, C═S, C═NR², —C(═O)O—, —C(═O)NR²—, NR², P(═O)(R²), —O—, —S—, SO or SO₂ and where one or more H atoms in the above-mentioned groups may be replaced by D, F, Cl, Br, I, CN or NO₂, or an aromatic or heteroaromatic ring system having 5 to 30 aromatic ring atoms, which may in each case be substituted by one or more radicals R², where two or more radicals R¹ may be linked to one another and may form a ring.

The following definitions apply in general:

An aryl group in the sense of this invention contains 6 to 60 aromatic ring atoms; a heteroaryl group in the sense of this invention contains 5 to 60 aromatic ring atoms, at least one of which is a heteroatom. The heteroatoms are preferably selected from N, O and S. This represents the basic definition. If other preferences are indicated in the description of the present invention, for example with respect to the number of aromatic ring atoms or the heteroatoms present, these apply.

An aryl group or heteroaryl group here is taken to mean either a simple aromatic ring, i.e. benzene, or a simple heteroaromatic ring, for example pyridine, pyrimidine or thiophene, or a condensed (annellated) aromatic or heteroaromatic polycycle, for example naphthalene, phenanthrene, quinoline or carbazole. A condensed (annellated) aromatic or heteroaromatic polycycle in the sense of the present application consists of two or more simple aromatic or heteroaromatic rings condensed with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, iso-quinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazin-imidazole, quinoxalinimidazole, oxazole, benzoxazole, naphthoxazole, anthroxazole, phenanthroxazole, isoxazole, 1,2-thiazole, 1,3-thiazole, benzo-thiazole, pyridazine, benzopyridazine, pyrimidine, benzopyrimidine, quinoxaline, pyrazine, phenazine, naphthyridine, azacarbazole, benzocarboline, phenan-throline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an $sp^3$-hybridised C, Si, N or O atom, an $sp^2$-hybridised C or N atom or an sp-hybridised C atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may in each case also be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, iso-quinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phen-anthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethyihexyloxy, pentafluoroethoxy, 2,2,2-tri-fluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethyl-hexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The formulation that two or more radicals are able to form a ring with one another is intended for the purposes of the present application to be taken to mean, inter alia, that the two radicals are linked to one another by a chemical bond. Furthermore, however, the above-mentioned formulation is also intended to be taken to mean that, in the case where one of the two radicals is hydrogen, the second radical is bonded to the position to which the hydrogen atom was bonded, with formation of a ring.

Examples of suitable hole-transport materials for use in the organic electroluminescent device in accordance with the present invention, in particular in the hole-transport layer, are shown below:

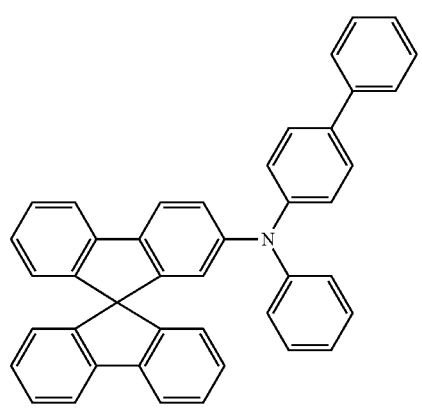
(1)

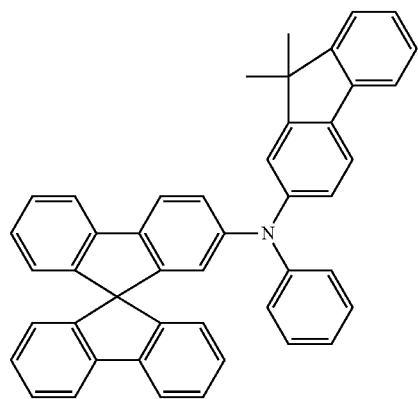
(2)

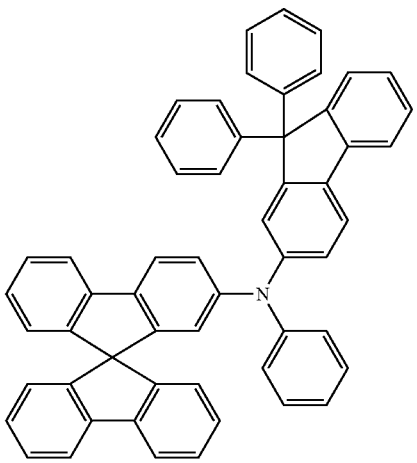
(3)

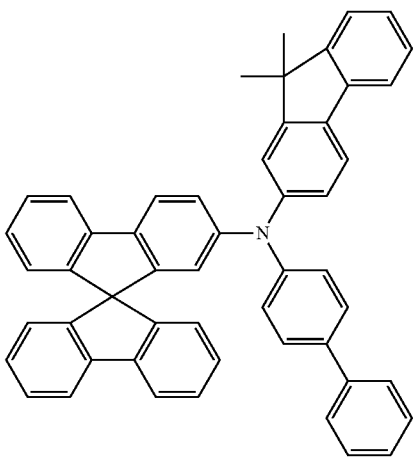
(4)

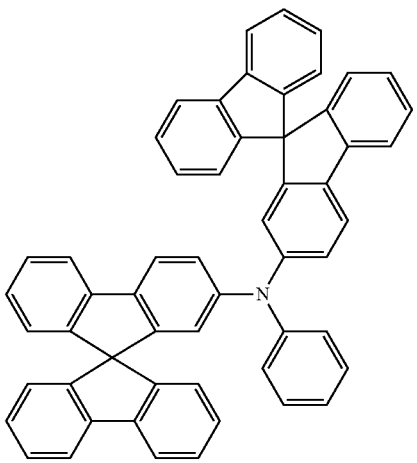
(5)

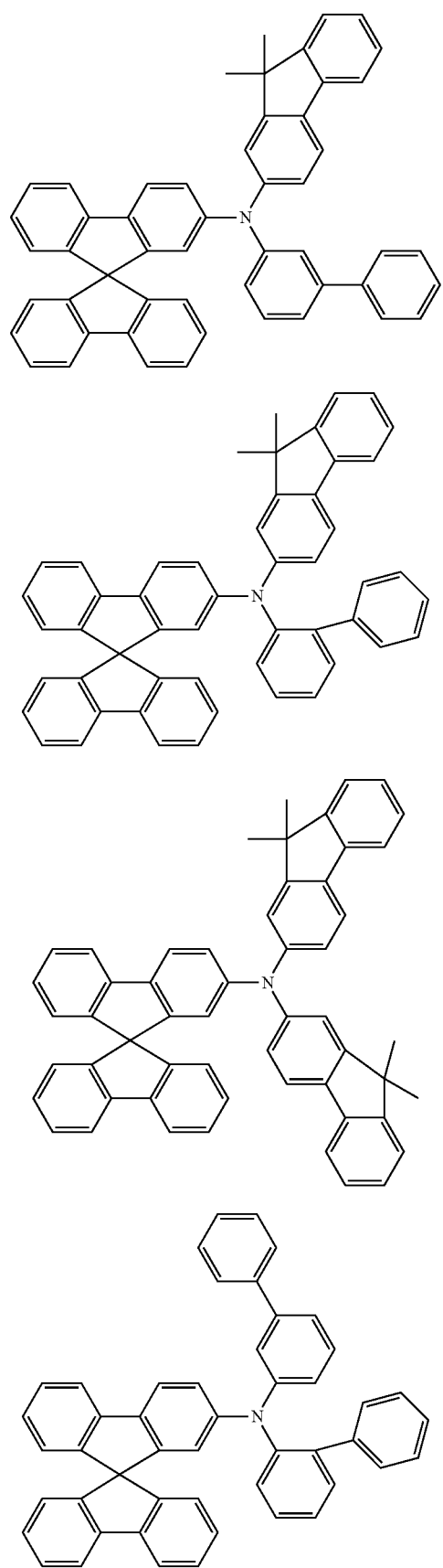
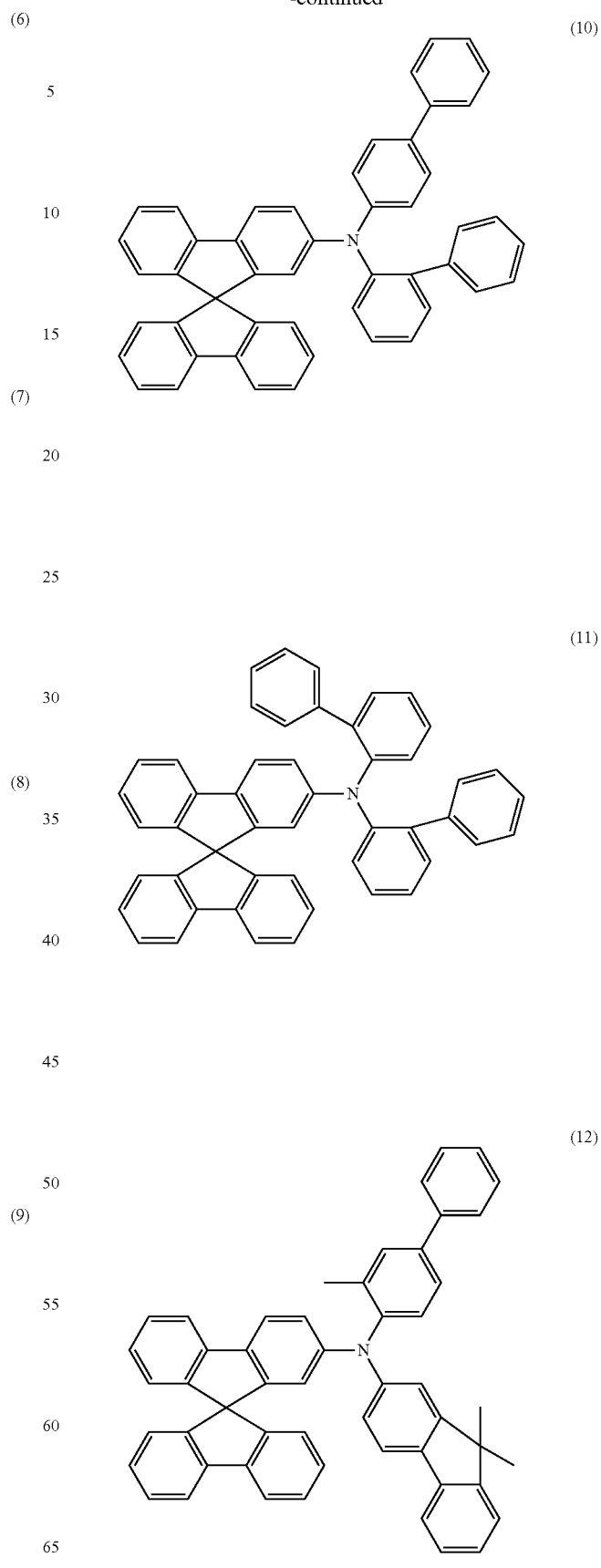

(13)
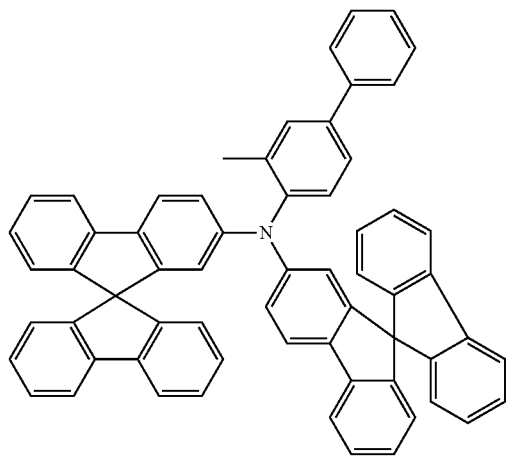
(14)
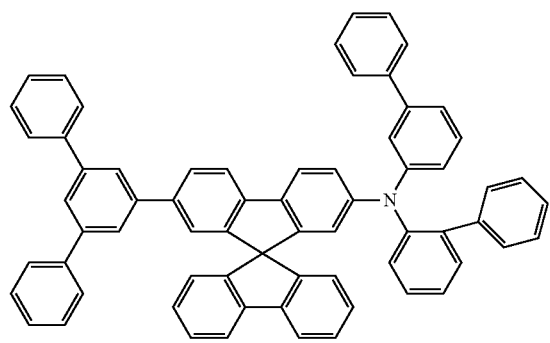
(15)
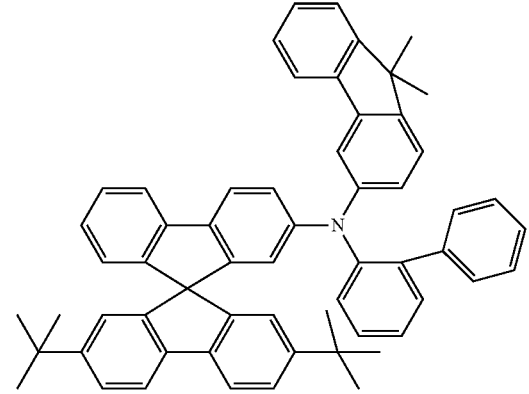
(16)
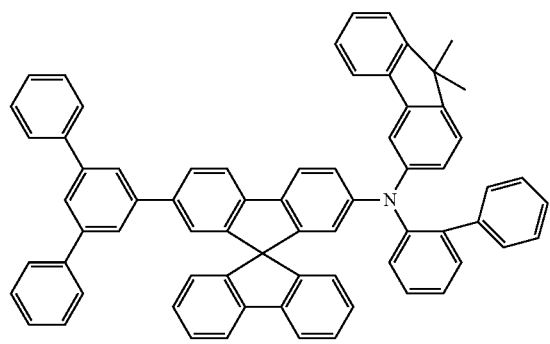
(17)
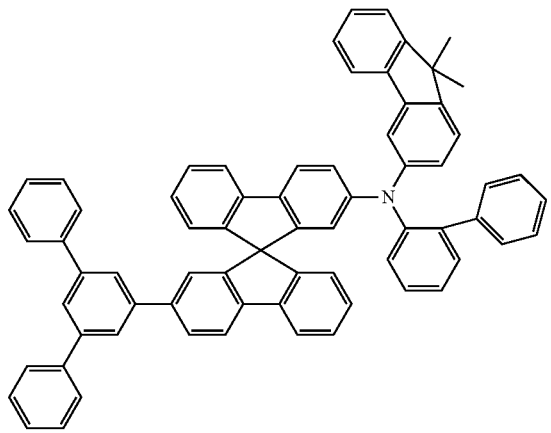
(18)
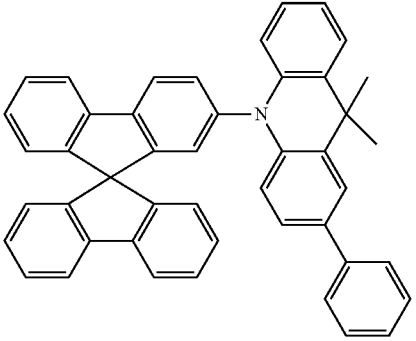
(19)
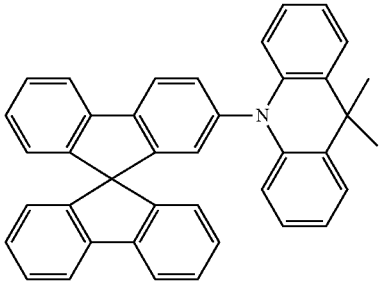
(20)
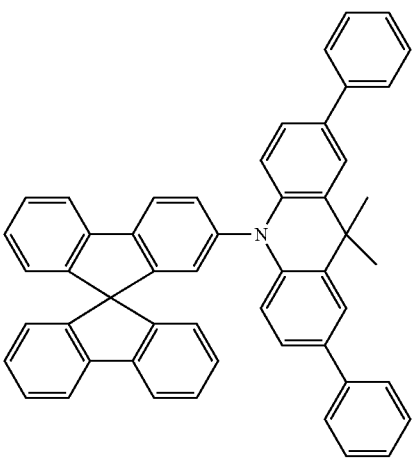

(21)
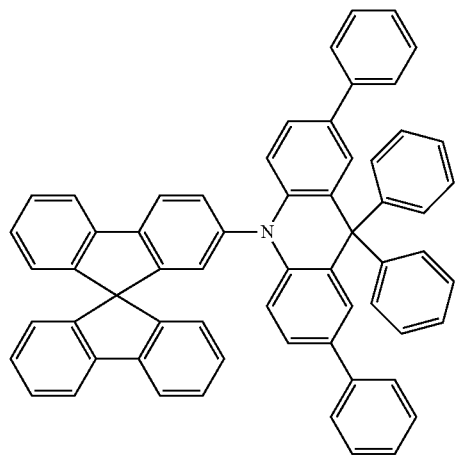
(22)
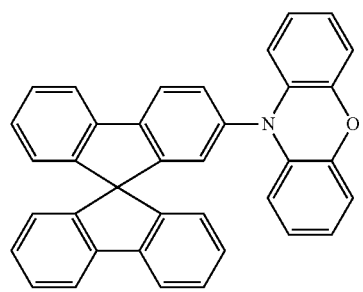
(23)
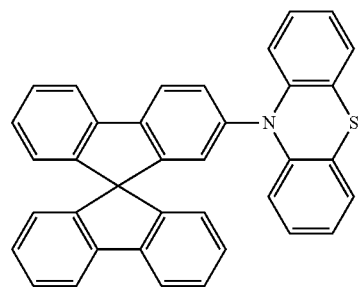
(24)
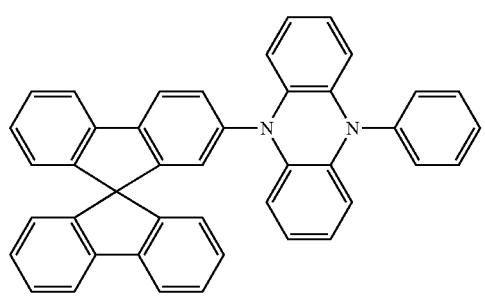
(25)
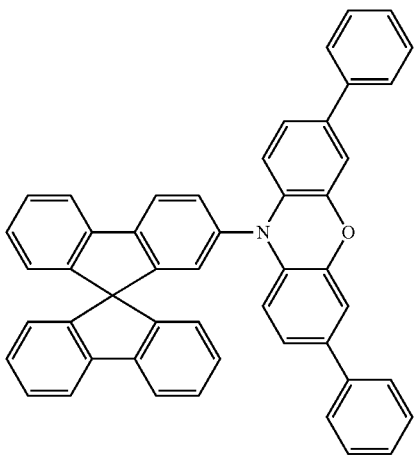
(26)
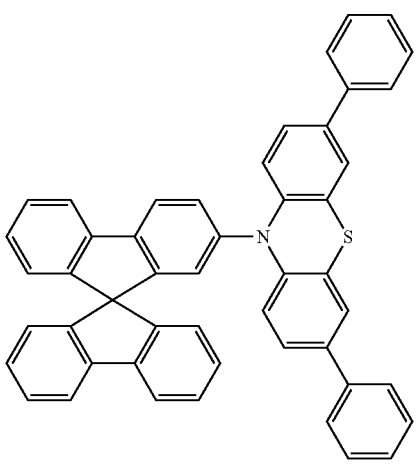
(27)
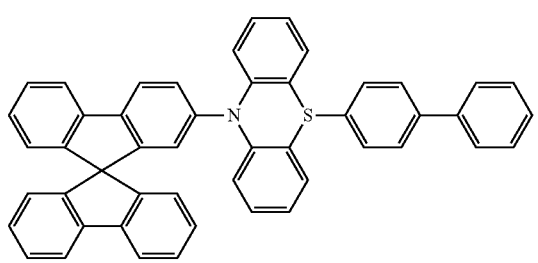

(28)
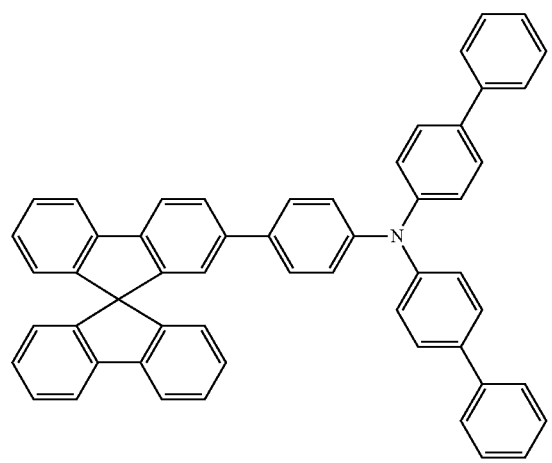
(29)
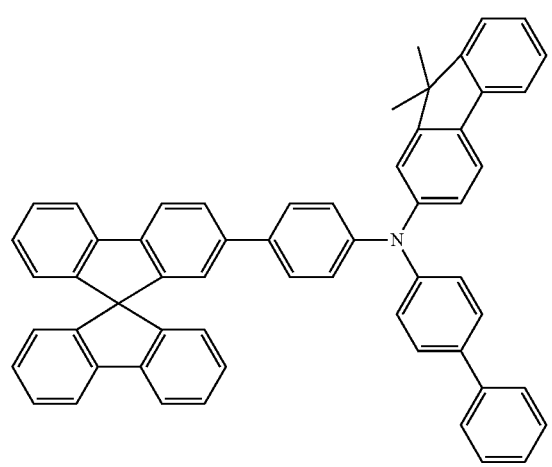
(30)
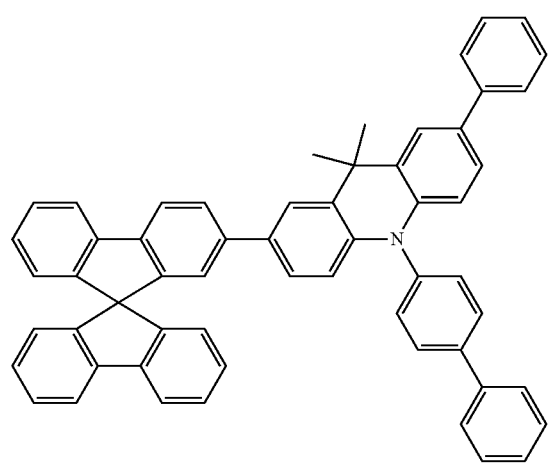
(31)
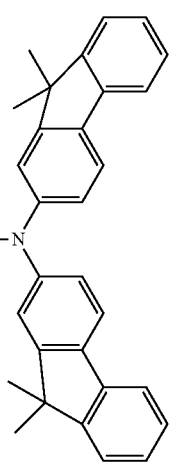
(32)
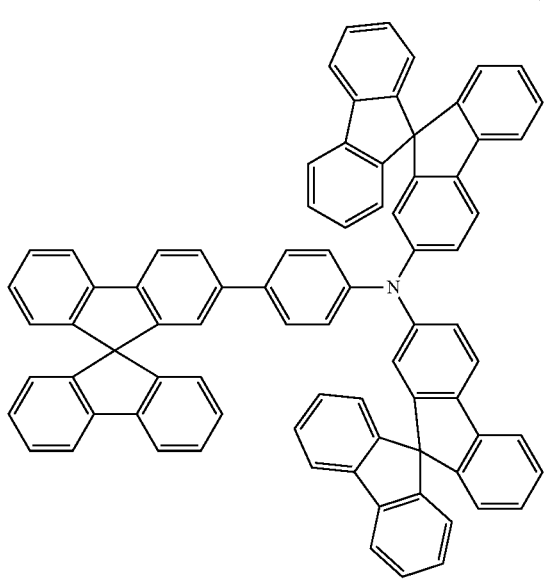
(33)
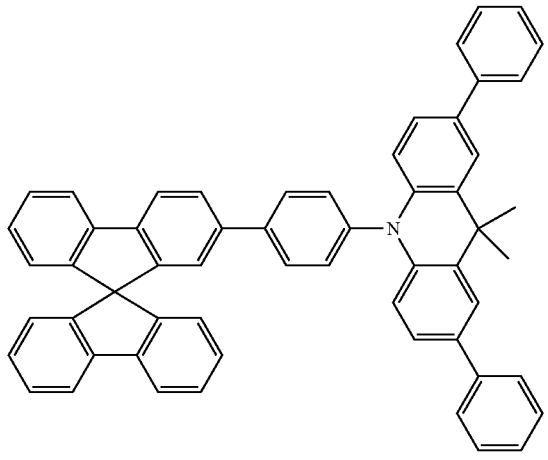

(34)
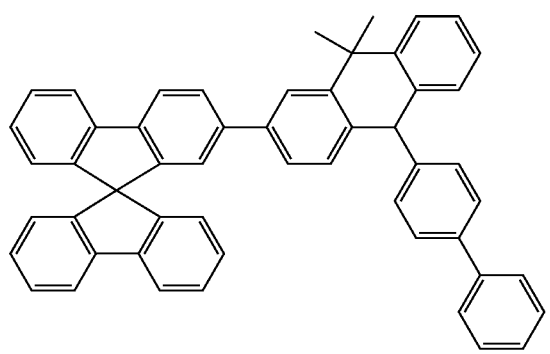
(35)
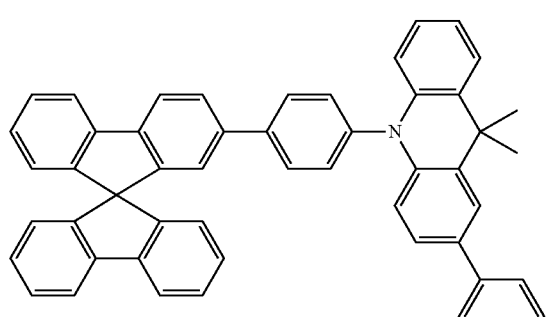
(36)
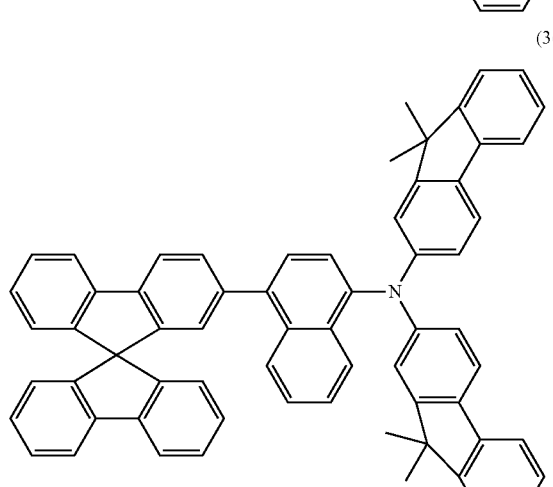
(37)
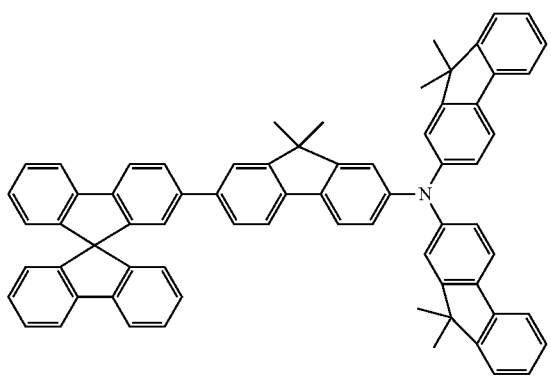
(38)
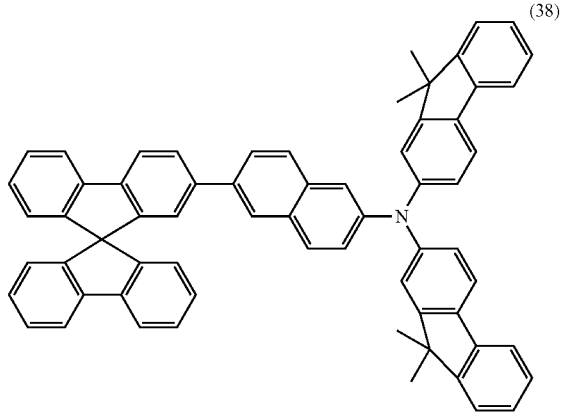
(39)
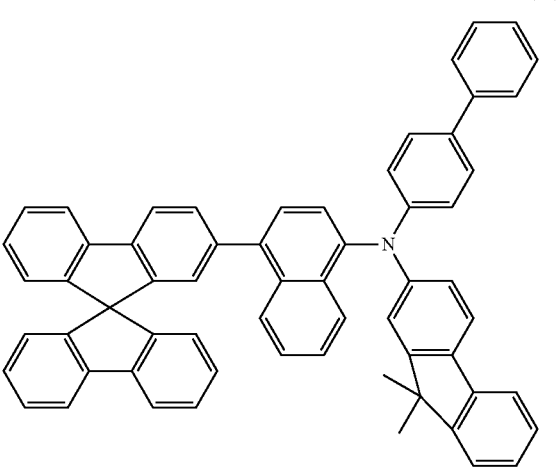
(40)
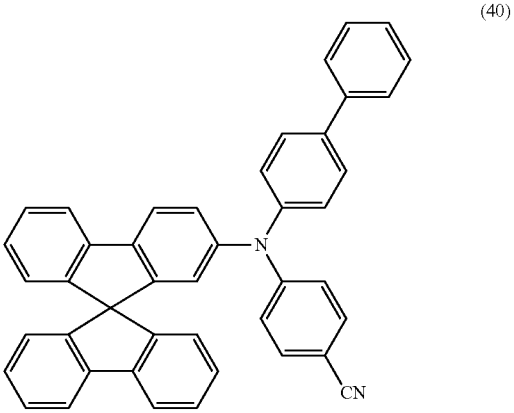

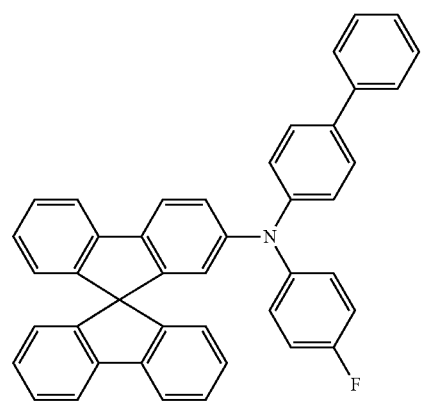
(41)
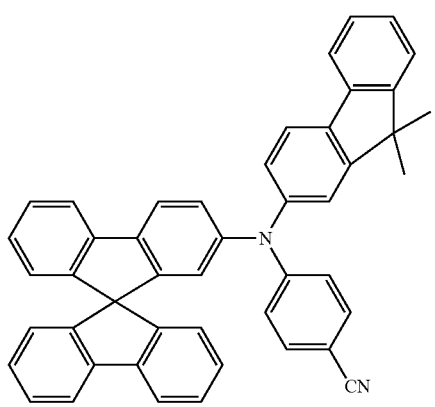
(44)
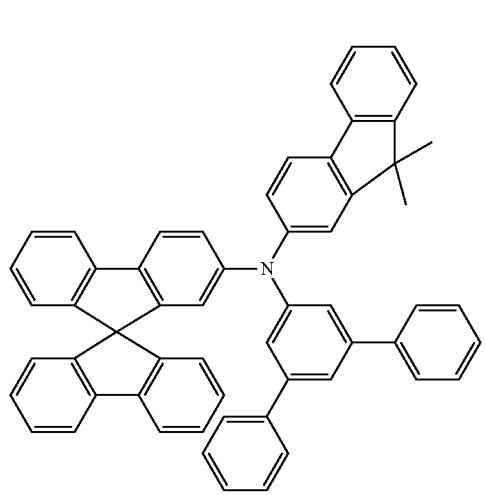
(42)
(45)
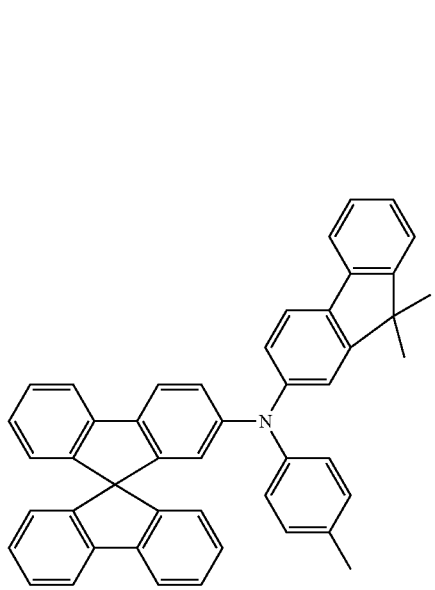
(43)
(46)

(47)
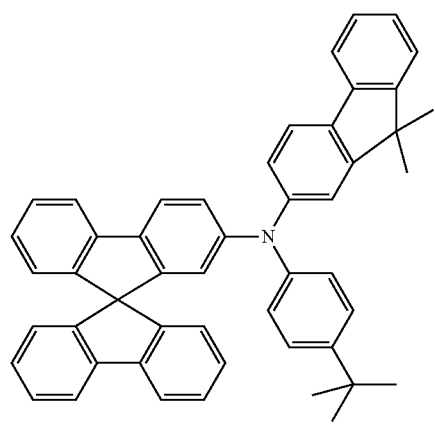
(48)
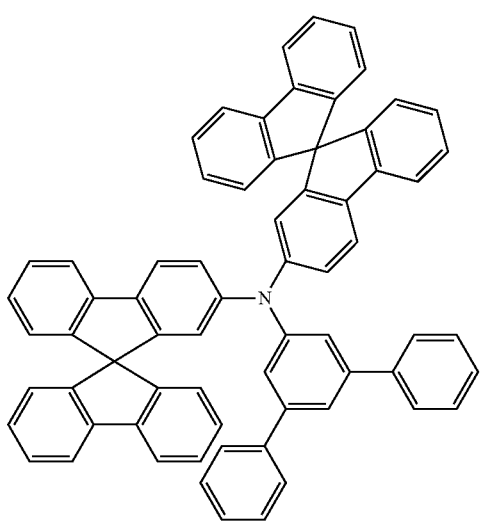
(49)
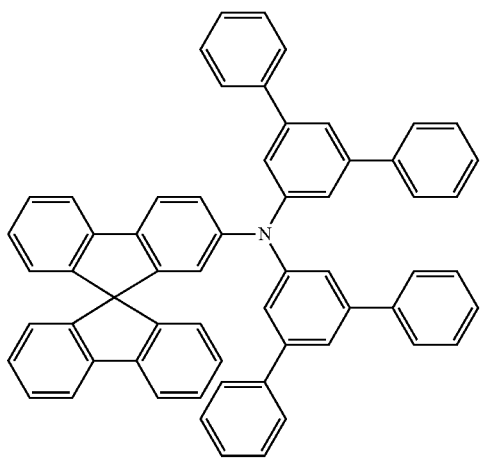
(50)
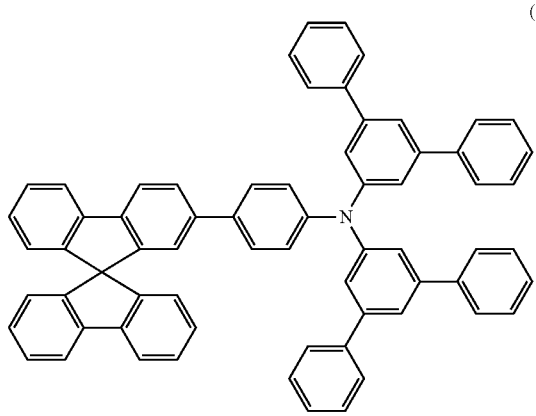
(51)
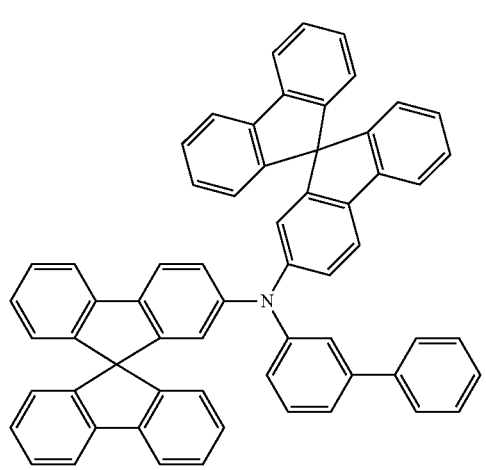
(52)
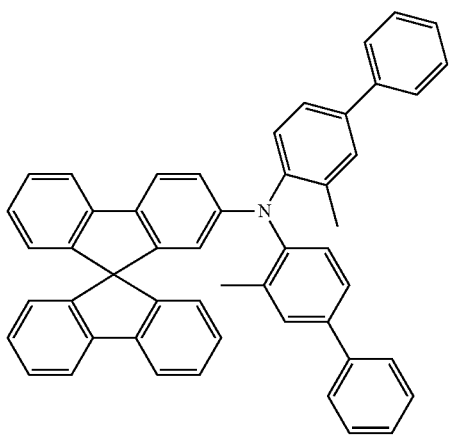

(53)
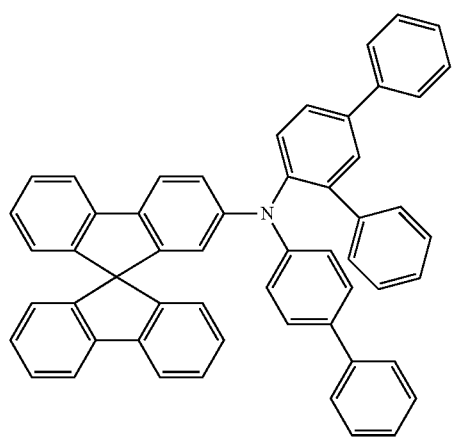
(56)
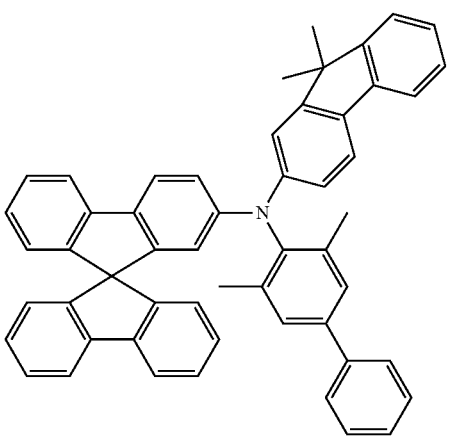
(54)
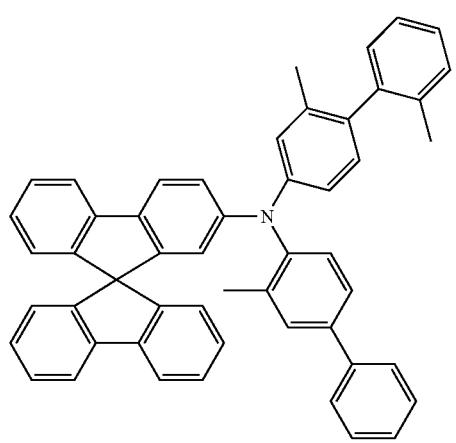
(57)
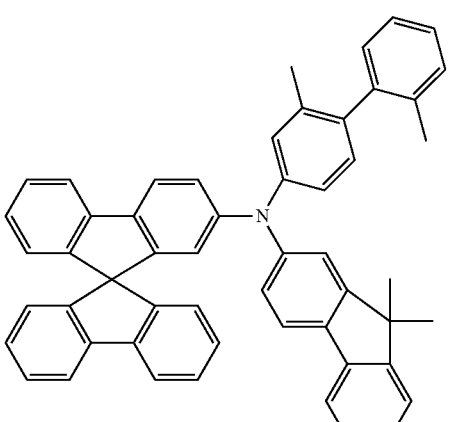
(55)
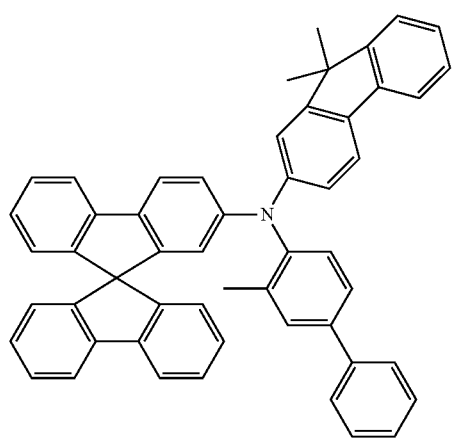
(58)
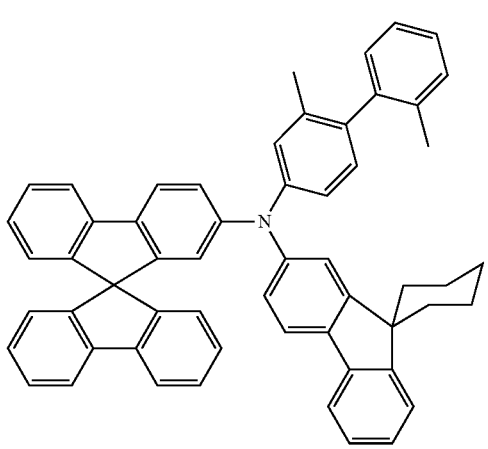

(59)
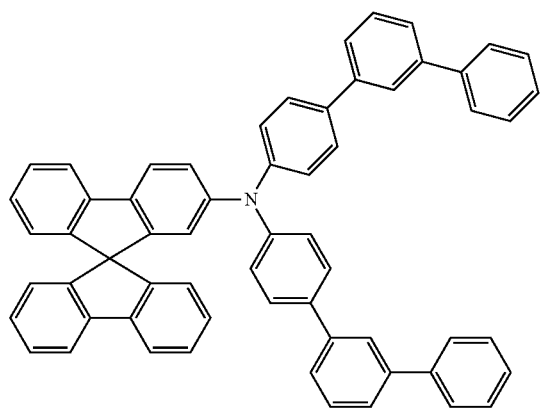
(61)
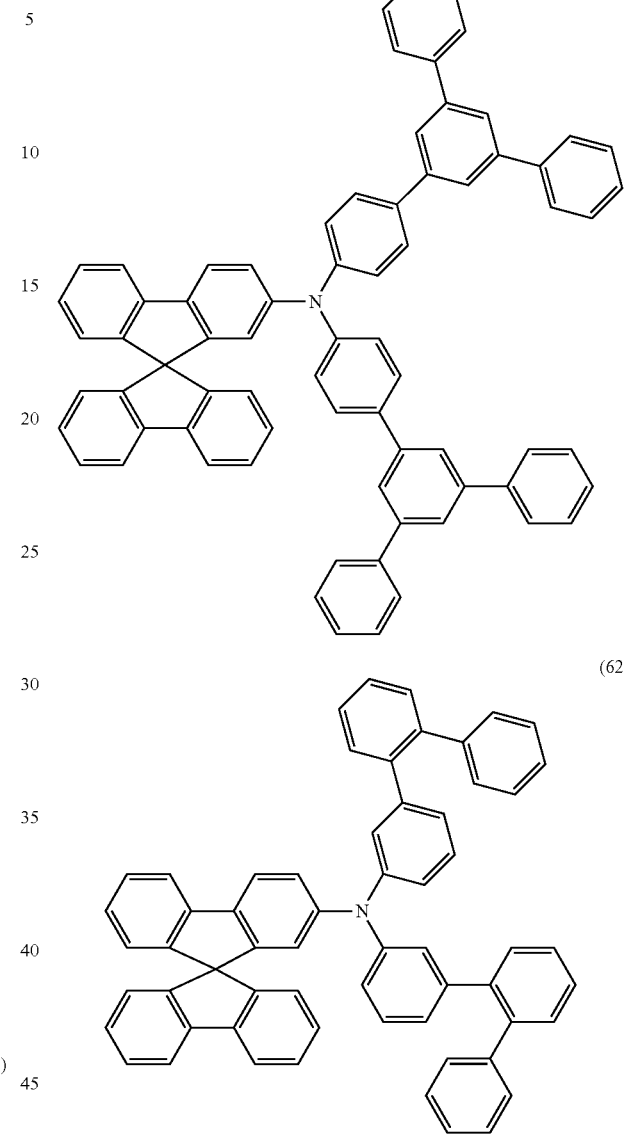
(60)
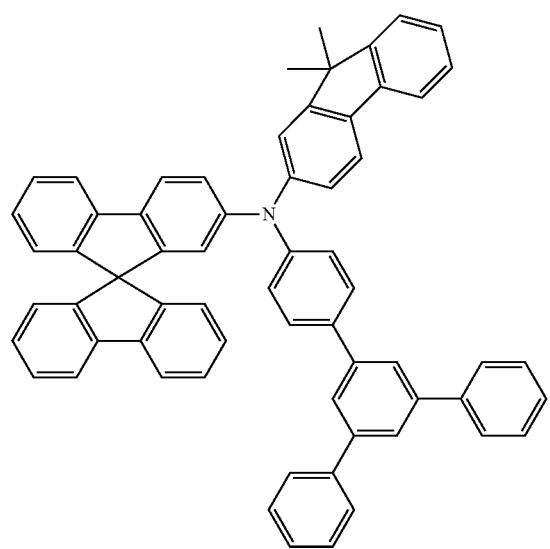
(62)
(63)
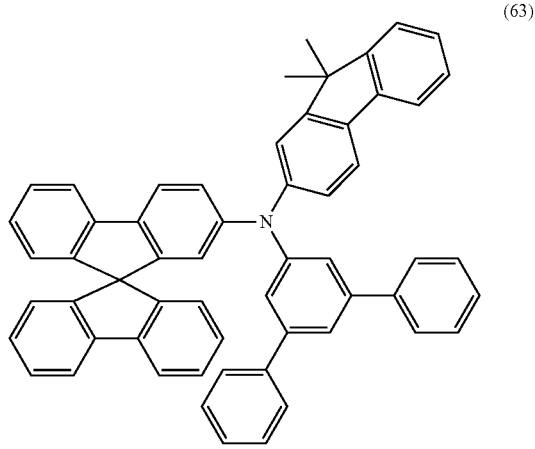

(64)
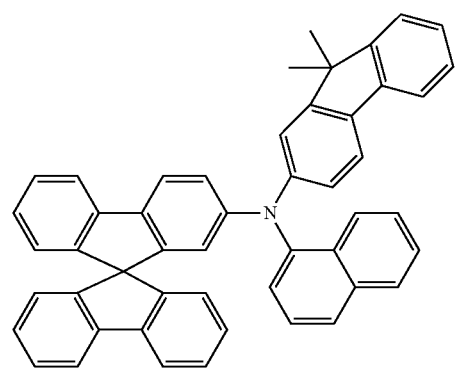
(65)
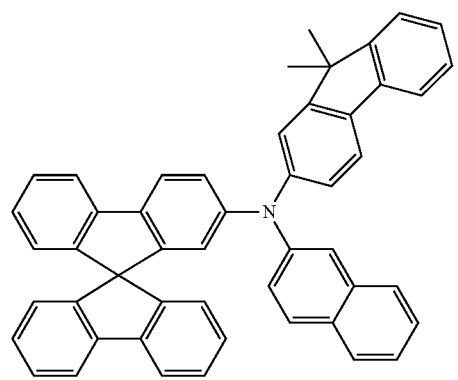
(66)
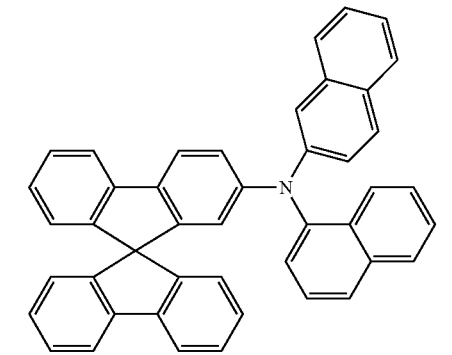
(67)
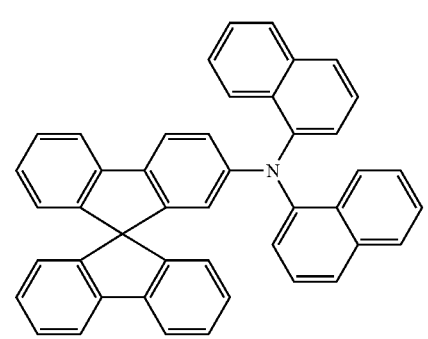
(68)
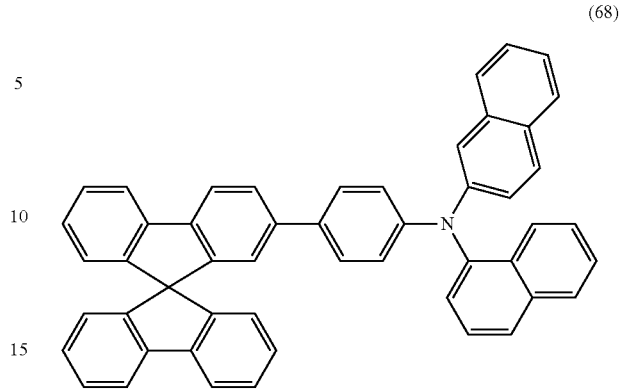
(69)
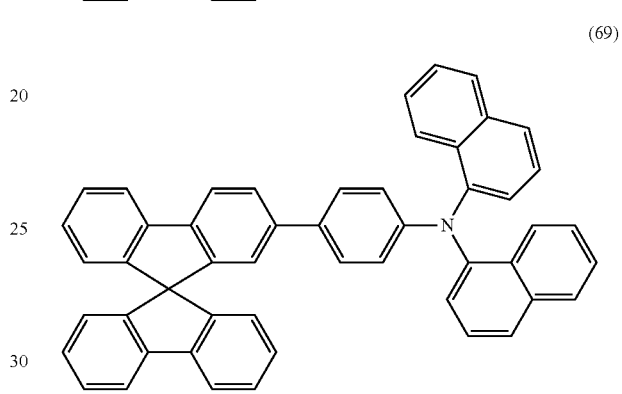
(70)
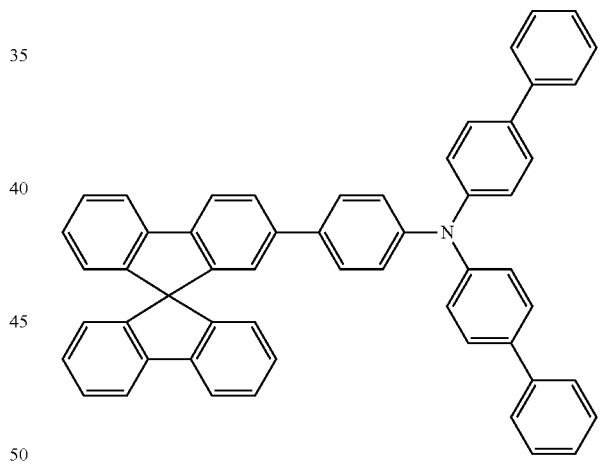
(71)
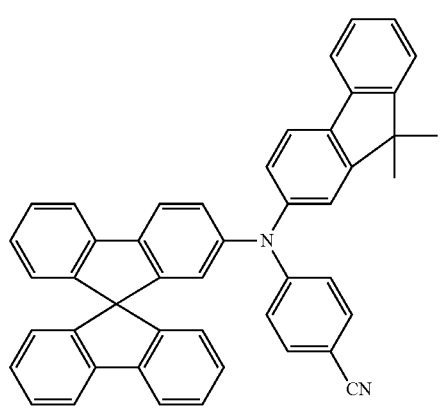

(72) 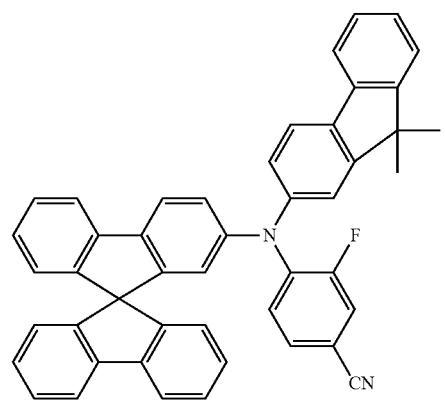
(73) 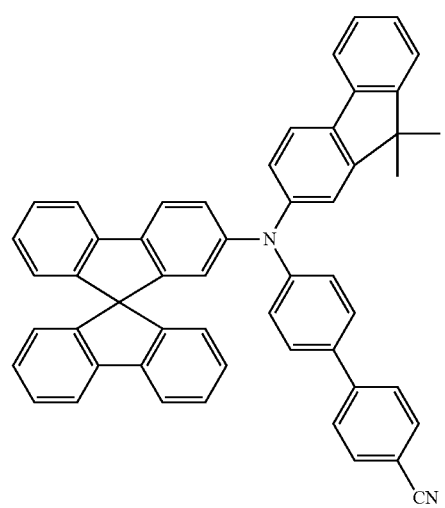
(74) 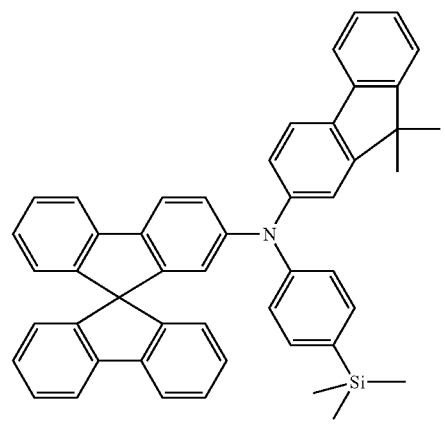
(75) 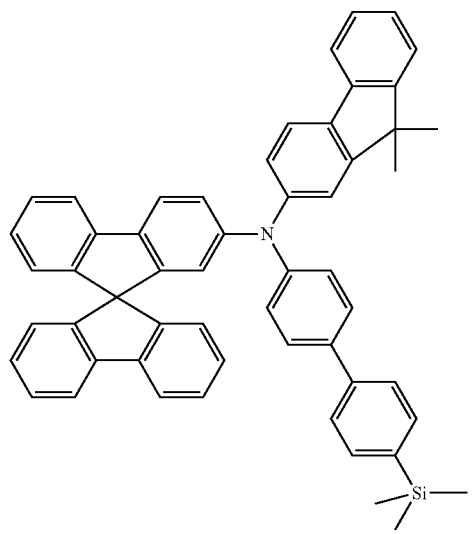
(76) 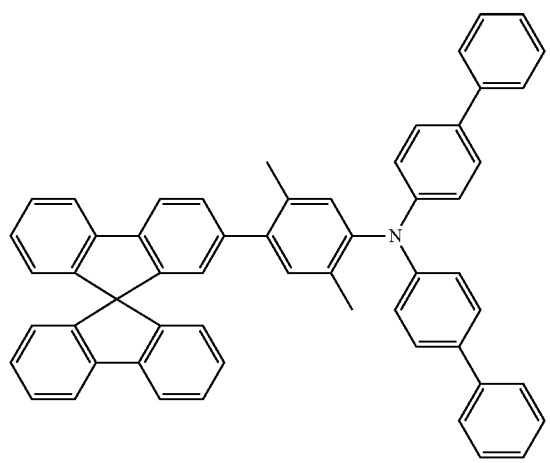
(77) 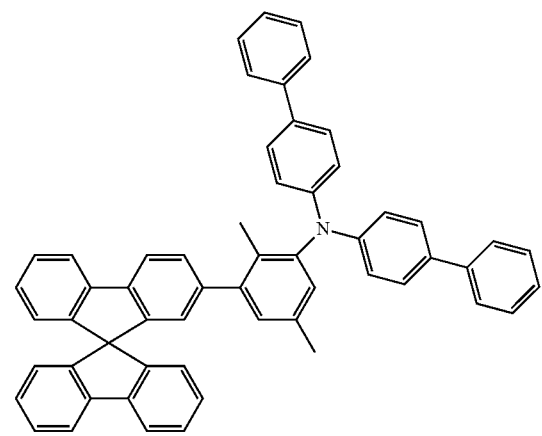

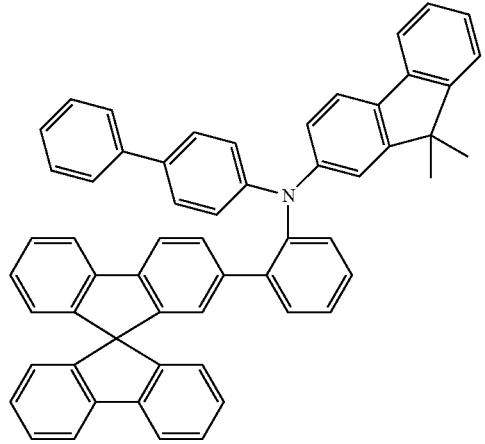
(78)
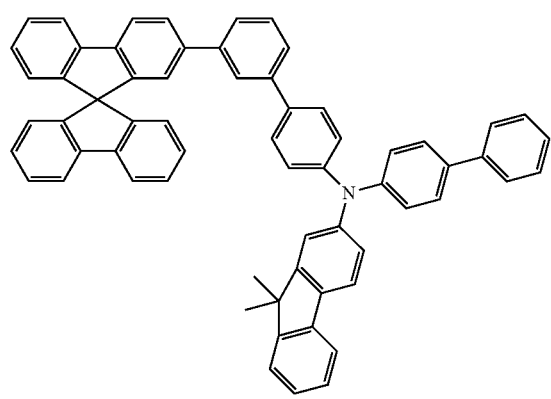
(79)
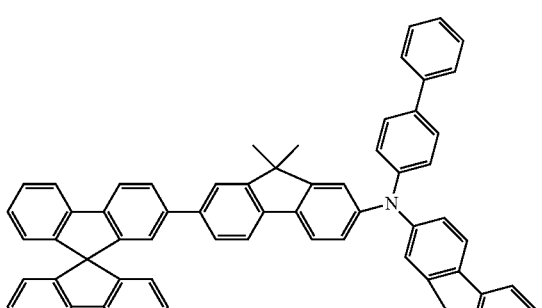
(80)
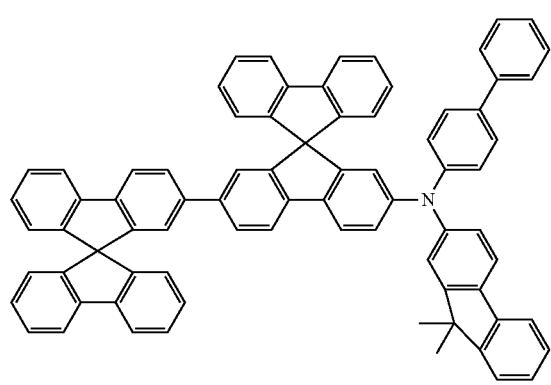
(81)
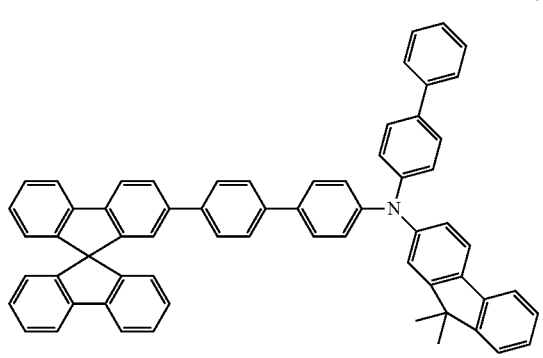
(82)
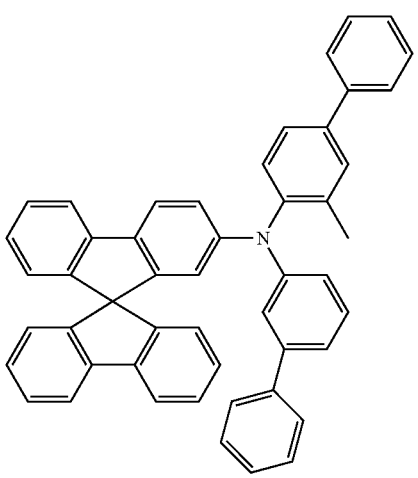
(83)
(84)

(85)
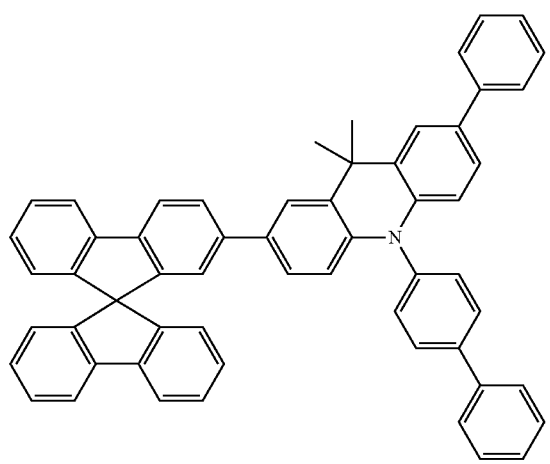
(86)
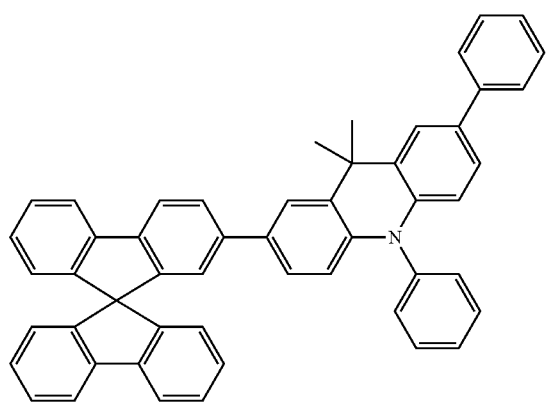
(87)
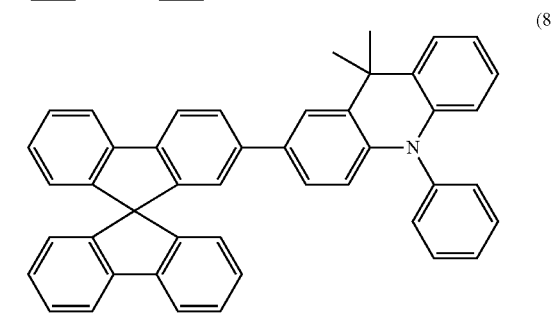
(88)
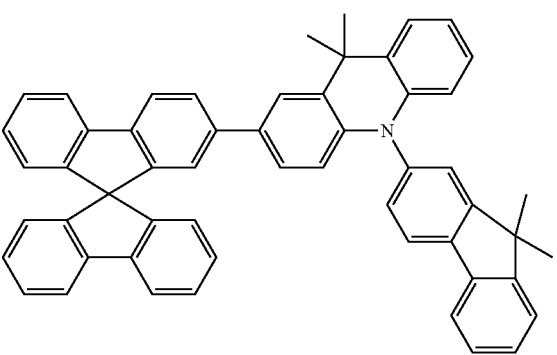
(89)
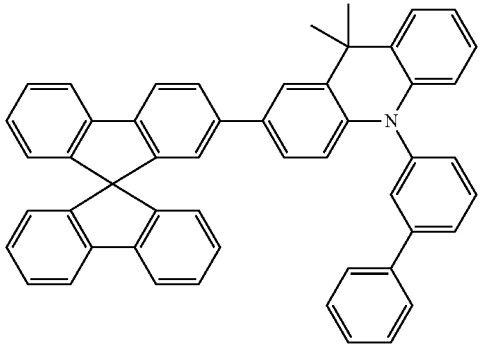
(90)
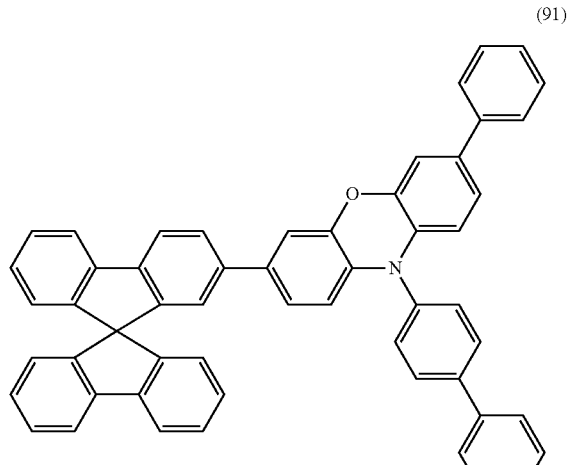
(91)
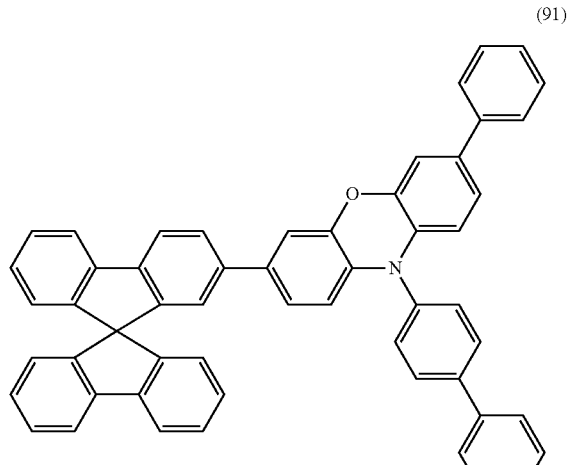
(92)
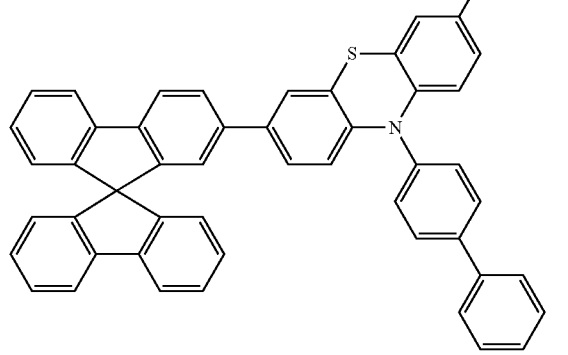

(93)
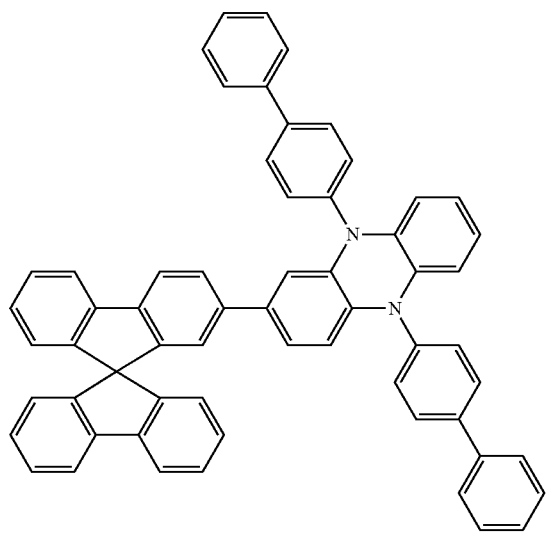
(94)
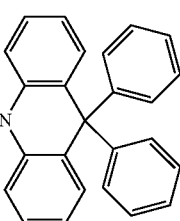
(95)
(96)
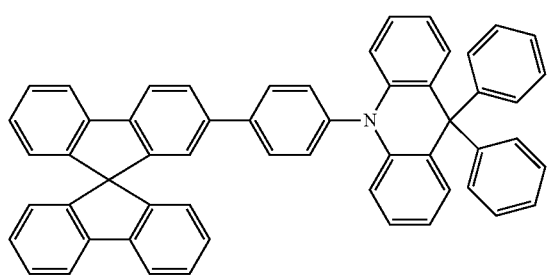
(97)
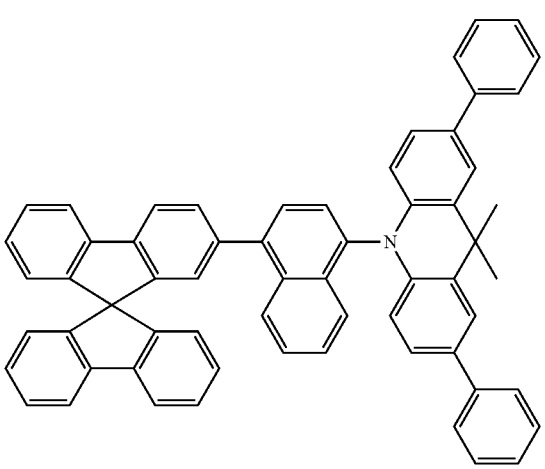
(98)
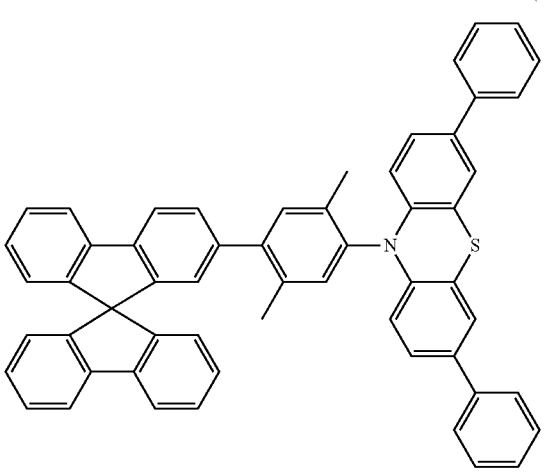
(99)
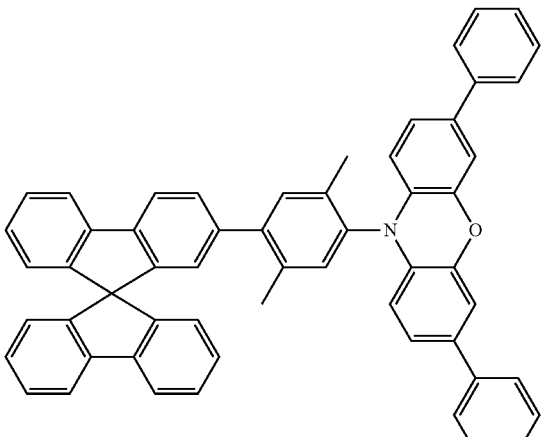

(100)
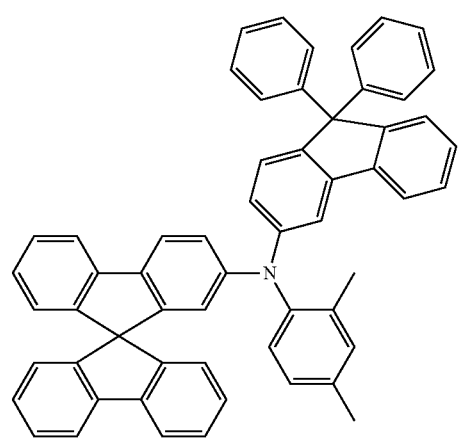
(101)
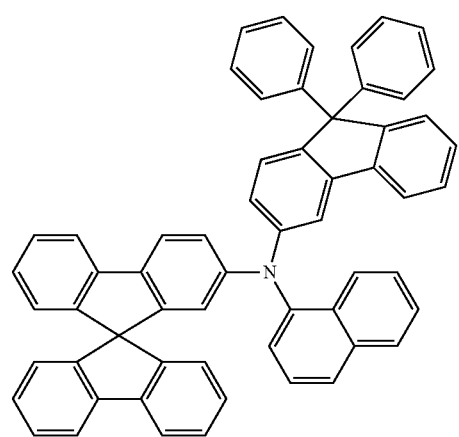
(102)
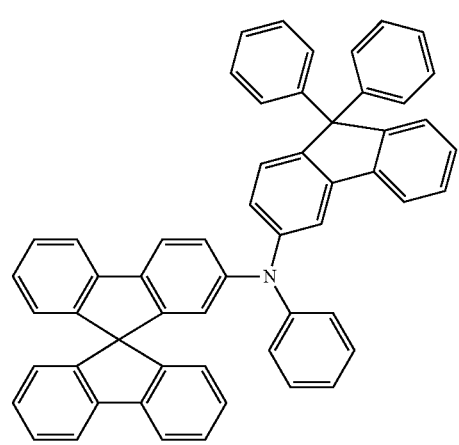
(103)
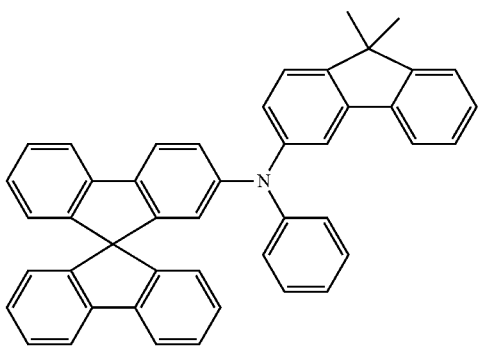
(104)
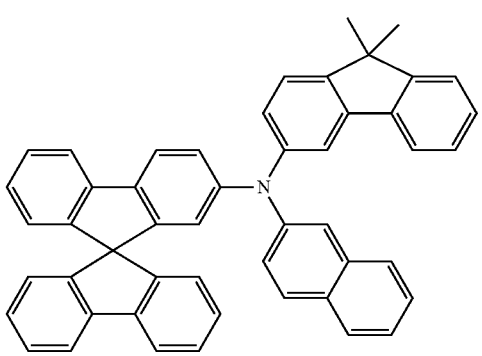
(105)
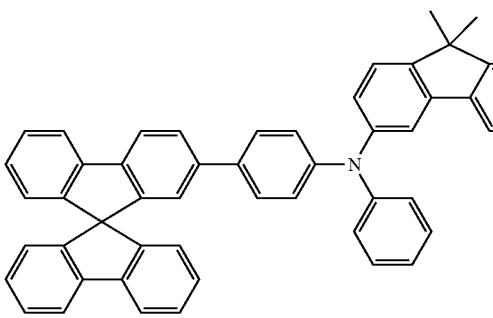
(106)
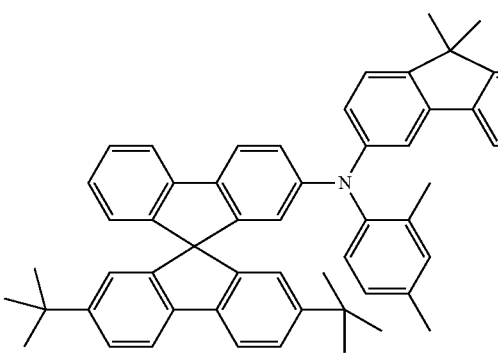

(107)
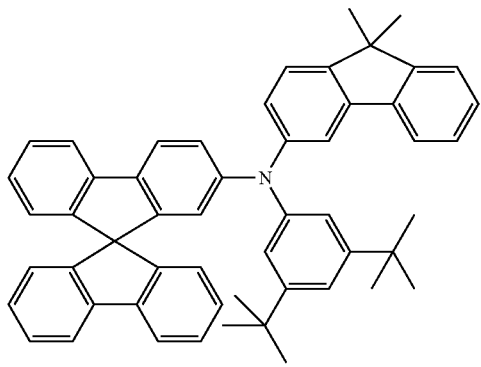
(111)
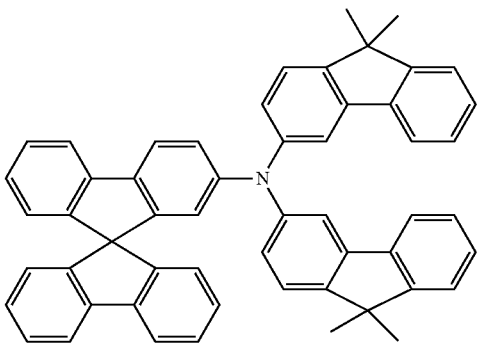
(108)
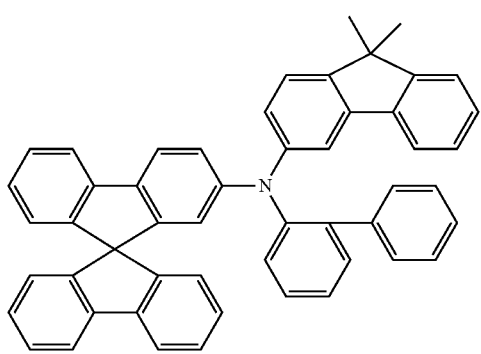
(112)
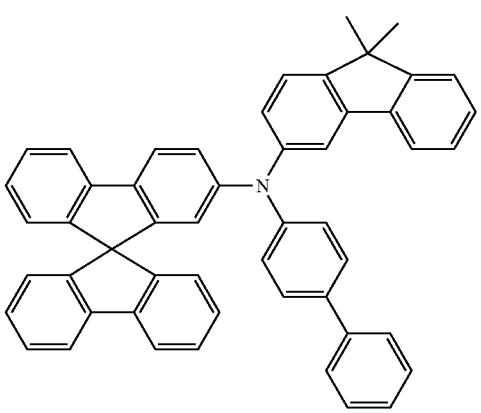
(109)
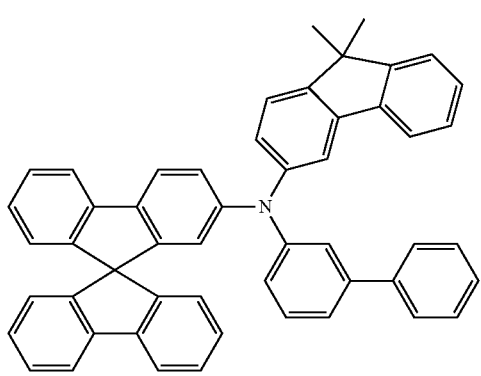
(110)
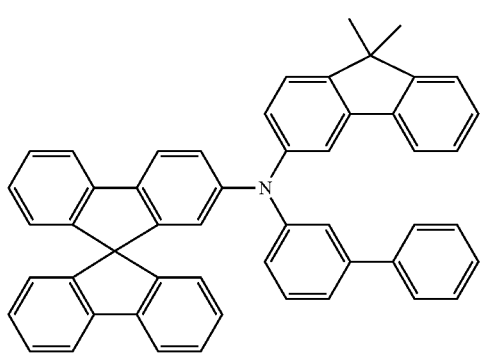
(113)
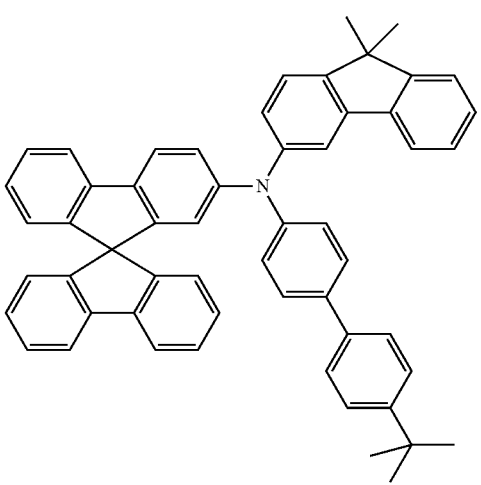

(114)
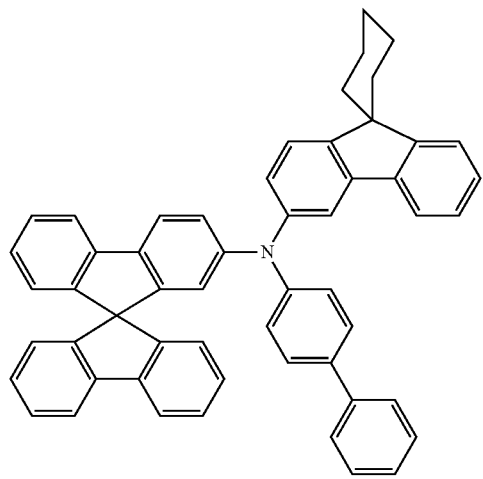
(115)
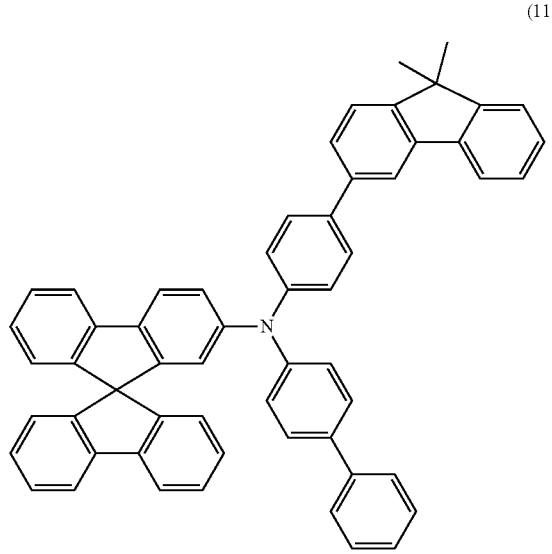
(116)
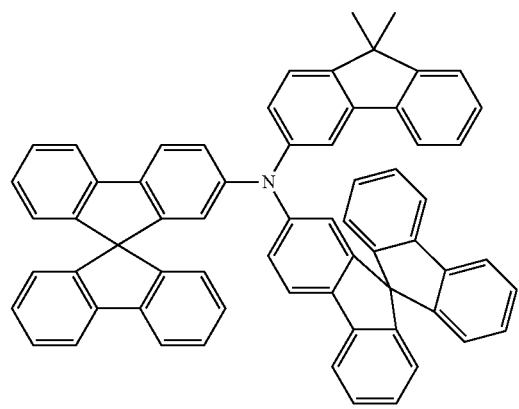
(117)
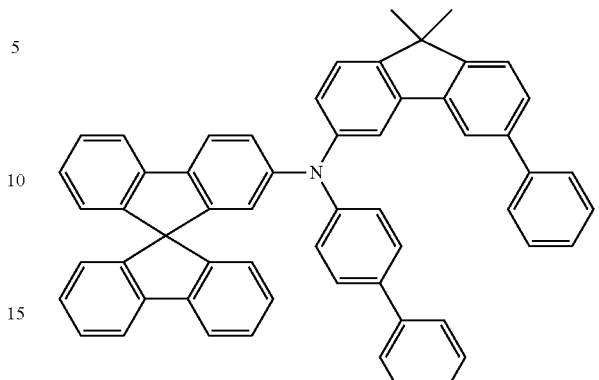
(118)
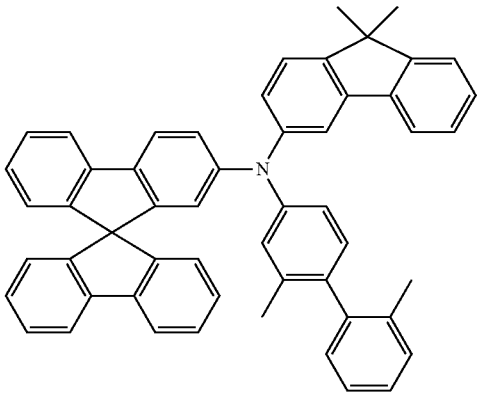
(1119)
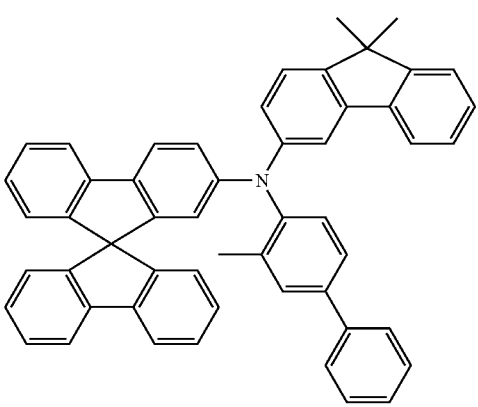

(120)
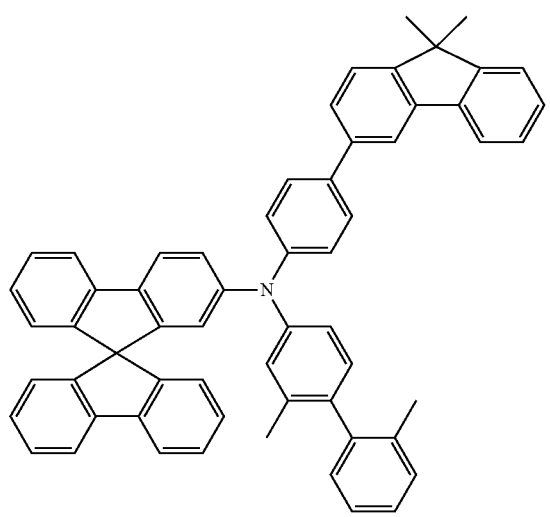
(121)
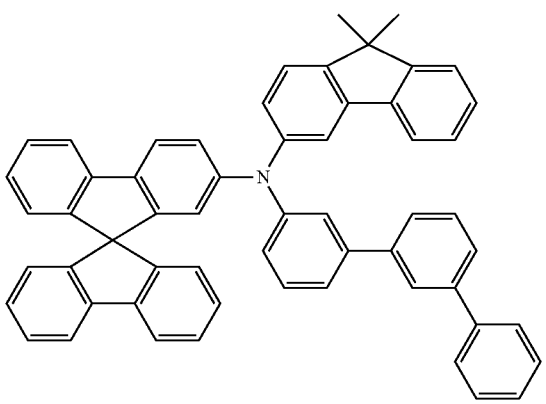
(122)
(123)
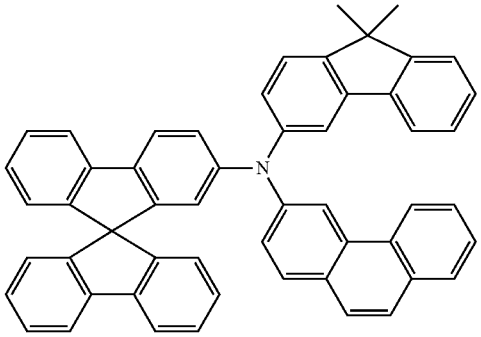
(124)
(125)
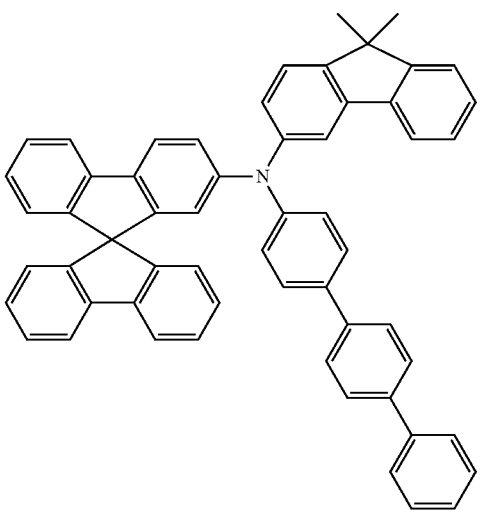
(126)
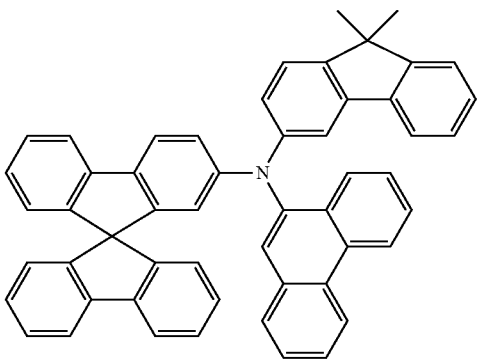

-continued
(127)
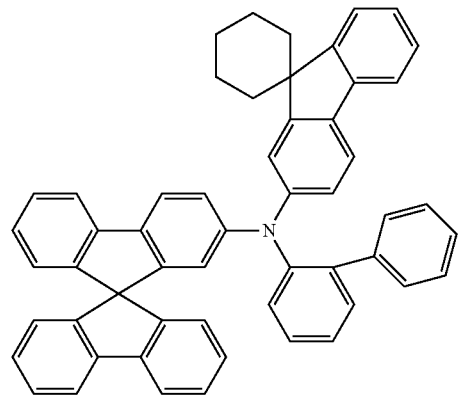
(128)
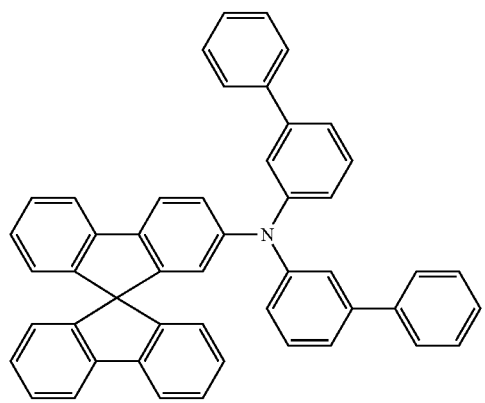
(129)
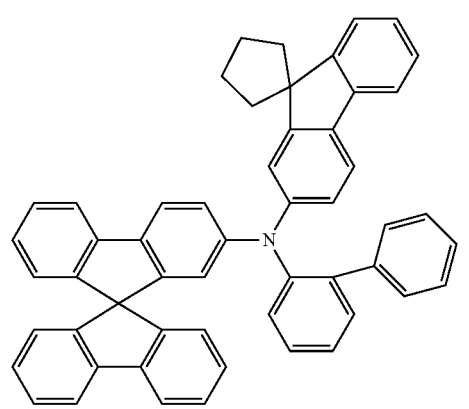
(130)
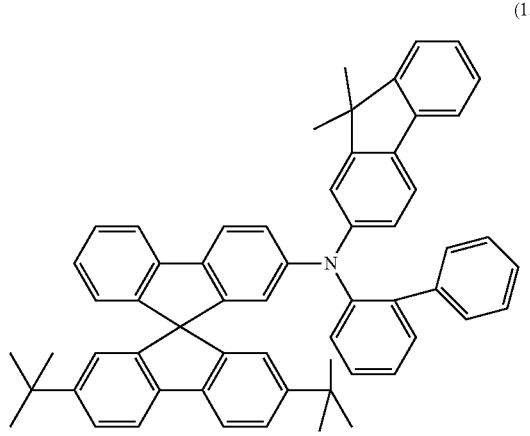
-continued
(131)
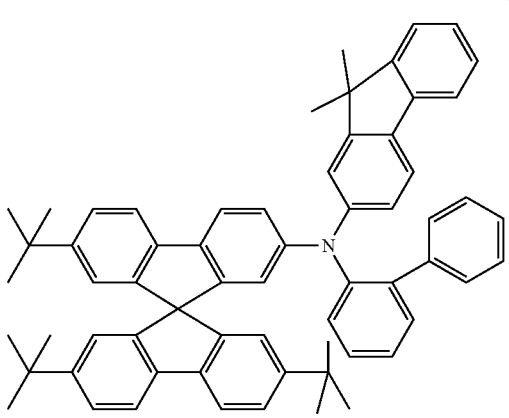
(132)
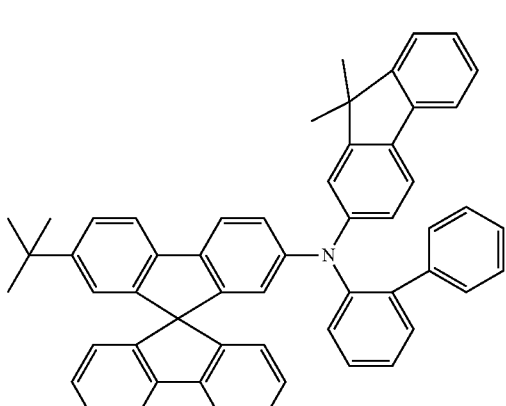
(133)
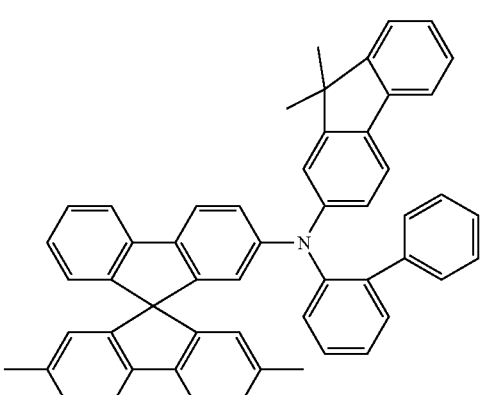
(134)
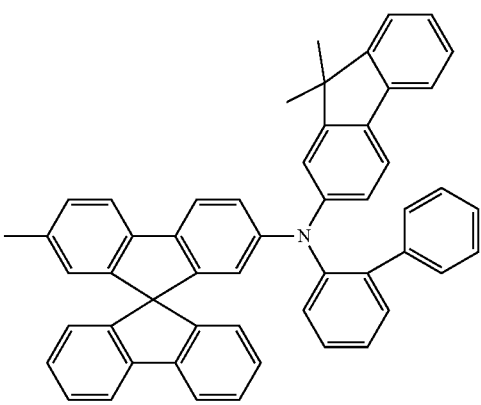

(135)
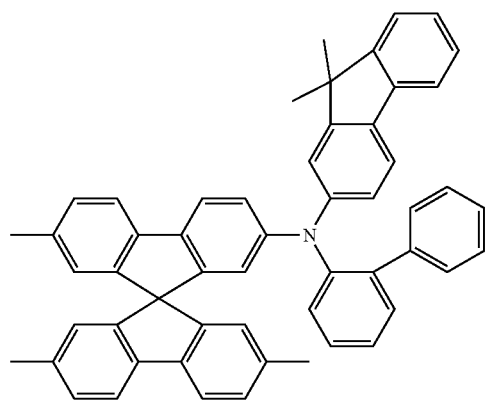
(136)
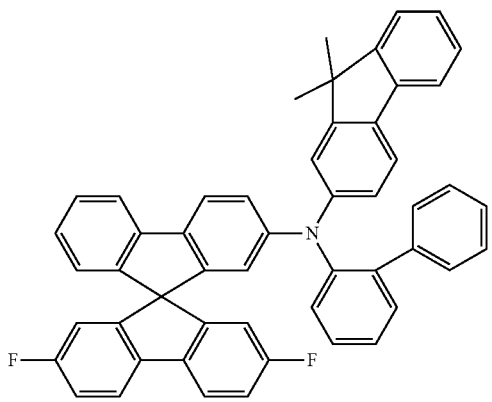
(137)
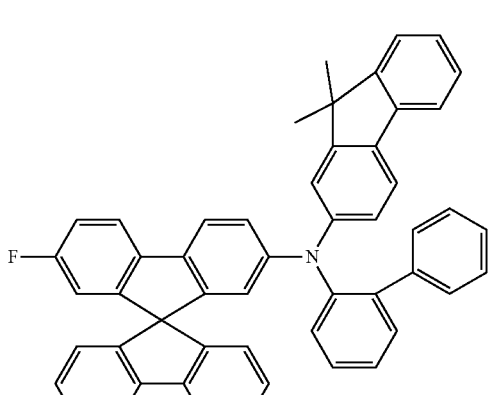
(138)
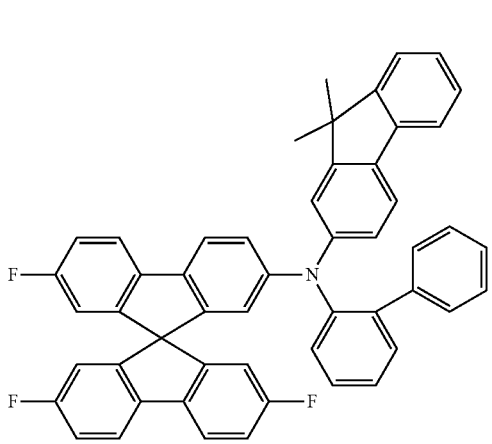
(139)
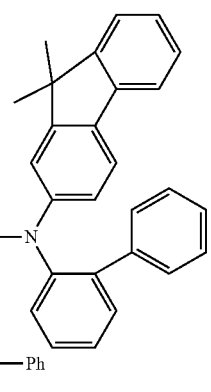
(140)
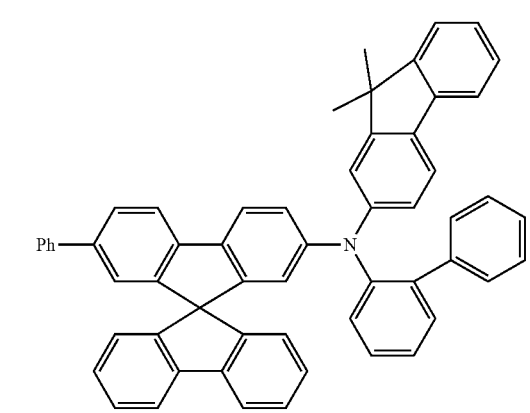
(141)
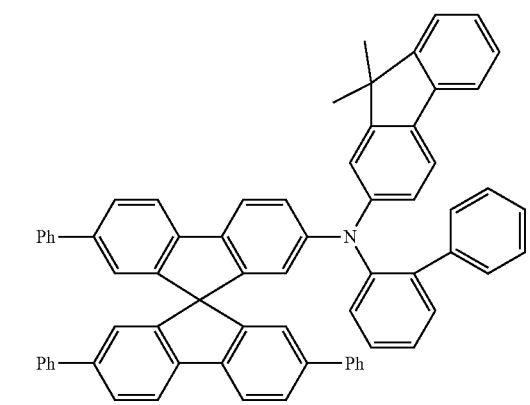
(142)
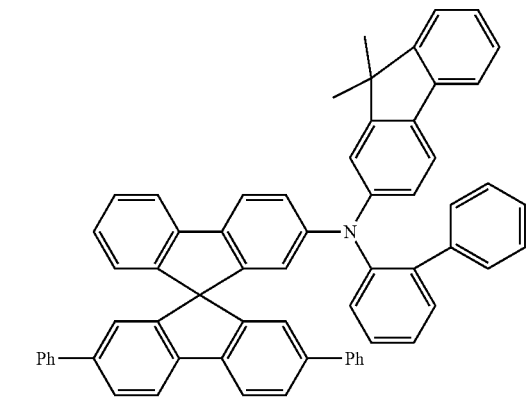

(143)
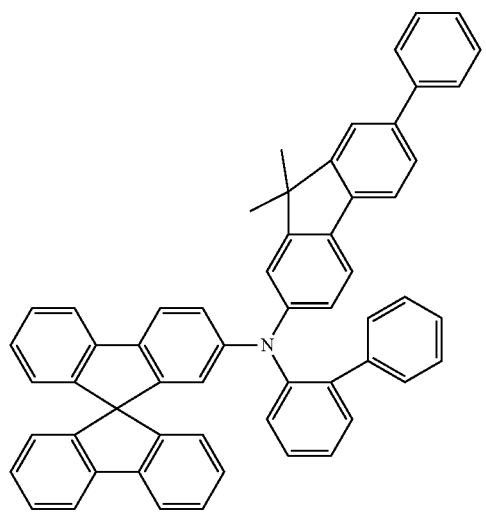
(144)
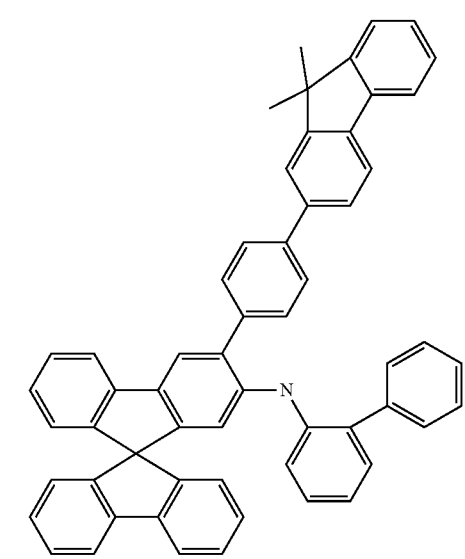
(145)
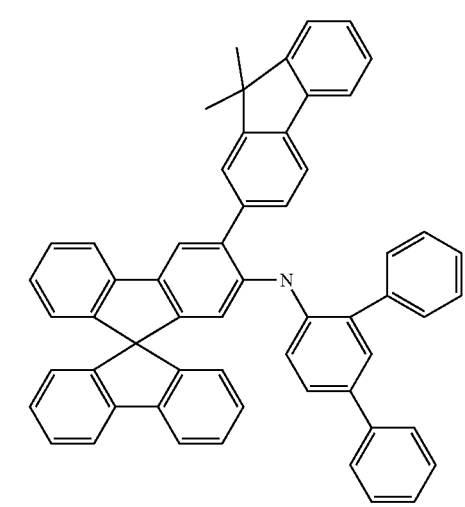
(146)
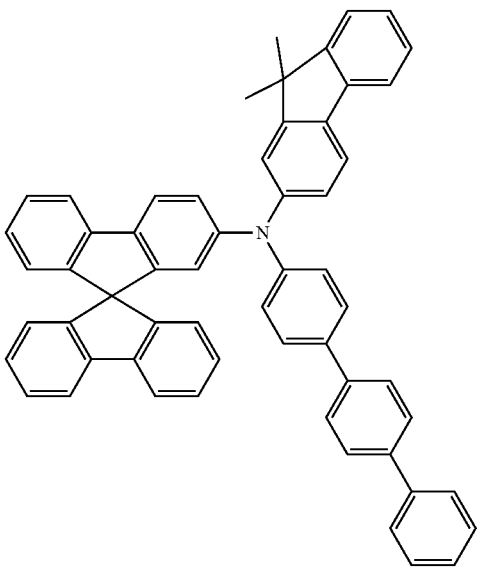
(147)
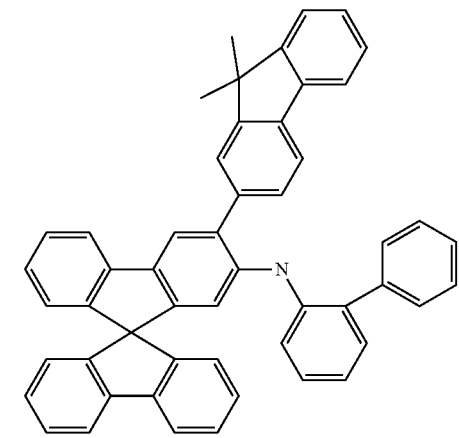
(148)
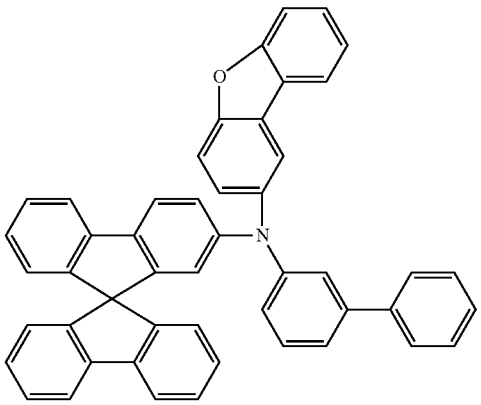

(149) 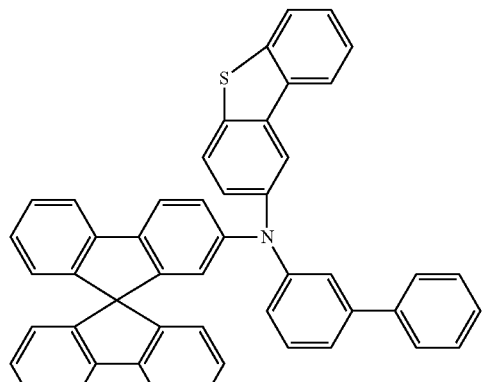
(150) 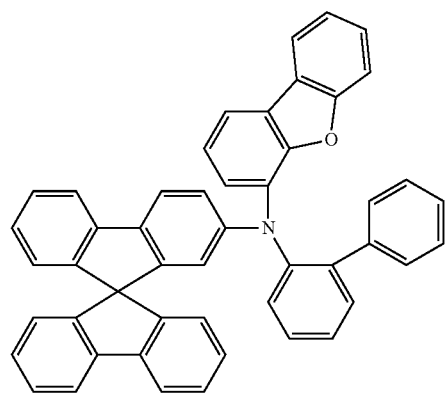
(151) 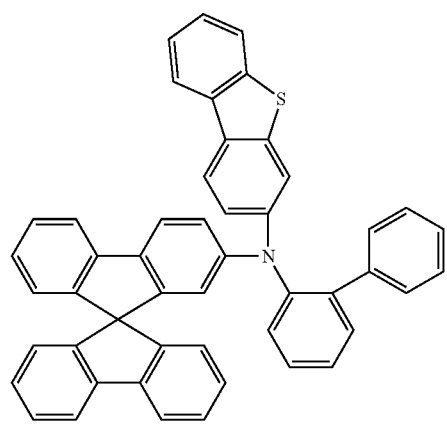
(152) 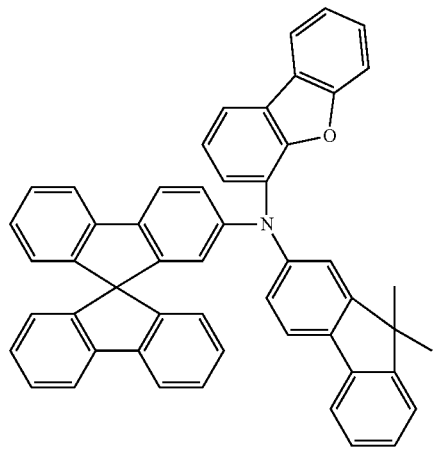
(153) 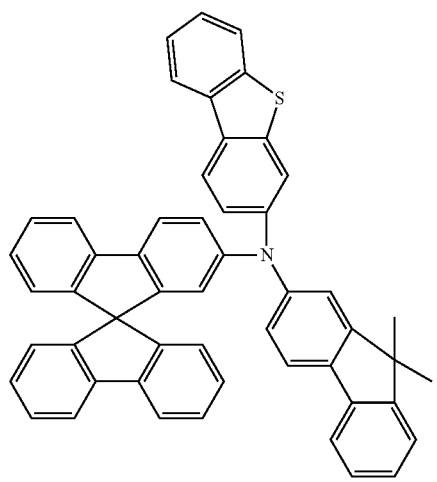
(154) 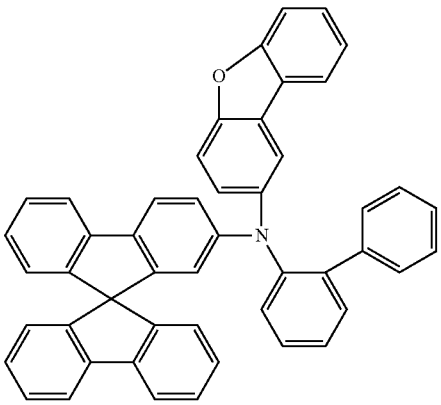

(155)
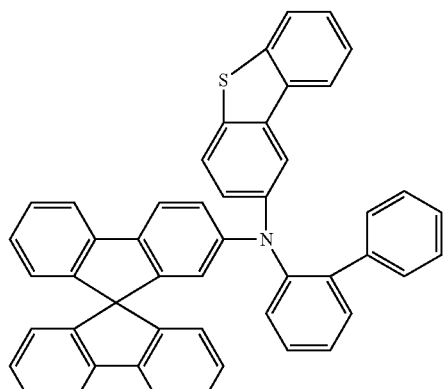
(158)
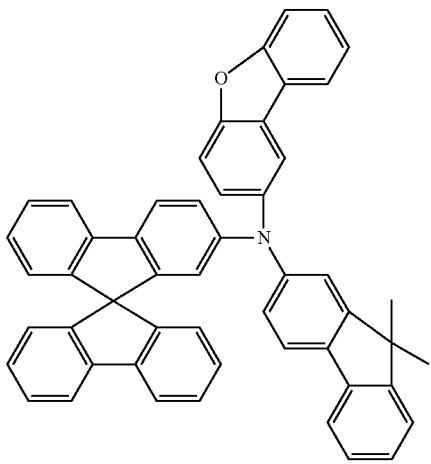
(156)
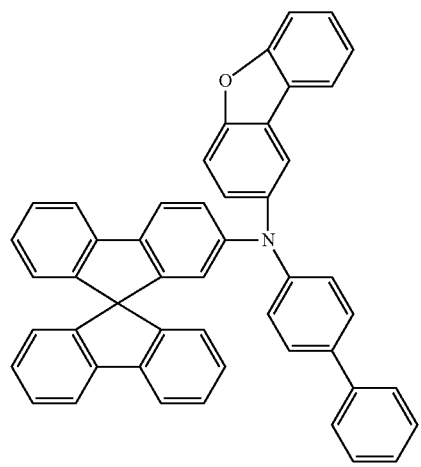
(159)
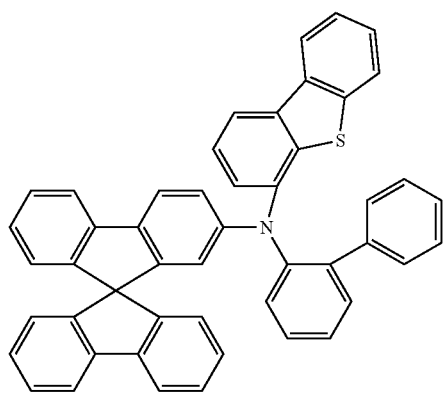
(157)
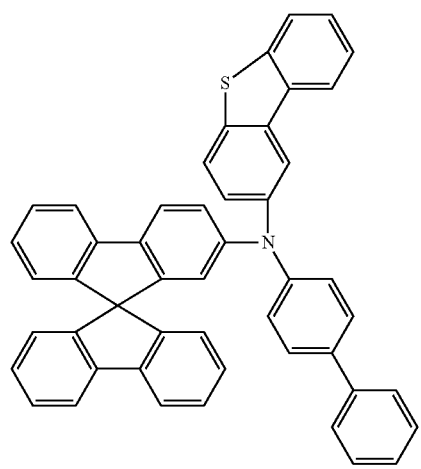

(161)
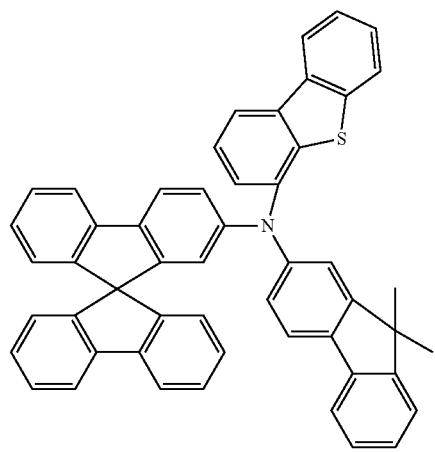
(162)
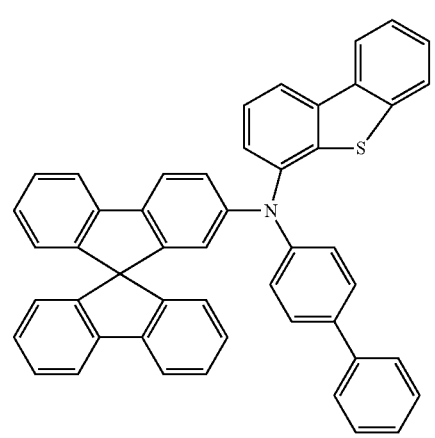
(163)
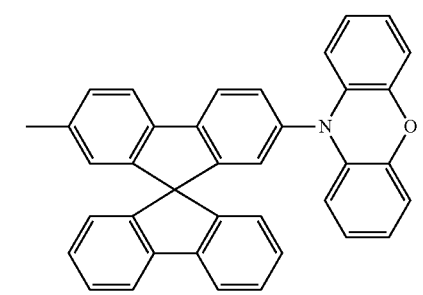
(164)
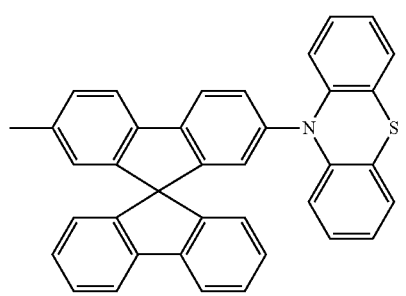
(165)
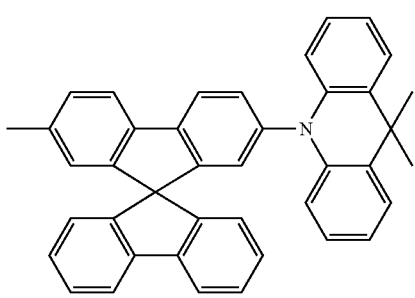
(166)
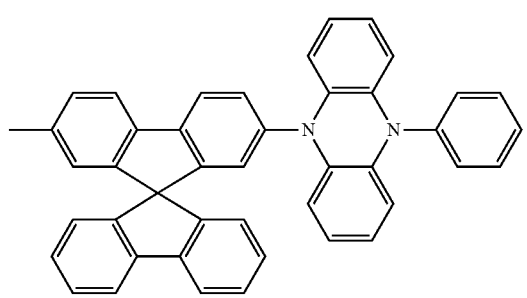
(167)
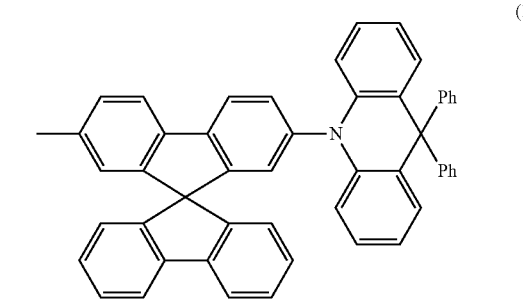
(168)
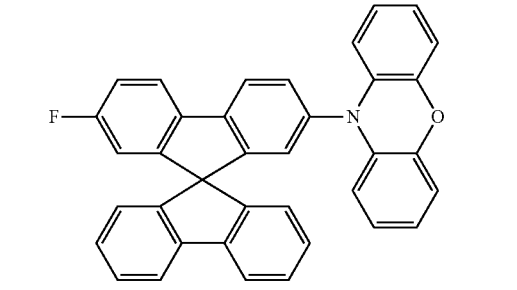
(169)
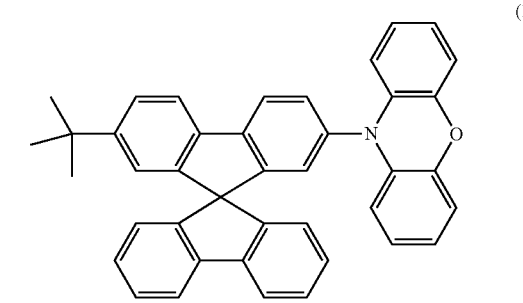

(170) 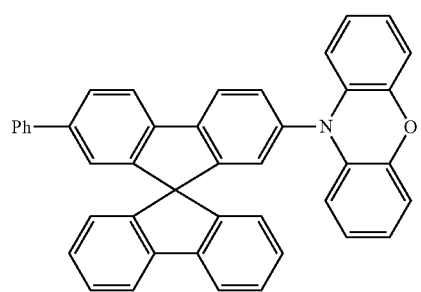
(171) 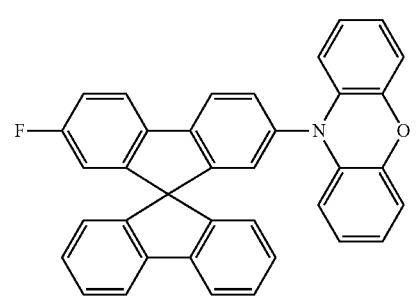
(172) 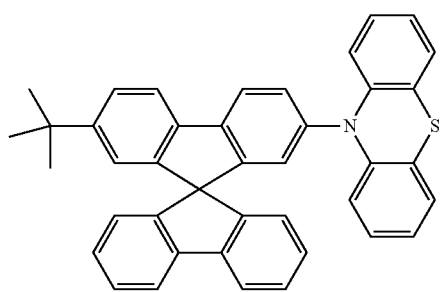
(173) 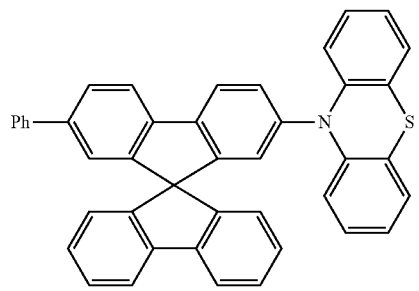
(174) 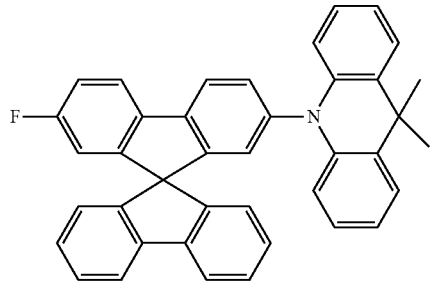
(175) 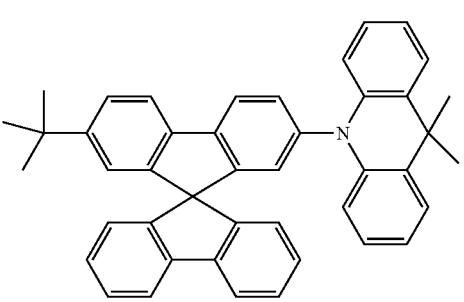
(176) 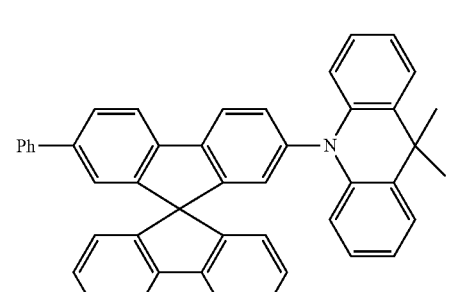
(177) 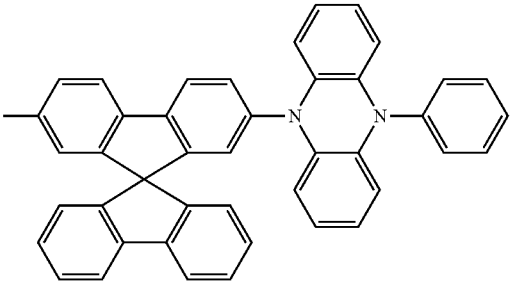
(178) 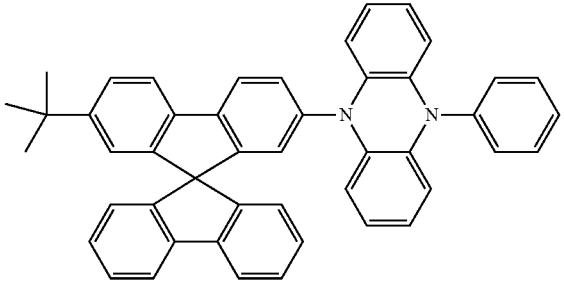
(179) 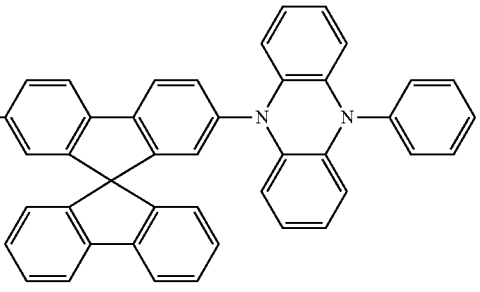

(180) 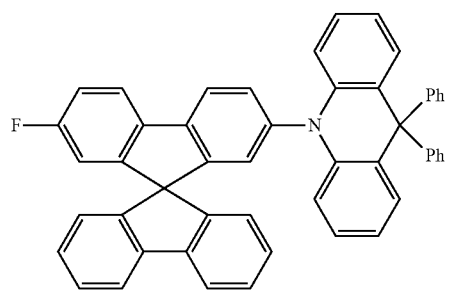
(181) 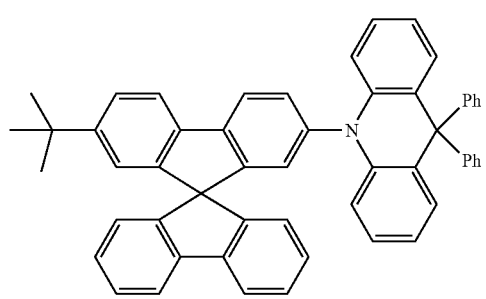
(1182) 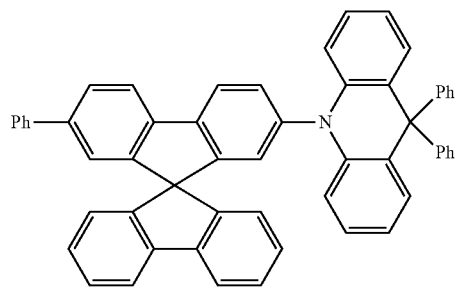
(183) 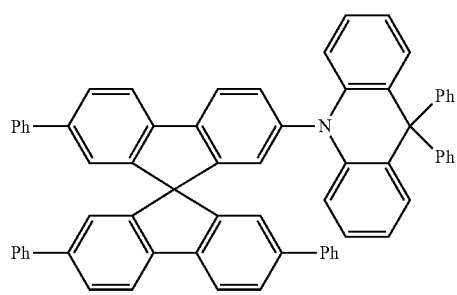
(184) 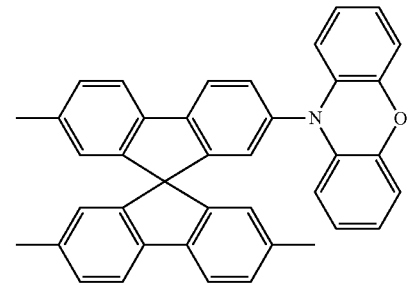
(185) 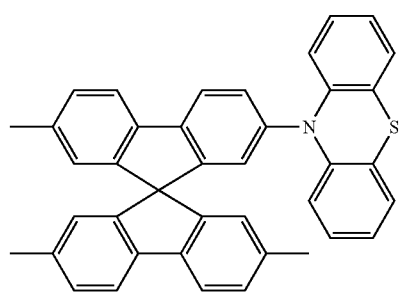
(186) 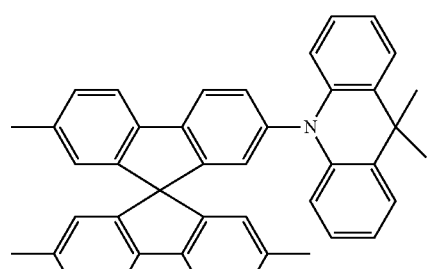
(187) 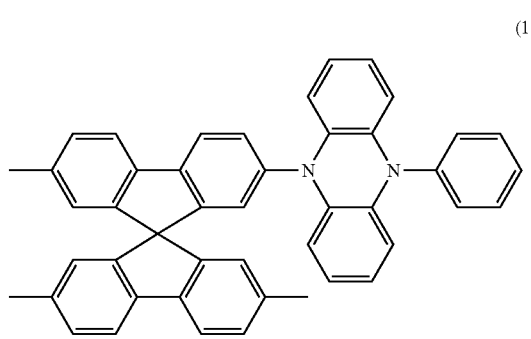
(188) 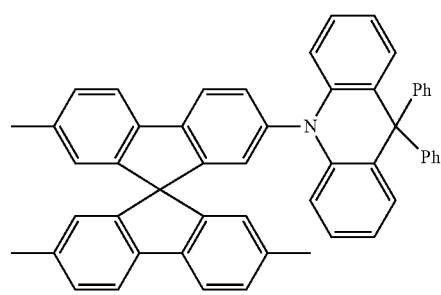
(189) 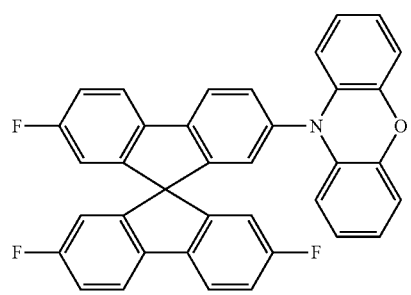

(190)
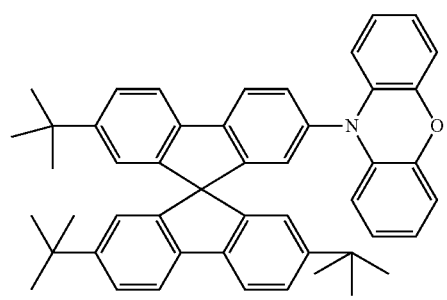
(191)
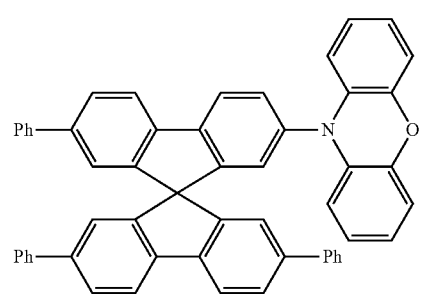
(192)
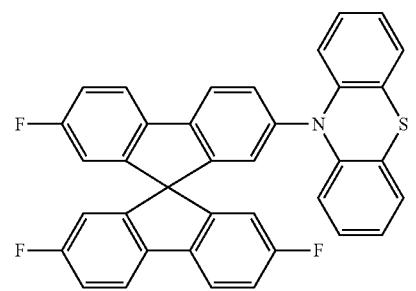
(193)
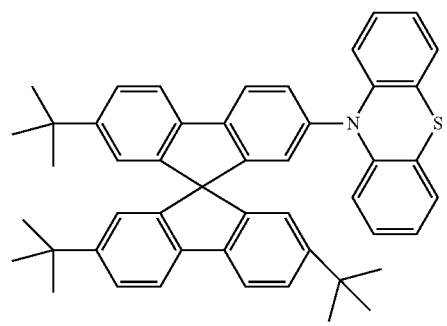
(194)
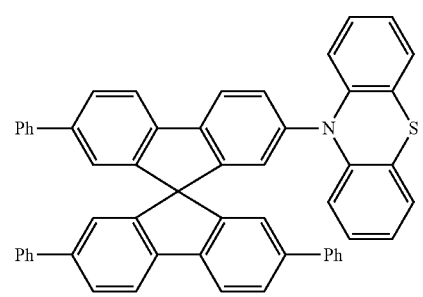
(195)
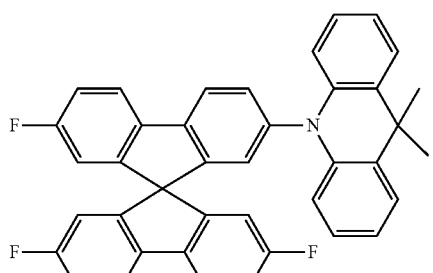
(196)
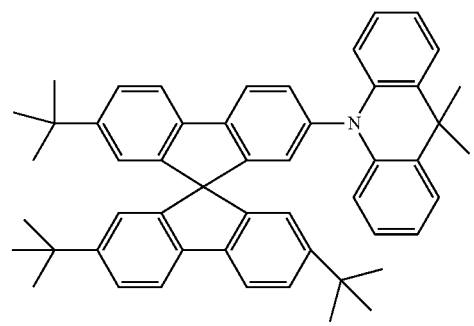
(197)
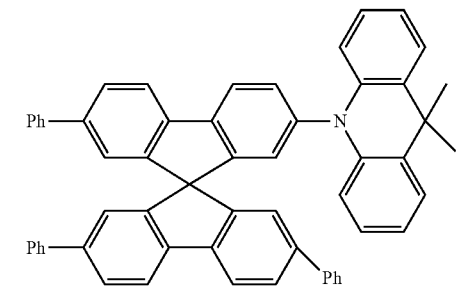
(198)
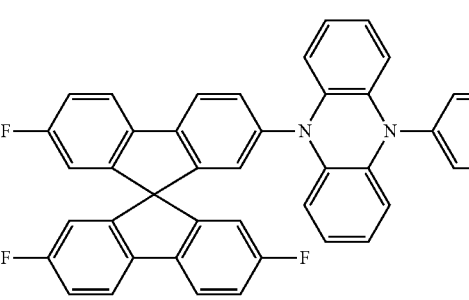
(199)
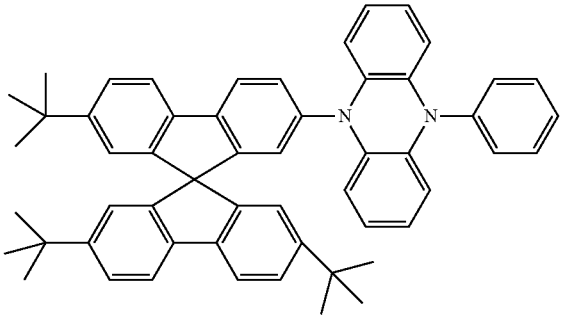

(200)
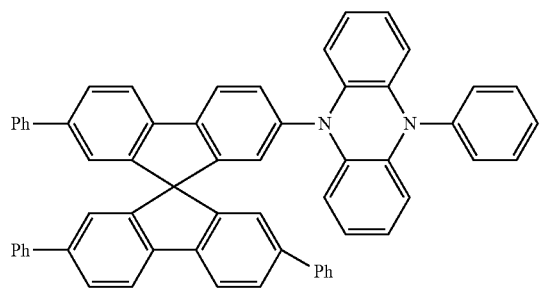
(201)
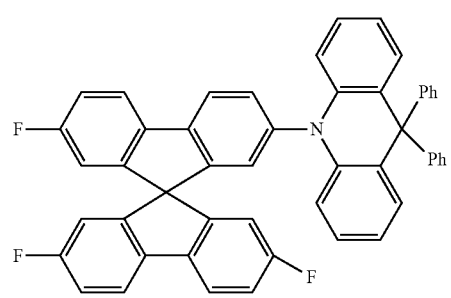
(202)
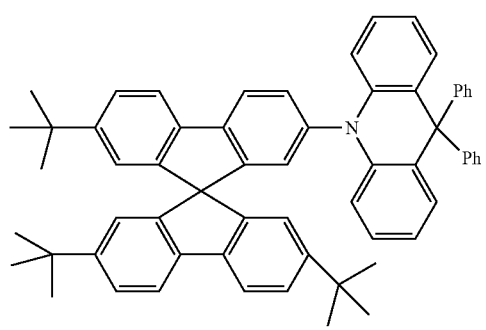
(203)
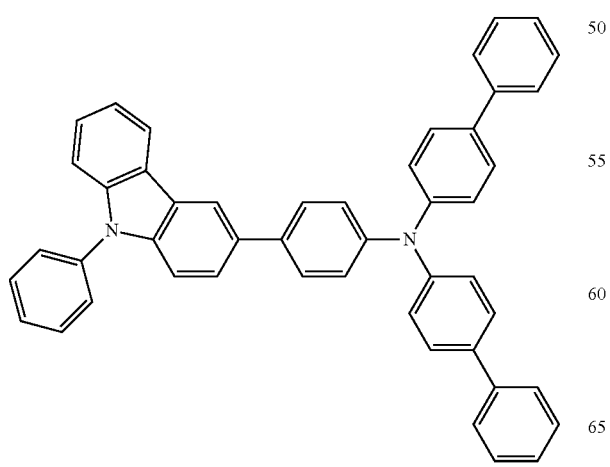
(204)
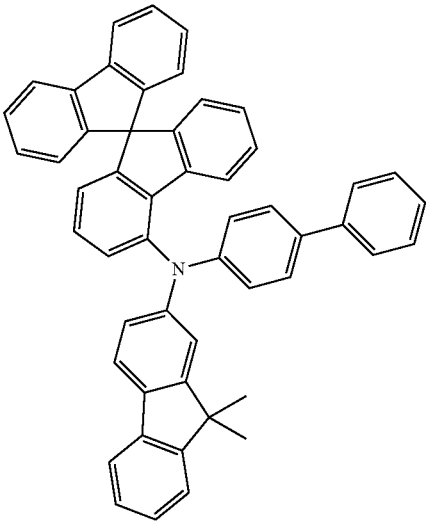
(205)
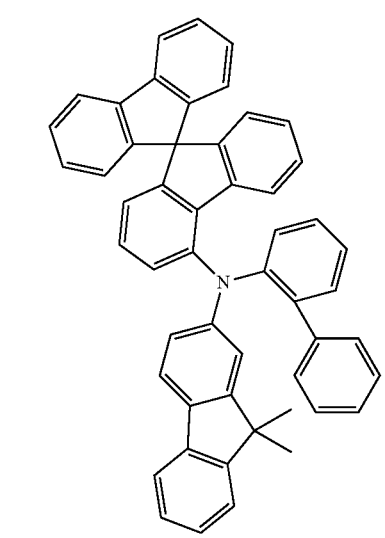
(206)
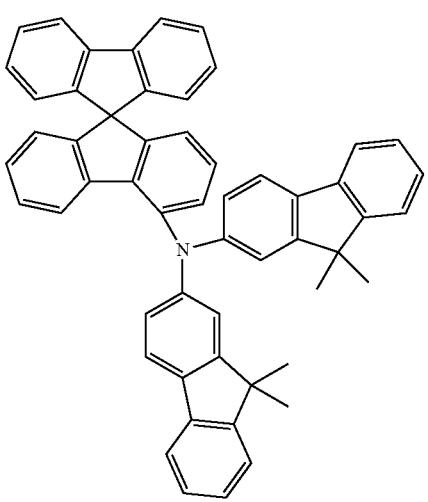

-continued
(207)
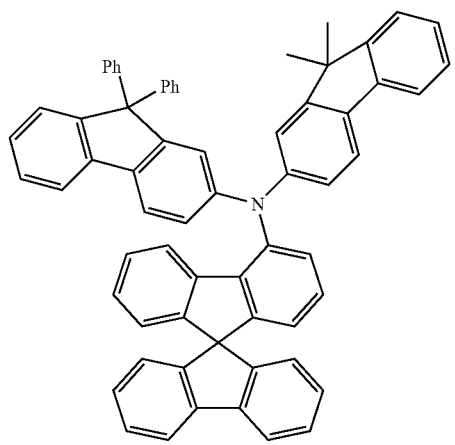
(208)
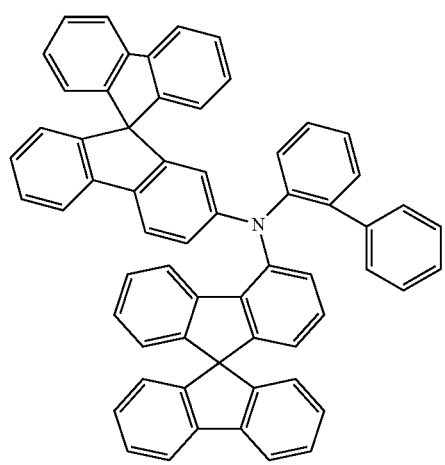
(209)
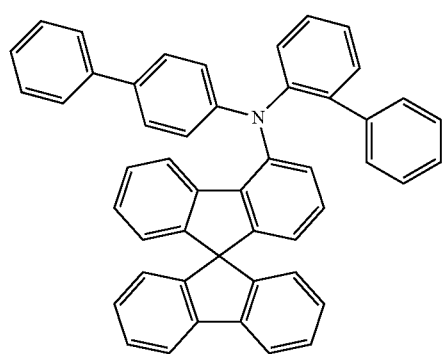
(210)
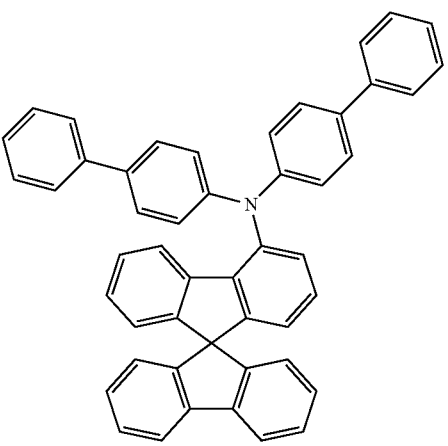
(211)
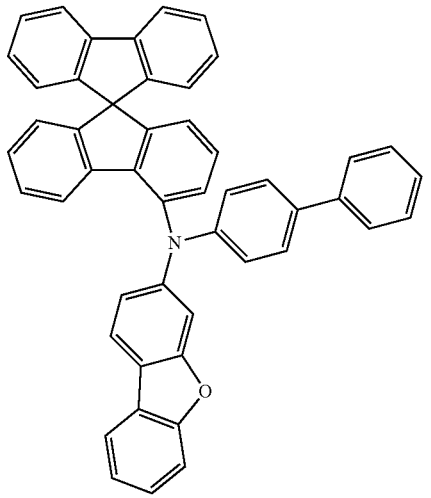
(212)
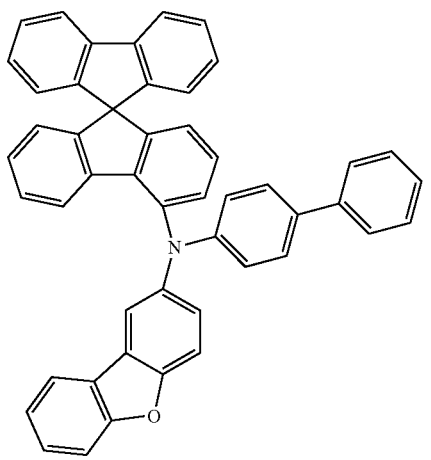

(213)
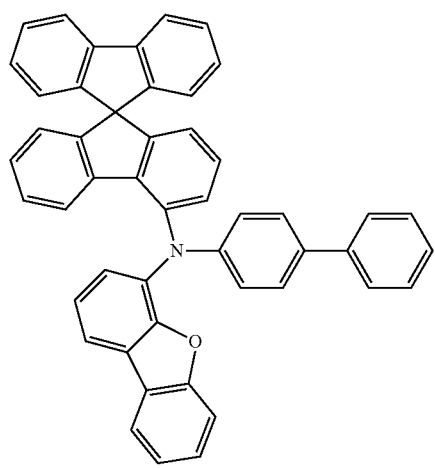
(214)
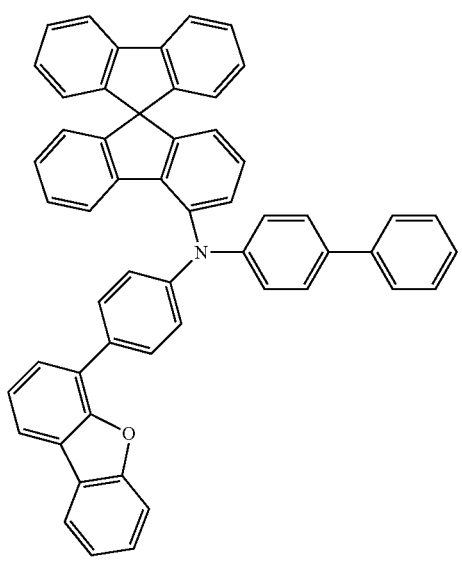
(215)
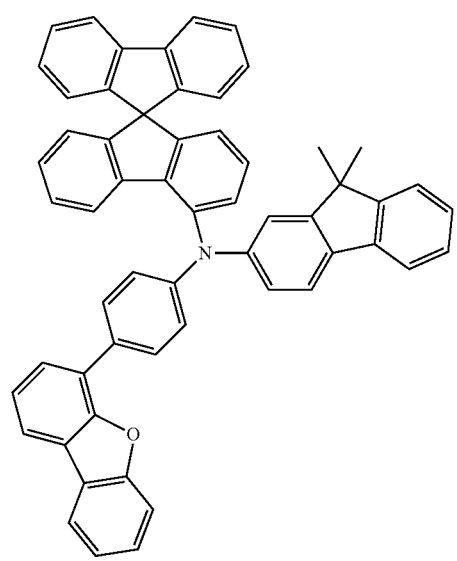
(216)
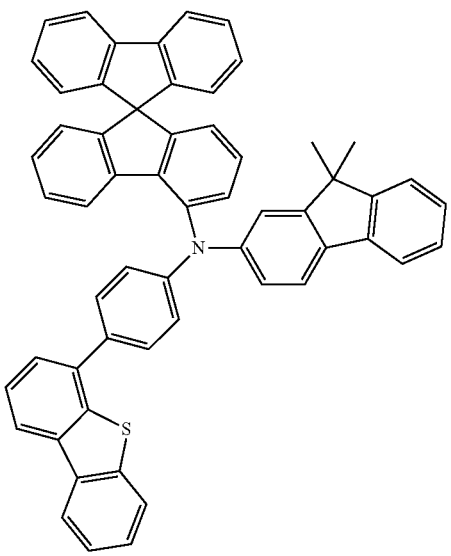
(217)
(218)
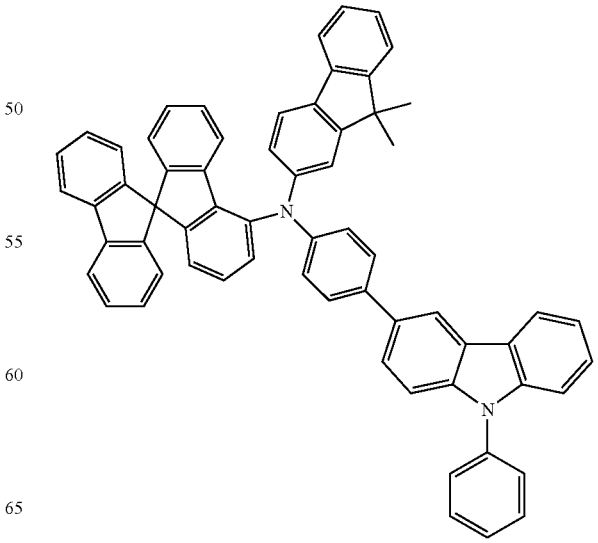

(219)
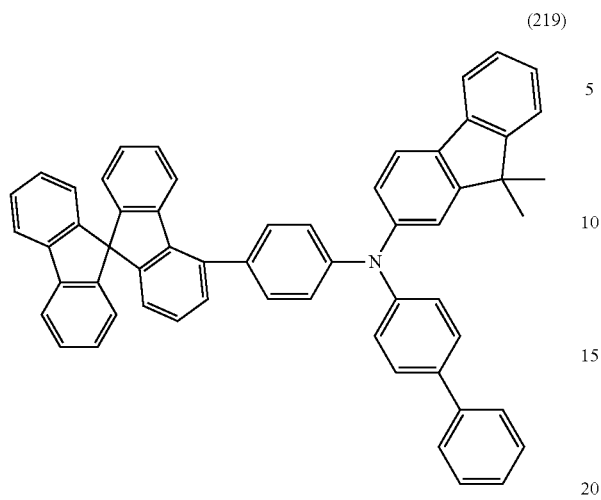
(221)
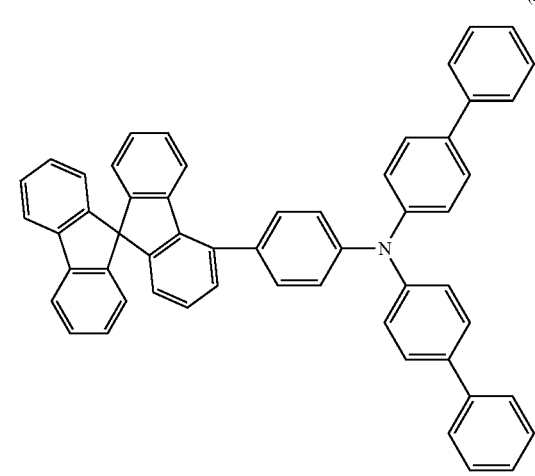
(221)
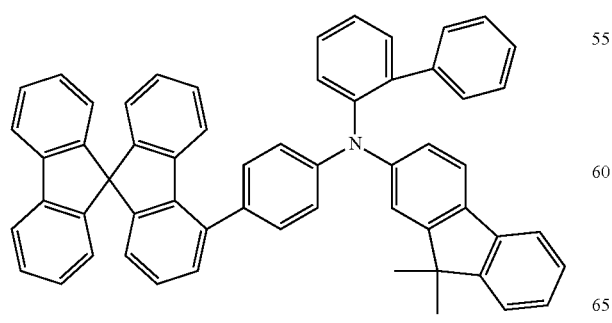
(222)
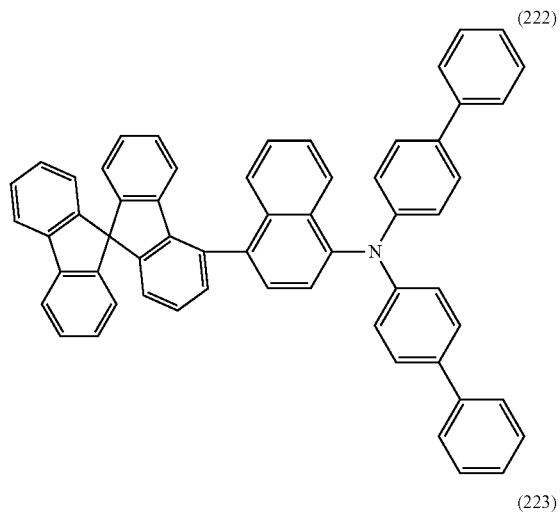
(223)
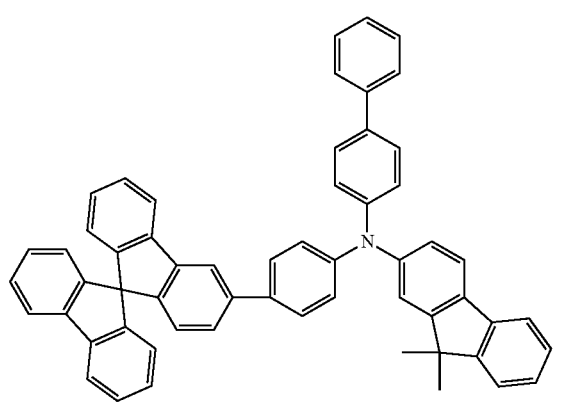
(224)
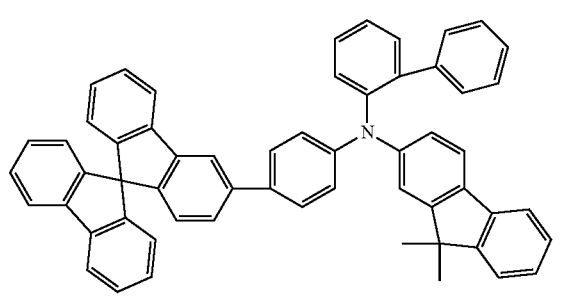
(225)
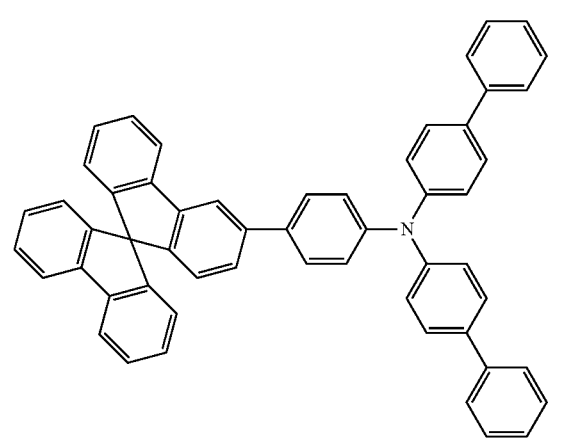

-continued
(226)
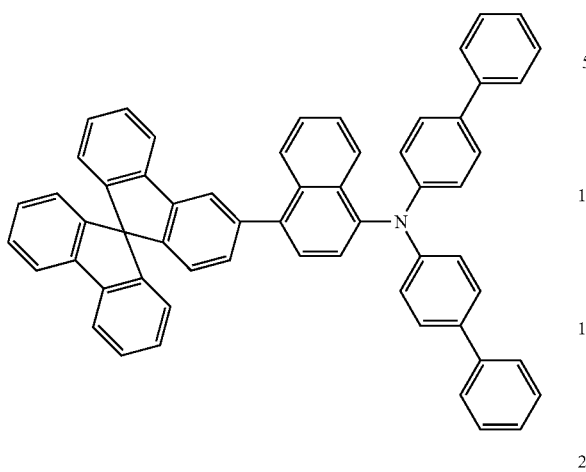
(227)
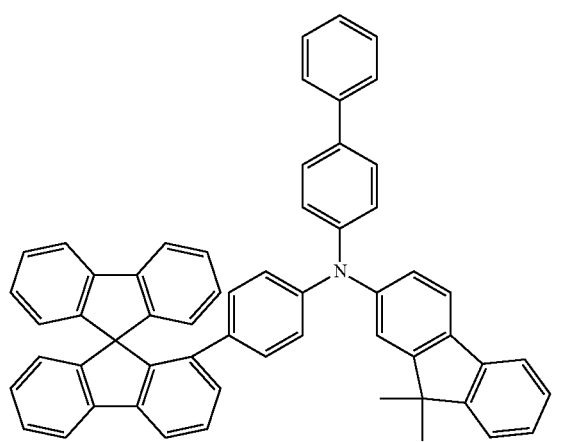
(228)
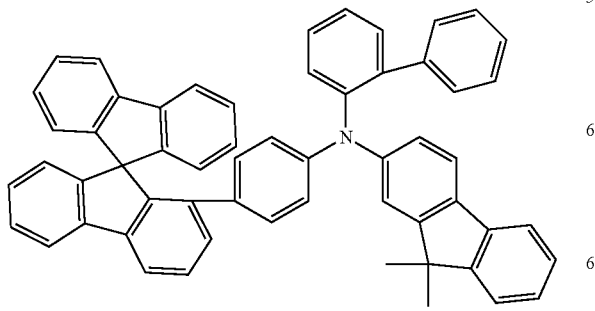
-continued
(229)
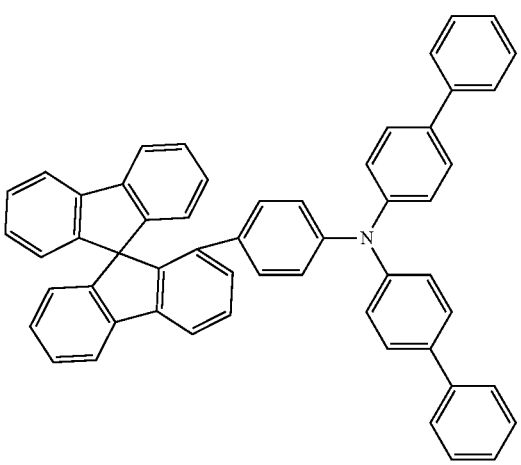
(230)
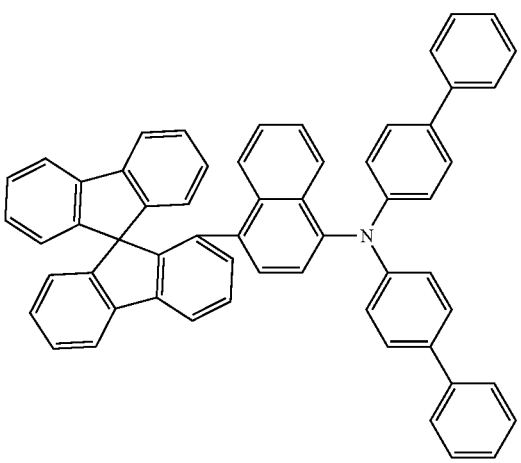
(231)
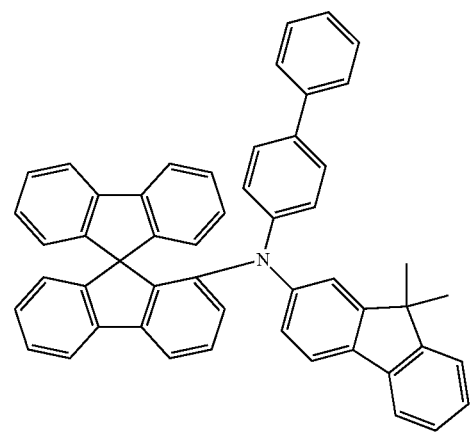

(232)
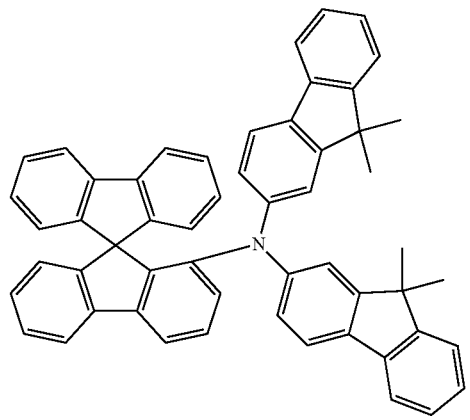
(233)
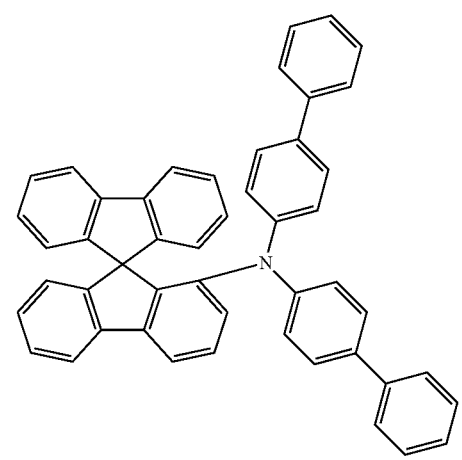
(234)
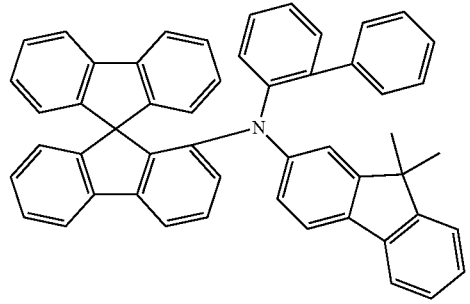
(235)
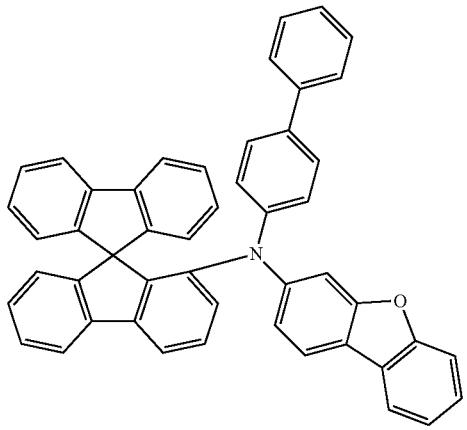
(236)
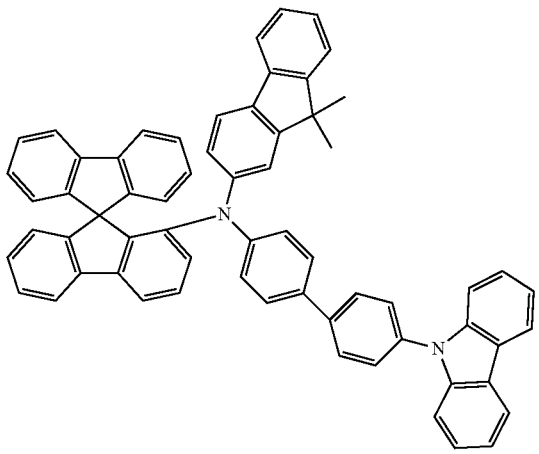
(237)
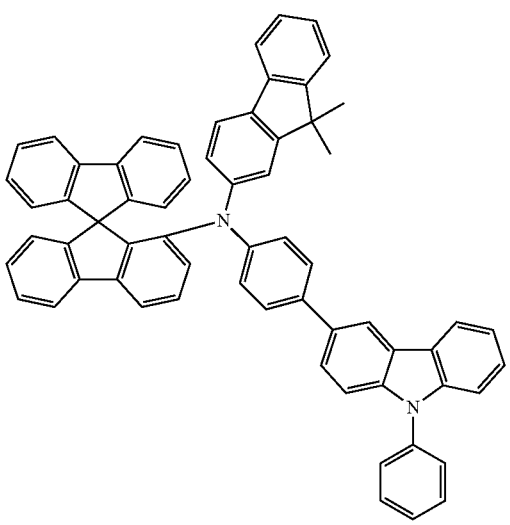
(238)
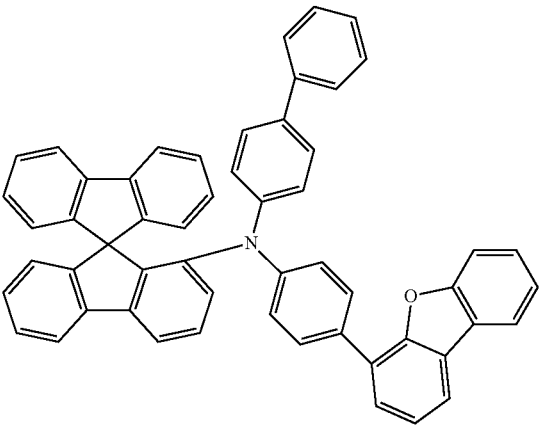

(239)
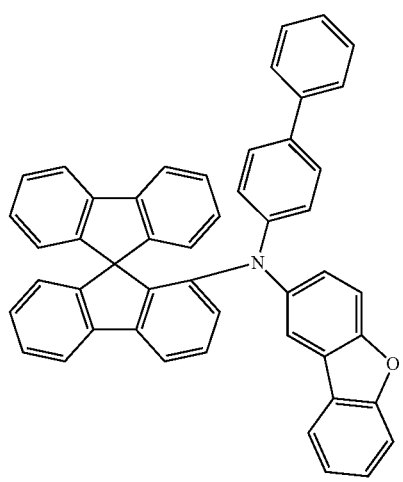
(240)
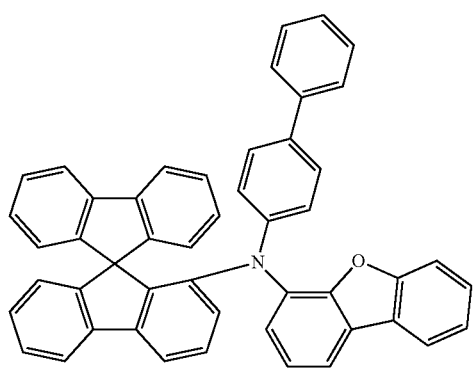
(241)
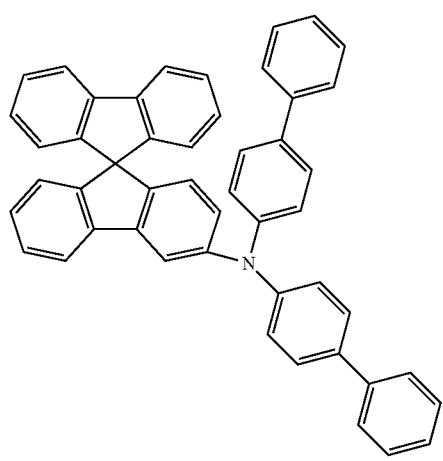
(242)
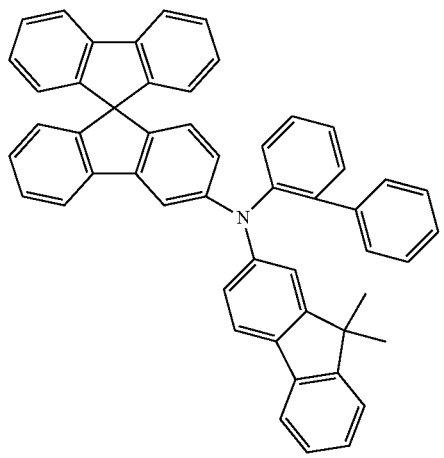
(243)
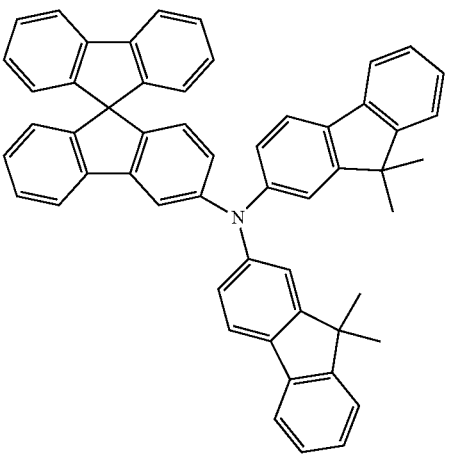
(244)
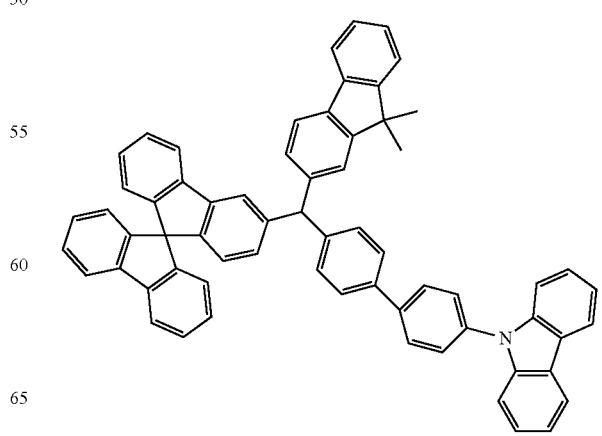

(245)
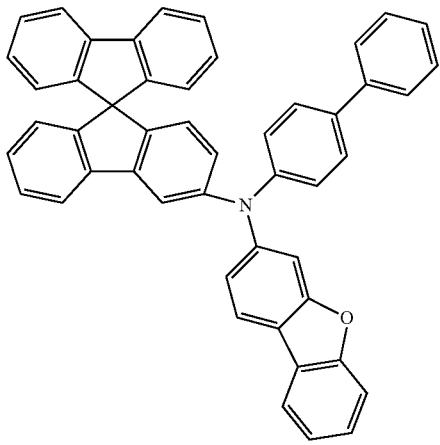
(246)
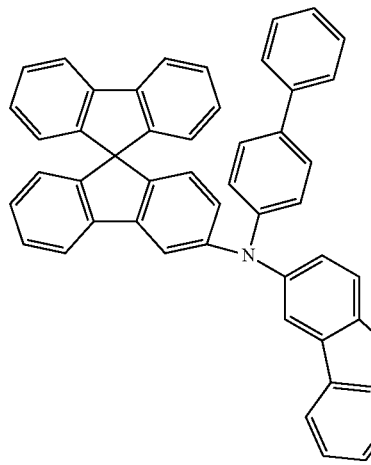
(247)
(248)
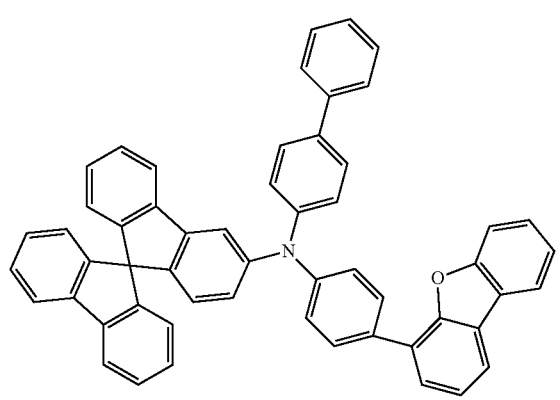
(249)
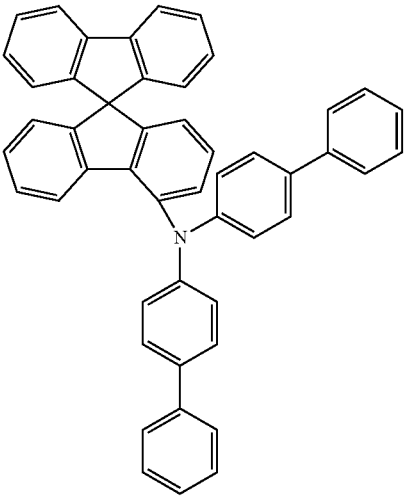
(250)
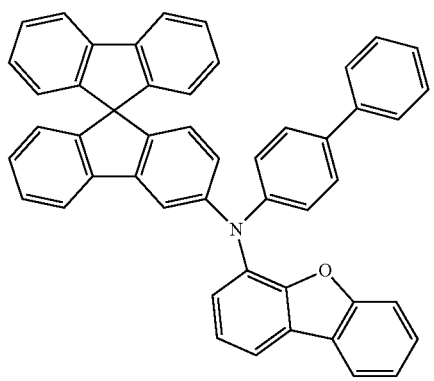
(251)
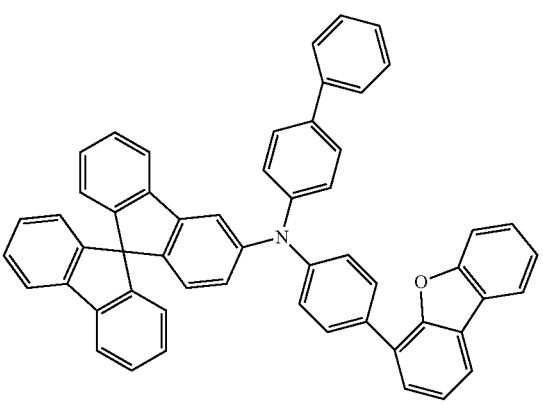

(252)
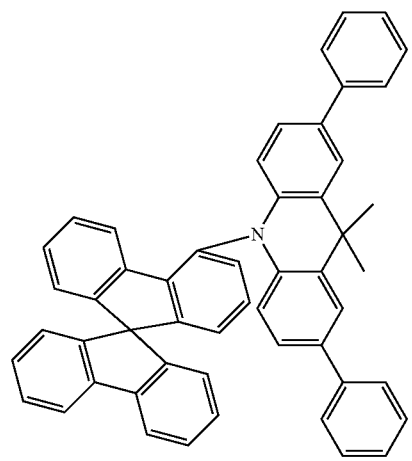
(253)
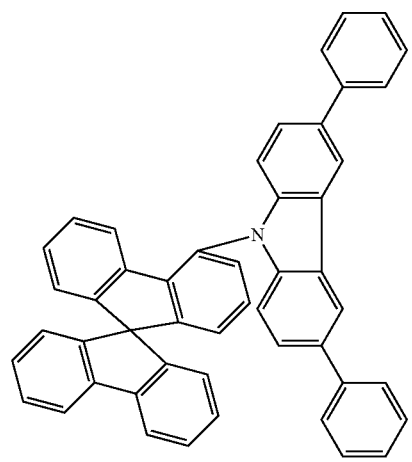
(254)
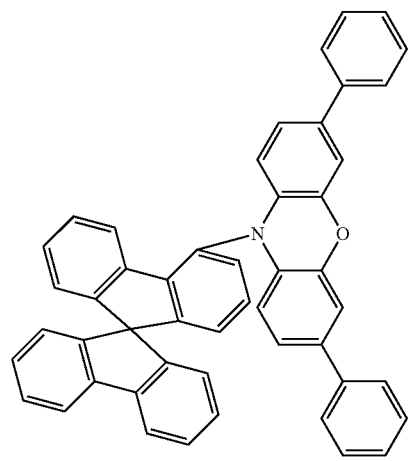
(255)
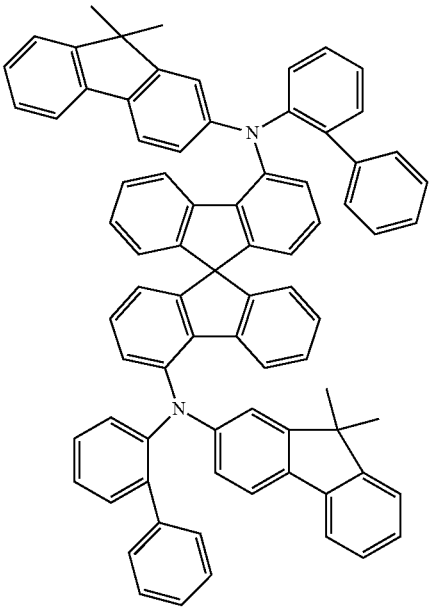
(256)
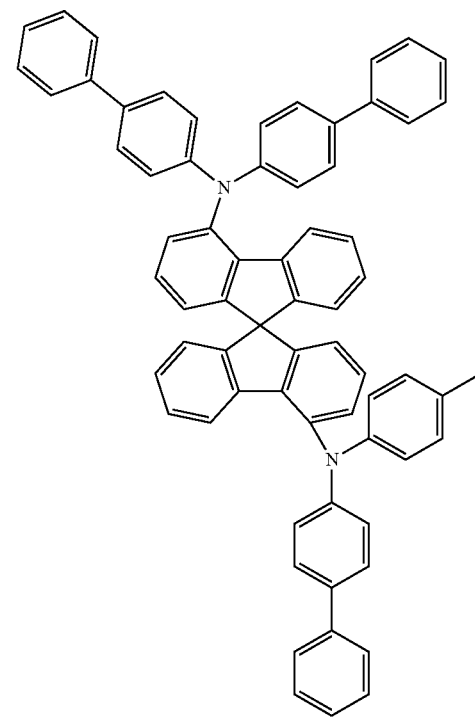

(257)
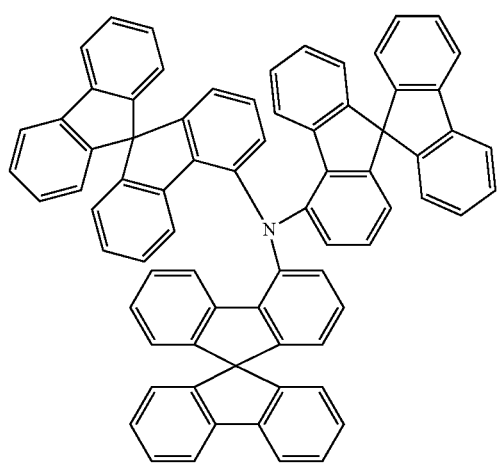
(258)
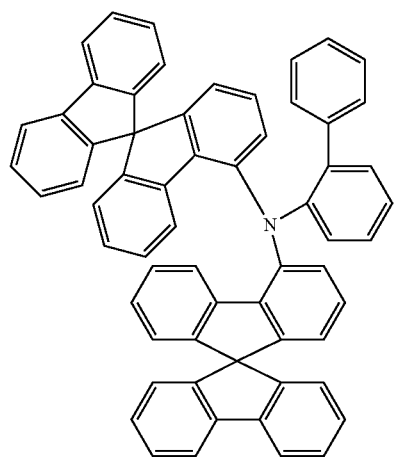
(259)
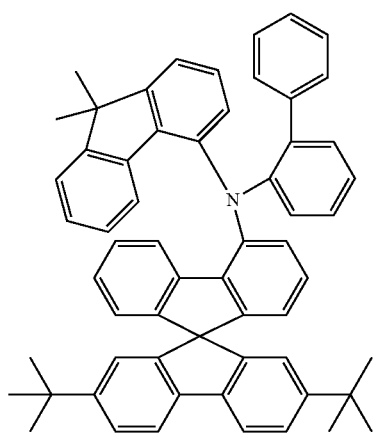
(260)
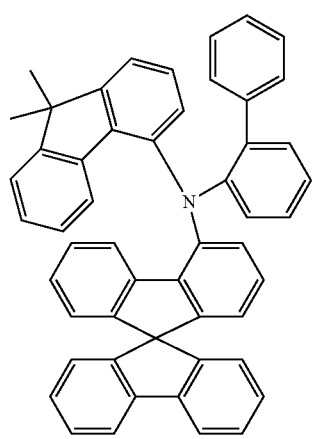
(261)
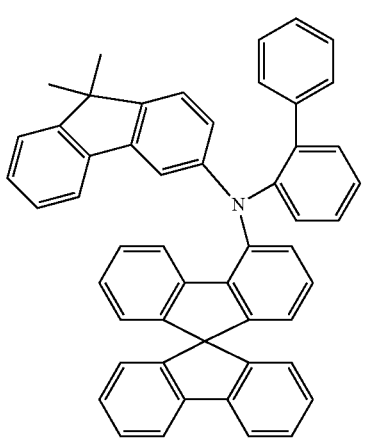
(262)
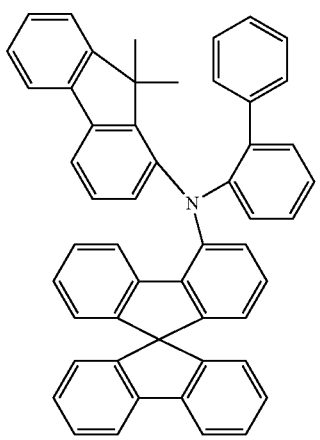

(163) 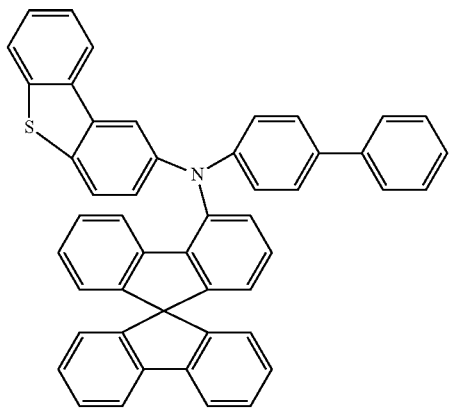
(266) 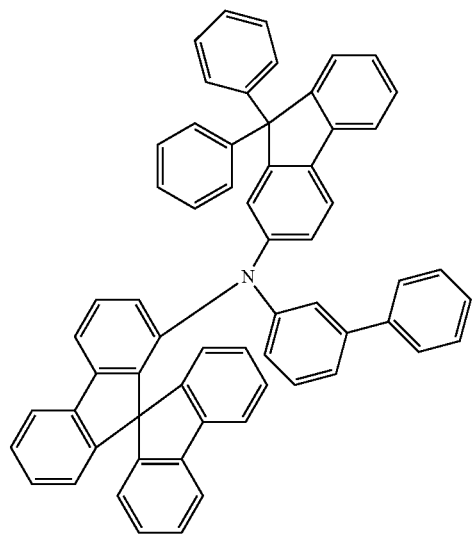
(264) 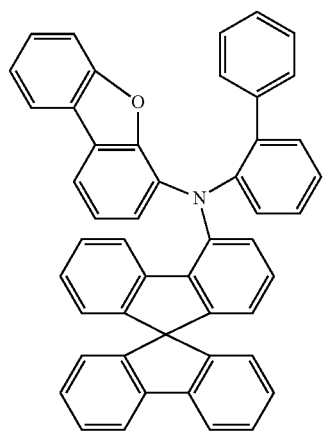
(267) 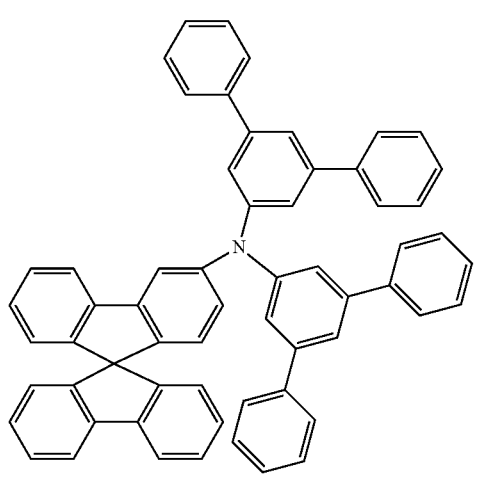
(265) 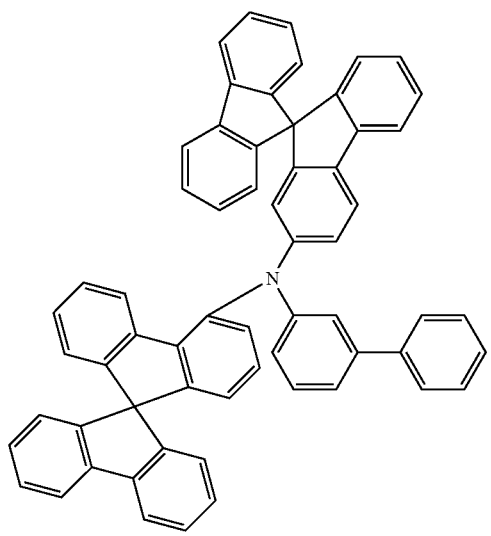
(268) 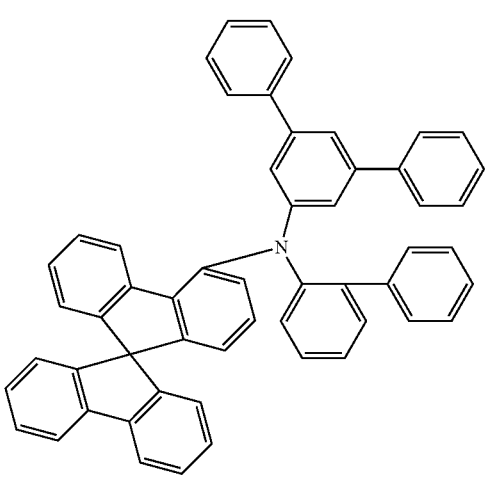

(269)
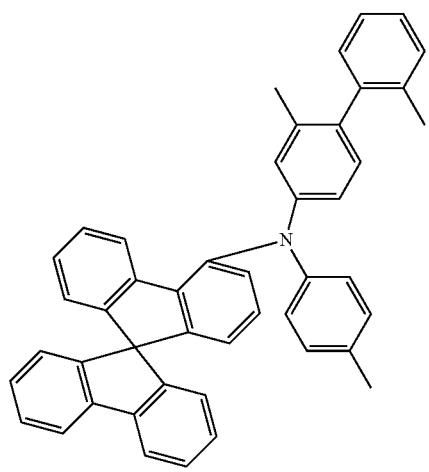
(270)
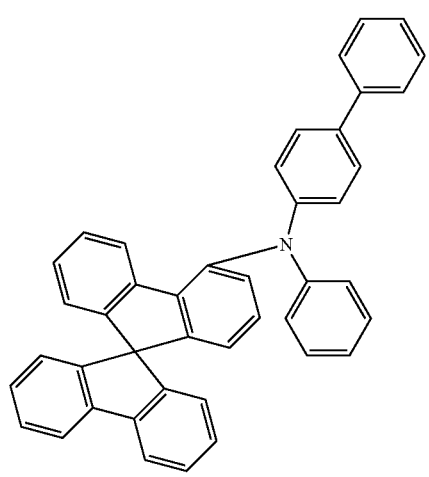
(271)
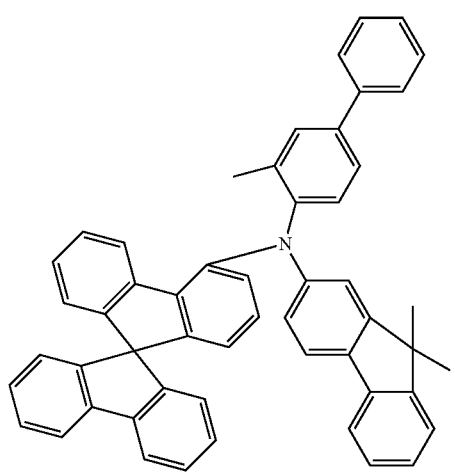
(272)
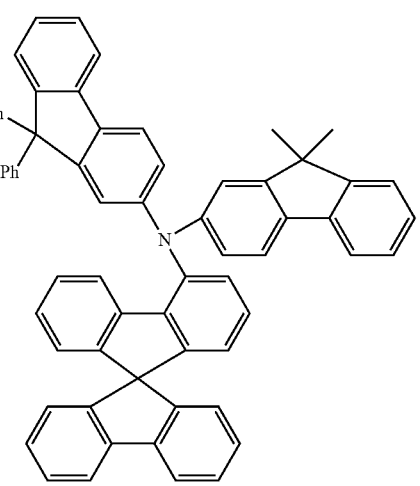
(273)
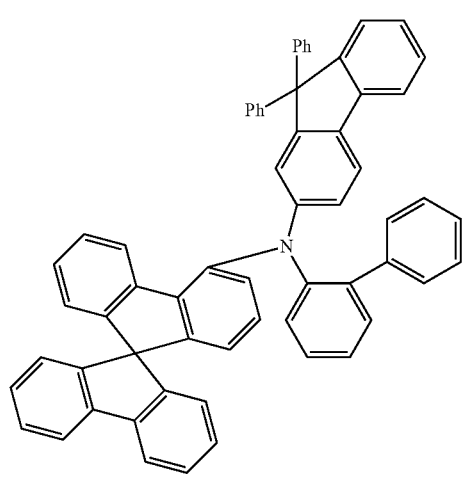
(274)
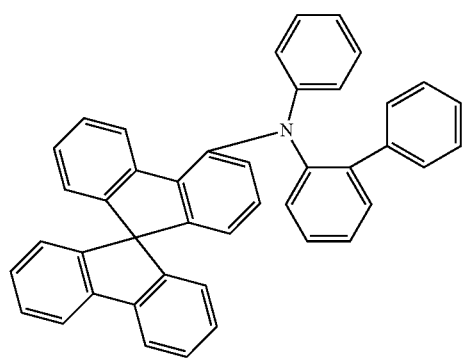

-continued

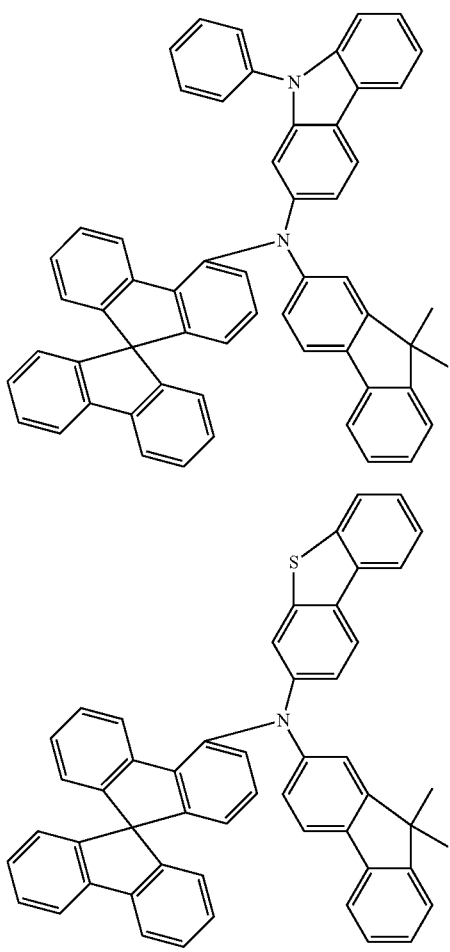

(275)

(276)

The at least one hole-transport layer preferably has a thickness of 100 to 300 nm, particularly preferably 130 to 230 nm.

The organic electroluminescent device according to the invention comprises at least one emitting layer. The emitting layer(s) can be fluorescent or phosphorescent, i.e. comprise(s) fluorescent or phosphorescent emitters.

The term phosphorescent emitters (dopants) typically encompasses compounds in which the light emission takes place through a spin-forbidden transition, for example a transition from an excited triplet state or a state having a relatively high spin quantum number, for example a quintet state.

Suitable phosphorescent emitters are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescent dopants used are preferably compounds which contain copper, molybdenum, tungsten, rhenium, ruthenium, osmium, rhodium, iridium, palladium, platinum, silver, gold or europium, in particular compounds which contain iridium, platinum or copper.

For the purposes of the present invention, all luminescent iridium, platinum or copper complexes are regarded as phosphorescent compounds.

Examples of the phosphorescent dopants described above are revealed by the applications WO 2000/70655, WO 2001/41512, WO 2002/02714, WO 2002/15645, EP 1191613, EP 1191612, EP 1191614, WO 2005/033244, WO 2005/019373 and US 2005/0258742. In general, all phosphorescent complexes as used in accordance with the prior art for phosphorescent OLEDs and as are known to the person skilled in the art in the area of organic electroluminescent devices are suitable for use in the devices according to the invention. The person skilled in the art will also be able to employ further phosphorescent complexes without inventive step in combination with the compounds according to the invention in OLEDs.

Preferred fluorescent emitters for use in the organic electroluminescent devices according to the invention are selected from the class of the triarylamine compounds, as defined above. At least one of the aryl or heteroaryl groups bonded to the nitrogen atom is preferably a condensed ring system, particularly preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyrenamines, pyrenediamines, chrysenamines and chrysenediamines are defined analogously thereto, where the diarylamino groups are preferably bonded to the pyrene in the 1-position or in the 1,6-position. Further preferred dopants are indenofluorenamines and indeno-fluorenediamines, for example in accordance with WO 2006/108497 or WO 2006/122630, benzoindenofluorenamines and benzoindenofluorenediamines, for example in accordance with WO 2008/006449, and dibenzoindenofluorenamines and dibenzoindenofluorenediamines, for example in accordance with WO 2007/140847, as well as the indenofluorene derivatives containing condensed aryl groups disclosed in WO 2010/012328 or the indenofluorenes disclosed in EP 3057947. Preference is likewise given to the pyrenearylamines disclosed in WO 2012/048780 and WO 2013/185871. Preference is likewise given to the benzoindenofluorenamines disclosed in WO 2014/037077 and the benzofluorenamines disclosed in EP 2941472.

The emitting layer preferably comprises one or more host materials (matrix materials) and one or more dopant materials (emitter materials).

According to a preferred embodiment, an emitting layer comprises a plurality of matrix materials (mixed-matrix systems) and/or a plurality of dopants. In this case too, the dopants are generally the materials whose proportion in the system is the smaller and the matrix materials are the materials whose proportion in the system is the greater. In individual cases, however, the proportion of an individual matrix material in the system may be smaller than the proportion of an individual dopant.

In mixed-matrix systems, one of the two matrix materials is preferably a material having hole-transporting properties and the other material is a material having electron-transporting properties. The desired electron-transporting and hole-transporting properties of the mixed-matrix components may, however, also be mainly or completely combined in a single mixed-matrix component, where the further mixed-matrix component or mixed-matrix components fulfil(s) other functions. The two different matrix materials may be present here in a ratio of 1:50 to 1:1, preferably 1:20 to 1:1, particularly preferably 1:10 to 1:1 and very particularly preferably 1:4 to 1:1. Preference is given to the use of mixed-matrix systems in phosphorescent organic electroluminescent devices. Preferred embodiments of mixed-matrix systems are disclosed, inter alia, in the application WO 2010/108579.

The mixed-matrix systems may include one or more dopants, preferably one or more phosphorescent dopants. In general, mixed-matrix systems are preferably employed in phosphorescent emitting layers.

Preferred matrix materials for fluorescent emitters are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239). Particularly preferred matrix materials are selected from the classes of the oligoarylenes, comprising naphthalene, anthracene, benzanthracene and/or pyrene or atropisomers of these compounds, the oligoarylenevinylenes, the ketones, the phosphine oxides and the sulfoxides. Very particularly preferred matrix materials are selected from the classes of the oligoarylenes, comprising anthracene, benzanthracene, benzophenanthrene and/or pyrene or atropisomers of these compounds. An oligoarylene in the sense of this invention is intended to be taken to mean a compound in which at least three aryl or arylene groups are bonded to one another.

Preferred matrix materials for phosphorescent emitters are aromatic ketones, aromatic phosphine oxides or aromatic sulfoxides or sulfones, for example in accordance with WO 2004/013080, WO 2004/093207, WO 2006/005627 or WO 2010/006680, triarylamines, carbazole derivatives, for example CBP (N,N-bis-carbazolylbiphenyl) or the carbazole derivatives disclosed in WO 2005/039246, US 2005/0069729, JP 2004/288381, EP 1205527 or WO 2008/086851, indolocarbazole derivatives, for example in accordance with WO 2007/063754 or WO 2008/056746, indenocarbazole derivatives, for example in accordance with WO 2010/136109, WO 2011/000455 or WO 2013/041176, azacarbazole derivatives, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, triazine derivatives, for example in accordance with WO 2010/015306, WO 2007/063754 or WO 2008/056746, zinc complexes, for example in accordance with EP 652273 or WO 2009/062578, diazasilole or tetra-azasilole derivatives, for example in accordance with WO 2010/054729, diaza-phosphole derivatives, for example in accordance with WO 2010/054730, bridged carbazole derivatives, for example in accordance with US 2009/0136779, WO 2010/050778, WO 2011/042107, WO 2011/088877 or WO 2012/143080, triphenylene derivatives, for example in accordance with WO 2012/048781, or lactams, for example in accordance with WO 2011/116865 or WO 2011/137951.

The organic electroluminescent device according to the invention may comprise a plurality of emitting layers. These emission layers in this case particularly preferably have in total a plurality of emission maxima between 380 nm and 750 nm, resulting overall in white emission, i.e. various emitting compounds which are able to fluoresce or phosphoresce and which emit blue or yellow or orange or red light are used in the emitting layers. Particular preference is given to three-layer systems, i.e. systems having three emitting layers, where at least one of these layers preferably comprises at least one compound of the formula (I) and where the three layers exhibit blue, green and orange or red emission (for the basic structure see, for example, WO 2005/011013). Alternatively and/or additionally, the compounds according to the invention may also be present in the hole-transport layer or in another layer. It should be noted that, for the generation of white light, an emitter compound used individually which emits in a broad wavelength range may also be suitable instead of a plurality of emitter compounds which emit in colours.

Besides anode, cathode, emitting layer, hole-transport layer and hole-injection layer, the organic electroluminescent device according to the invention preferably also comprises further functional layers selected from further hole-injection layers, further hole-transport layers, electron-blocking layers, further emitting layers, interlayers, electron-transport layers, electron-injection layers, hole-blocking layers, exciton-blocking layers, charge-generation layers, p/n junctions and coupling-out layers.

The organic electroluminescent device according to the invention preferably has at least one electron-transport layer, which is arranged between emitting layer and cathode.

The electron-transport layer preferably comprises at least one n-dopant and at least one electron-transport material matrix.

An n-dopant is taken to mean a compound which is able to at least partially reduce the other compound present in the layer (the matrix) and in this way increases the conductivity of the layer. n-Dopants in accordance with the present application are typically electron-donor compounds or strong reducing agents. n-Dopants which can be used are, for example, the materials disclosed in Chem. Rev. 2007, 107, pp. 1233 ff., Section 2.2, such as alkali metals, alkaline-earth metals and electron-rich and readily oxidisable organic compounds or transition-metal complexes.

Furthermore, the organic electroluminescent device according to the invention preferably has at least one electron-injection layer, which is arranged between electron-transport layer and cathode. The electron-injection layer is preferably directly adjacent to the cathode.

The materials used for the electron-transport layer and electron-injection layer can be all materials as are used in accordance with the prior art as electron-transport materials in the electron-transport layer. In particular, aluminium complexes, for example $Alq_3$, zirconium complexes, for example $Zrq_4$, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives are suitable. Furthermore suitable materials are derivatives of the above-mentioned compounds, as disclosed in JP 2000/053957, WO 2003/060956, WO 2004/028217, WO 2004/080975 and WO 2010/072300.

During production, the organic electroluminescent device is preferably structured, provided with contacts and finally sealed in order to exclude water and/or air. Further object of the present invention is a method for the production of an organic electroluminescent device according to the invention. The preferred method comprises the following steps:

a. Deposition of a hole-injection layer comprising at least 90% by weight, based on the total weight of the hole-injection layer, of at least one bismuth complex or gallium complex on an anode;

b. Deposition of at least one hole-transport layer on the hole-injection layer;

c. Deposition of at least one emitting layer;

d. Formation of a cathode.

In a preferred embodiment, the organic electroluminescent device according to the invention is characterised in that one or more layers are coated by means of a sublimation process, in which the materials are applied by vapour deposition in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

It is likewise preferred for one or more layers in the organic electroluminescent device according to the invention to be coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

It is likewise preferred for one or more layers in the organic electroluminescent device according to the invention to be produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing.

It is furthermore preferred, for the production of the organic electroluminescent device according to the invention, to apply one or more layers from solution and one or more layers by a sublimation process.

The organic electroluminescent device according to the invention can be employed in displays, as light sources in lighting applications and as light sources in medical and/or cosmetic applications (for example phototherapy).

The invention is explained in greater detail below with reference to working examples, but without being restricted thereby.

EXAMPLES

Example 1: Hole Only Devices

The data for various hole only devices are presented in the non-limiting examples below (see Tables 1 to 2). The substrates used are glass plates coated with structured ITO (indium tin oxide) in a thickness of 50 nm.

Freshly cleaned substrates are transferred into the evaporation tool. Here the substrates are preconditioned with oxygen plasma for 130 s and afterwards treated with argon plasma for 150 s.

Afterwards several organic layers are deposited by physical vapour deposition.

The thickness of the layers is determined by reference experiments, where thick layers of roughly 100 nm organic material are deposited. The thickness is measured during the evaporation by a thin-film thickness monitor, based on quartz crystal microbalance, f.e. Inficon. The organic layer is protected by evaporation of a thin aluminium film on top. Then, the real thickness of the organic layer is measured by a surface profiler, f.e. K-LA-Tencor P7. The tooling factor of the thin-film monitor is adapted that the film thickness of the surface profiler and the thin film monitor is the same. The devices basically have the following layer structure: substrate/hole-injection layer (HIL)/hole-transport layer (HTL) and finally a cathode. The cathode is formed by an aluminium layer with a thickness of 100 nm. The precise structure of the devices is shown in table 1. The materials required for the production of the devices are shown in table 3.

All materials are applied by thermal vapour deposition in a vacuum chamber. An expression such as HTM1:HIM1 (5%) here means that material HTM1 is present in the layer in a proportion by volume of 95% and HIM1 is present in the layer in a proportion of 5%. Analogously, other layers may also consist of a mixture of two or more materials.

The devices are characterised by current/voltage measurement. The data for the various devices containing inventive and comparative materials are summarised in table 2 (U@10 mA/cm$^2$ means the voltage of the device at a current density of 10 mA/cm$^2$ and U@100 mA/cm$^2$ means the voltage of the device at a current density of 100 mA/cm$^2$).

TABLE 1

| Ex. | HIL Thickness/nm | HTL Thickness/nm | cathode Thickness/nm |
|---|---|---|---|
| V1 | HATCN 3 nm | HTM1 100 nm | Al 100 nm |
| V2 | HATCN 3 nm | HTM2 100 nm | Al 100 nm |
| V3 | HTM1:HIM1(5%) 10 nm | HTM1 100 nm | Al 100 nm |
| V4 | — | HTM1 100 nm | Al 100 nm |
| E1 | HIM1 1.5 nm | HTM1 100 nm | Al 100 nm |
| E2 | HIM1 2 nm | HTM1 100 nm | Al 100 nm |
| E3 | HIM1 2.5 nm | HTM1 100 nm | Al 100 nm |
| E4 | HIM1 3 nm | HTM1 100 nm | Al 100 nm |
| E5 | HIM1 3 nm | HTM2 100 nm | Al 100 nm |
| E6 | HIM1 3 nm | HTM3 100 nm | Al 100 nm |
| E7 | HIM1 3 nm | HTM4 100 nm | Al 100 nm |
| E8 | HIM1 2 nm | HTM5 100 nm | Al 100 nm |
| E9 | HIM1 4 nm | HTM5 100 nm | Al 100 nm |

TABLE 2

| Ex. | U @ 10 mA/cm$^2$ [V] | U @ 100 mA/cm$^2$ [V] |
|---|---|---|
| V1 | 1.5 | 2.3 |
| V2 | 1.9 | 3.7 |
| V3 | 1.5 | 2.2 |
| V4 | 2.9 | 4.6 |
| E1 | 1.5 | 2.2 |
| E2 | 1.5 | 2.1 |
| E3 | 1.5 | 2.1 |
| E4 | 1.5 | 2.2 |
| E5 | 1.8 | 2.9 |
| E6 | 1.6 | 2.7 |
| E7 | 1.7 | 3.0 |
| E8 | 1.8 | 2.7 |
| E9 | 1.9 | 3.3 |

TABLE 3
Structures of the materials used
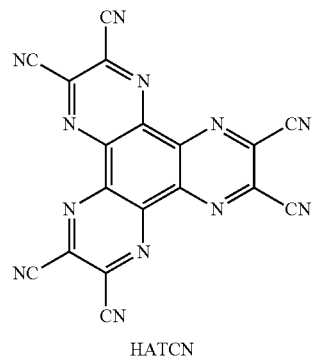
HATCN
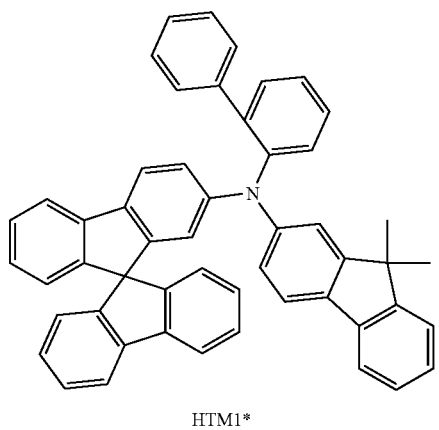 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
HTM1*
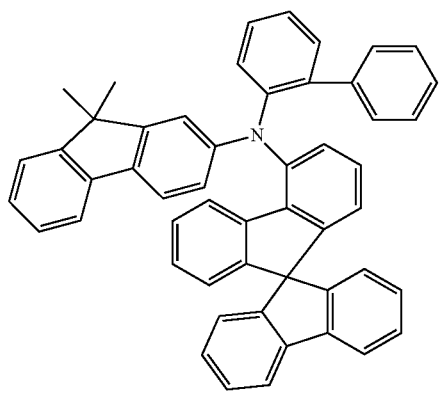
HTM2*
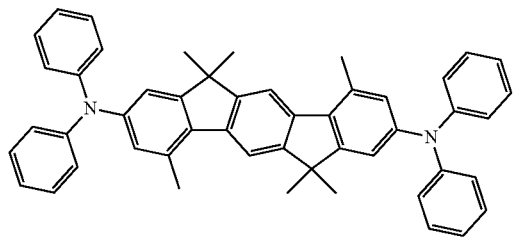
HTM3*
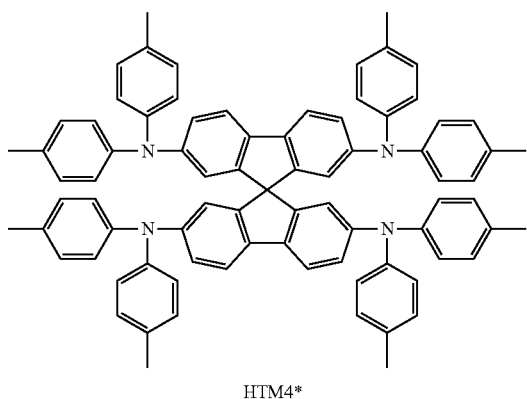
HTM4*
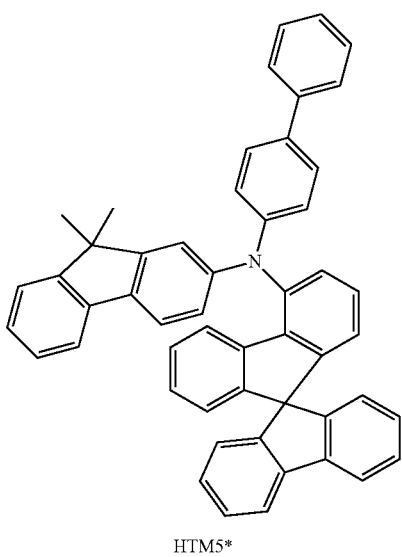 [SMILES: CC1(C)c2ccccc2-c2ccc(N(c3ccc(-c4ccccc4)cc3)c3cccc4c3-c3ccccc3C43c4ccccc4-c4ccccc43)cc21]
HTM5*

TABLE 3-continued

Structures of the materials used

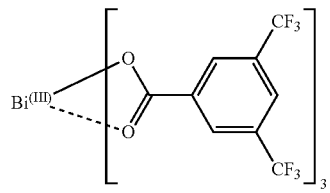

HIM1**, reduction potential: −2.24 V vs. Fc/Fc⁺ as determined by the cyclic voltammetry measurement described above.

*Synthesis according to WO 2012/035267, WO 2013/120577
**Synthesis according to WO 2013/182389

Devices with the structures shown in table 1 are produced. Table 2 shows the performance data of the examples described. The devices are hole only devices comprising a hole-injection layer according to the invention or according to the prior art. It can be shown, that very low voltages can be obtained with thin hole-injection layers consisting of HIM1 (E1 to E9) in comparison with devices, which do not comprise any hole-injection layer (V4). Furthermore, it can be shown that hole-injection layers consisting of HIM1 lead to a decrease in the operating voltage, which is comparable (V1 vs. E4) or even better (V2 vs. E5) than the operating voltage obtained when a hole-injection layer consisting of HATCN is used. Finally, the operating voltage obtained with a hole-injection layer consisting of HIM1 is comparable with the operating voltage obtained with a p-doped layer (V3 in comparison with E1-E4), whereas only one evaporation source is needed for the manufacture of the devices corresponding to E1-E4 instead of two evaporation sources for the manufacture of the device corresponding to V3.

Example 2: OLEDs

The data for various OLEDs are presented below (see Tables 4 to 5). The substrates used are glass plates coated with structured ITO (indium tin oxide) in a thickness of 50 nm. The OLEDs basically have the following layer structure: substrate/hole-injection layer (HIL)/hole-transport layer (HTL)/electron-blocking layer (EBL)/emission layer (EML)/hole-blocking layer/electron-transport layer (ETL)/electron-injection layer (EIL) and finally a cathode. The cathode is formed by an aluminium layer with a thickness of 100 nm. The precise structure of the OLEDs is shown in table 4. The materials required for the production of the OLEDs are shown in table 6.

All materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation. An expression such as SMB:SEB (5%) here means that material SMB is present in the layer in a proportion by volume of 95% SEB is present in the layer in a proportion of 5%. Analogously, other layers may also consist of a mixture of two or more materials.

The OLEDs are characterised by standard methods. For this purpose, the electroluminescence spectra and the external quantum efficiency (EQE, measured in percent) as a function of the luminous density, calculated from current/voltage/luminous density characteristic lines (IUL characteristic lines) assuming Lambert emission characteristics. The expression EQE @ 10 mA/cm² denotes the external quantum efficiency at an operating current density of 10 mA/cm².

The lifetime LT80 is the time until the brightness drops to 80% of the initial brightness (f.e. from initial brightness of 6000 cd/m² to 4800 cd/m²) at a constant current density of 60 mA/cm2. The data for the various OLEDs containing inventive and comparative materials are summarised in table 5.

TABLE 4

Device Setup

| Ex. | HIL Thickness/nm | HTL Thickness/nm | EBL Thickness/nm | EML Thickness/nm | ETL Thickness/nm | EIL Thickness/nm |
|---|---|---|---|---|---|---|
| V1 | HAT-CN(3) | HTM2 185 nm | HTM2 10 nm | SMB:SEB(5%) 20 nm | ETM:LiQ(50%) 30 nm | LiQ 1 nm |
| V2 | HAT-CN(5) | HTM2 185 nm | HTM2 10 nm | SMB:SEB(5%) 20 nm | ETM:LiQ(50%) 30 nm | LiQ 1 nm |
| E1 | HIM2(3) | HTM2 185 nm | HTM2 10 nm | SMB:SEB(5%) 20 nm | ETM:LiQ(50%) 30 nm | LiQ 1 nm |
| E1 | HIM2(3) | HTM1 185 nm | HTM2 10 nm | SMB:SEB(5%) 20 nm | ETM:LiQ(50%) 30 nm | LiQ 1 nm |

TABLE 5
| | U @ 10 mA/cm² [V] | EQE @ 10 mA/cm² [%] | LT80 @ 60 mA/cm² [h] |
|---|---|---|---|
| V1 | 5.8 | 6.6 | 90 |
| V2 | 5.5 | 5.9 | 131 |
| E1 | 4.3 | 6.8 | 435 |
| E2 | 4.0 | 7.9 | 311 |
TABLE 6
Structures of the materials used
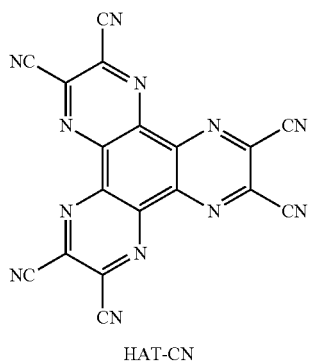 [SMILES: N#Cc1nc2c3nc(C#N)c(C#N)nc3c3nc(C#N)c(C#N)nc3c2nc1C#N]
HAT-CN
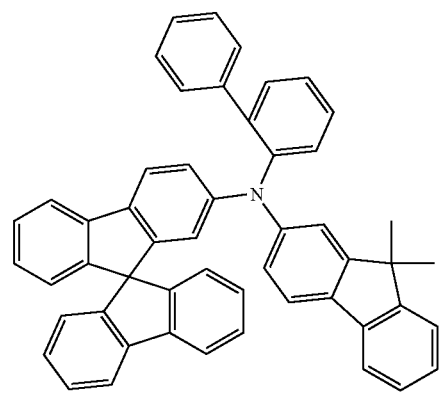
HTM1
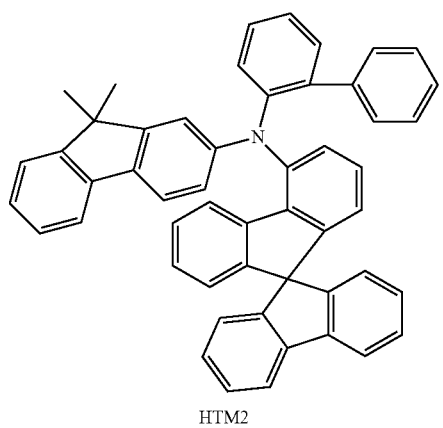
HTM2
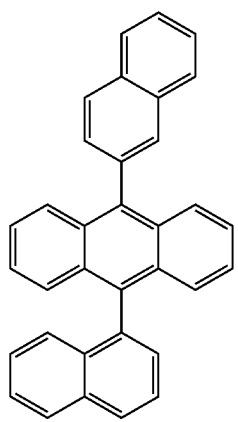
SMB TABLE 6-continued Structures of the materials used

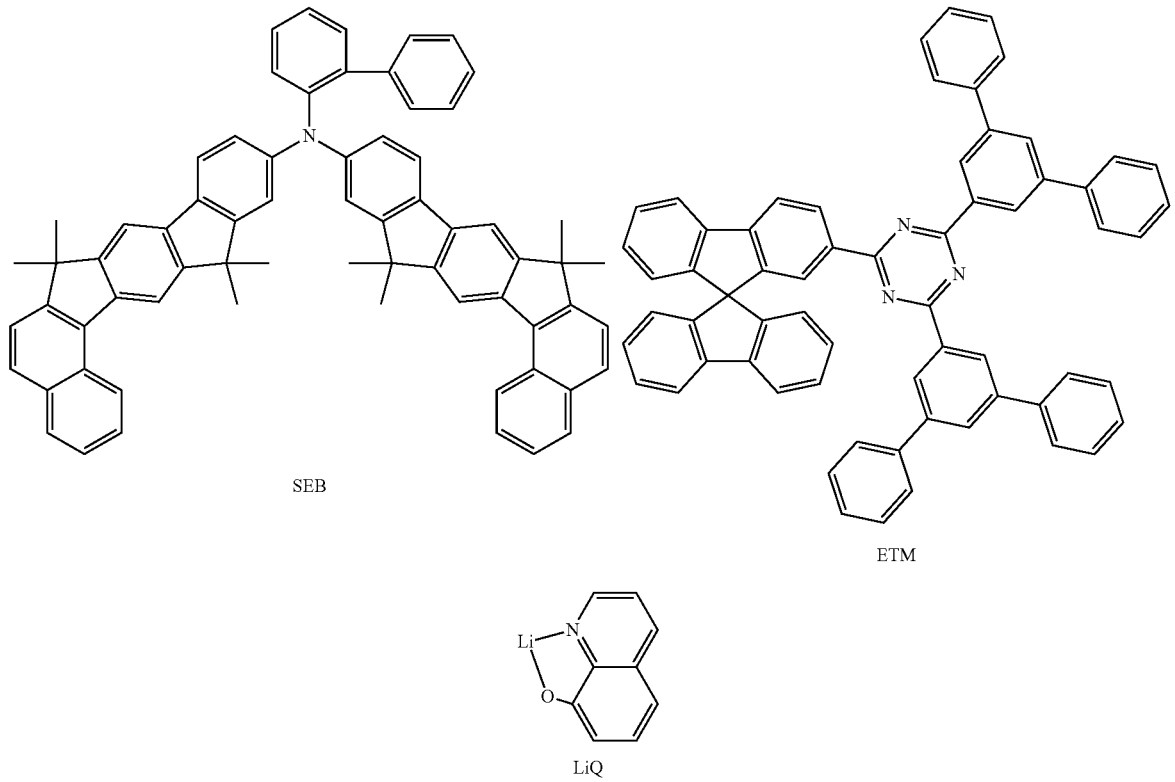

SEB

ETM

LiQ

Table 5 shows the performance data of the examples described above. Especially for example E1 much lower voltage, better efficiency and much better lifetime is achieved in a blue fluorescent device in comparison to example V1 and V2.

The invention claimed is:

1. An organic electroluminescent device comprising:
a cathode;
an anode;
at least one emitting layer arranged between the cathode and the anode;
at least one hole-transport layer arranged between the anode and the at least one emitting layer; and
at least one hole-injection layer arranged between the anode and the at least one hole-transport layer,
where the at least one hole-injection layer comprises at least 90% by weight, based on the total weight of the hole-injection layer, of at least one bismuth or gallium complex, and
where the reduction potential of the bismuth or gallium complex is higher than or equal to −3.5 V and lower than or equal to 0.5 V vs. Fc/Fc$^+$, determined by cyclic voltammetry.

2. The organic electroluminescent device according to claim 1, wherein the reduction potential of the bismuth or gallium complex is higher than or equal to −3.0 V and lower than or equal to 0 V vs. Fc/Fc$^+$.

3. The organic electroluminescent device according to claim 1, wherein the hole-injection layer has a thickness of from 0.5 to 50 nm.

4. The organic electroluminescent device according to claim 1, wherein the hole-injection layer has a thickness of from 1 to 5 nm.

5. The organic electroluminescent device according to claim 1, wherein the hole-injection layer is adjacent to the anode on the anode side and adjacent to the hole-transport layer on the cathode side.

6. The organic electroluminescent device according to claim 1, wherein the metal complex is a bismuth complex comprising a ligand of the following structure:

$$R^{11}=\overset{R^{13}}{\underset{R^{12}}{\diagdown}} \quad \text{(L-1)}$$

where
$R^{11}$ and $R^{12}$ are selected, identically or differently, from the group consisting of O, S, Se, NH and NR$^{14}$, where $R^{14}$ is an alkyl or aryl group; where $R^{14}$ and $R^{13}$ may form a ring with one other; and
$R^{13}$ is selected from the group consisting of a straight-chain alkyl, alkoxy or thioalkyl group having 1 to 40 C atoms, an alkenyl or alkinyl group having 2 to 40 C atoms, a branched or cyclic alkyl, alkoxy or thioalkyl group having 3 to 40 C atoms, each of which may be substituted by one or more radicals R, where in each case one or more non-adjacent CH$_2$ groups may be replaced by RC=CR, C≡C, Si(R)$_2$, C=O, C=S, C=NR, P(=O)(R), SO, SO$_2$, NR, O, S or CONR and where one or more H atoms may be replaced by D, F, Cl, Br, I or CN, an aromatic or heteroaromatic ring system having 5 to 60 aromatic ring atoms, which may in each case be substituted by one or more radicals R, an aryloxy or heteroaryloxy group having 5 to 60 aromatic ring atoms, which may be substituted by one or more radicals R, an aralkyl or heteroaralkyl group having 5 to 60 aromatic ring atoms, which may in each case be substituted by one or more radicals R, and a diarylamino group, diheteroarylamino group or arylheteroarylamino group having 10 to 40 aromatic ring atoms, which may be substituted by one or more radicals R; where $R^{13}$ may form a ring with at least one of the radical $R^{12}$; and R is on each occurrence, identically or differently, H, D, F or, a straight-chain alkyl group having 1 to 20 C atoms or a branched or cyclic alkyl group having 3 to 20 C atoms, where one or more H atoms in the straight-chain, branched or cyclic alkyl groups may be replaced by F, an aromatic or heteroaromatic ring system having 5 to 20 aromatic ring atoms, in which one or more H atoms in the aromatic or heteroaromatic ring system may be replaced by F; where two or more substituents R may also form a mono- or polycyclic, aliphatic or aromatic ring system with one another.

7. The organic electroluminescent device according to claim 1, wherein the bismuth complex is selected from bismuth (III) acetates and bismuth (III) benzoates.

8. The organic electroluminescent device according to claim 1, wherein the bismuth complex corresponds to a complex of the Formula (P-1):

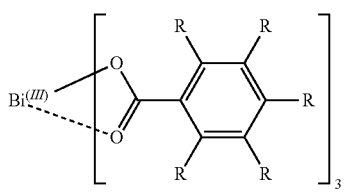

Formula (P-1)

where
R is on each occurrence, identically or differently, H, D, F or, a straight-chain alkyl group having 1 to 20 C atoms or a branched or cyclic alkyl group having 3 to 20 C atoms, where one or more H atoms in the straight-chain, branched or cyclic alkyl groups may be replaced by F, an aromatic or heteroaromatic ring system having 5 to 20 aromatic ring atoms, in which one or more H atoms in the aromatic or heteroaromatic ring system may be replaced by F; where two or more substituents R may also form a mono- or polycyclic, aliphatic or aromatic ring system with one another.

9. The organic electroluminescent device according to claim 1, wherein the at least one hole-transport layer comprises at least one triarylamine.

10. The organic electroluminescent device according to claim 1, wherein the at least one hole-transport layer comprises at least one triarylamine, which corresponds to a compound of Formula (1) or to a polymer comprising at least one structural unit of the Formula (2):

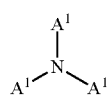

Formula (1)

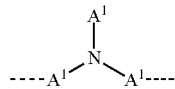

Formula (2)

where
$A^1$ is on each occurrence, identically or differently, a mono- or polycyclic, aromatic or heteroaromatic ring system having 5 to 60 aromatic ring atoms, which may be substituted by one or more radicals $R^1$;

$R^1$ is on each occurrence, identically or differently, H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C=CR^2$, C≡C, $Si(R^2)_2$, C=O, C=S, $C=NR^2$, $P(=O)(R^2)$, SO, $SO_2$, $NR^2$, O, S or $CONR^2$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or an aralkyl or heteroaralkyl group having 5 to 60 aromatic ring atoms, which may be substituted by one or more radicals $R^2$, or a diarylamino group, diheteroarylamino group or arylheteroarylamino group having 10 to 40 aromatic ring atoms, which may be substituted by one or more radicals $R^2$, where two or more radicals $R^1$ here may also form a mono- or polycyclic, aliphatic or aromatic ring system with one another;

$R^2$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents $R^2$ may also form a mono- or polycyclic, aliphatic or aromatic ring system with one another; and the dashed lines in Formula (2) represent bonds to adjacent structural limits in the polymer.

11. The organic electroluminescent device according to claim 1, wherein the at least one hole-transport layer comprises at least one monotriarylamine, which corresponds to a compound of one of the Formulae (T-1) to (T-7),

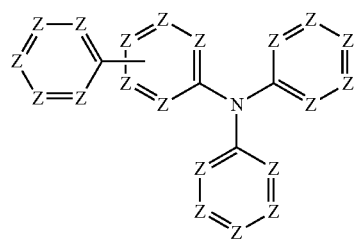

Formula (T-1)

-continued

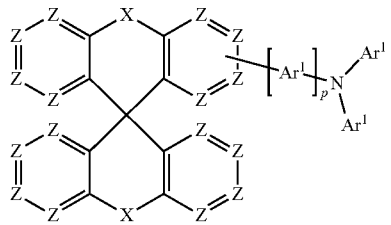
formula (T-2)

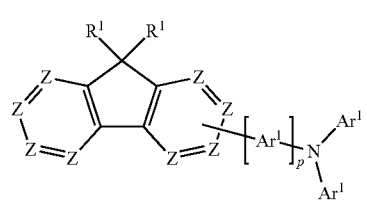
formula (T-3)

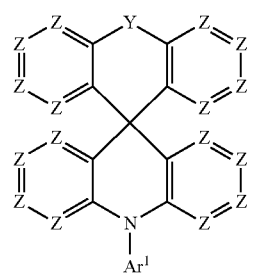
formula (T-4)

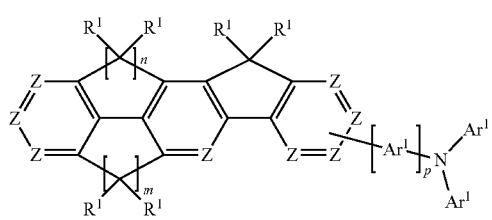
formula (T-5)

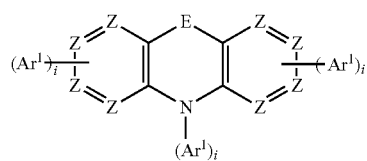
formula (T-6)

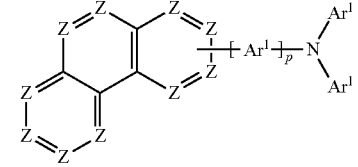
formula (T-7)

wherein $Ar^1$ is on each occurrence, identically or differently, a mono- or polycyclic, aromatic or heteroaromatic ring system having 5 to 60 aromatic ring atoms, which may be substituted by one or more radicals $R^1$;

Z is on each occurrence, identically or differently, N or $CR^1$, where Z is equal to C if a substituent is bonded;

X and Y are on each occurrence, identically or differently, a single bond, O, S, Se, $BR^1$, $C(R^1)_2$, $Si(R^1)_2$, $NR^1$, $PR^1$, $C(R^1)_2$—$C(R^1)_2$ or $CR^1$=$CR^1$;

E is O, S, Se, $BR^1$, $C(R^1)_2$, $Si(R^1)_2$, $NR^1$, $PR^1$, $C(R^1)_2$—$C(R^1)_2$ or $CR^1$=$CR^1$;

$R^1$ is on each occurrence, identically or differently, H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C$=$CR^2$, C≡C, $Si(R^2)_2$, C=O, C=S, C=$NR^2$, P(=O)($R^2$), SO, $SO_2$, $NR^2$, O, S or $CONR^2$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or an aralkyl or heteroaralkyl group having 5 to 60 aromatic ring atoms, which may be substituted by one or more radicals $R^2$, or a diarylamino group, dihtteroarylamino group or arylheteroarylamino group having 10 to 40 aromatic ring atoms, which may be substituted by one or more radicals $R^2$, where two or more radicals $R^1$ here may also form a mono- or polycyclic, aliphatic or aromatic ring system with one another;

$R^2$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents $R^2$ may also form a mono- or polycyclic, aliphatic or aromatic ring system with one another;

i is on each occurrence, identically or differently, 0 or 1, where the sum of all i is at least equal to 1;

p is equal to 0 or 1;

m and n are, identically or differently, 0 or 1, where the sum of m and n is equal to 1 or 2.

12. The organic electroluminescent device according to claim 1, wherein the at least one hole-transport layer comprises at least one monotriarylamine, which corresponds to a compound of one of the Formulae (T-2-1) to (T-2-4),

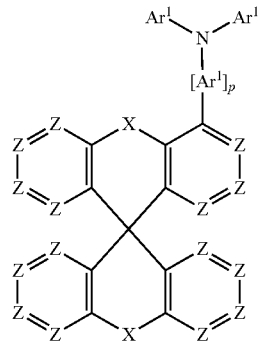
Formula (T-2-1)

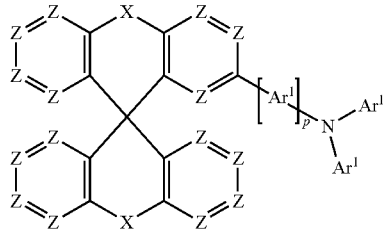
Formula (T-2-2)

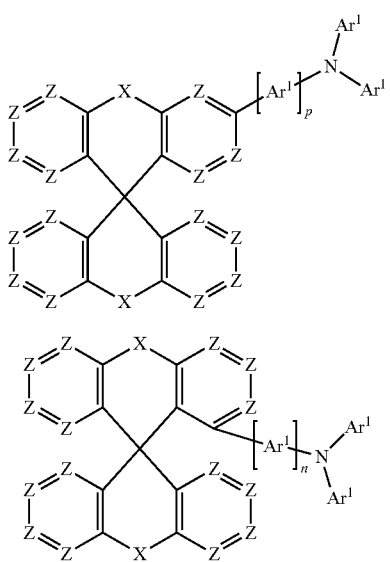

Formula (T-2-3)

Formula (T-2-4)

wherein

Ar¹ is on each occurrence, identically or differently, a mono- or polycyclic, aromatic or heteroaromatic ring system having 5 to 60 aromatic ring atoms, which may be substituted by one or more radicals R¹;

Z is on each occurrence, identically or differently, N or CR¹, where Z is equal to C if a substituent is bonded;

X is on each occurrence, identically or differently, a single bond, O, S, Se, BR¹, C(R¹)$_2$, Si(R¹)$_2$, NR¹, PR¹, C(R¹)$_2$—C(R¹)$_2$ or CR¹═CR¹;

R¹ is on each occurrence, identically or differently, H, D, F, Cl, Br, I, N(R²)$_2$, CN, NO$_2$, Si(R²)$_3$, B(OR²)$_2$, C(═O)R², P(═O)(R²)$_2$, S(═O)R², S(═O)$_2$R², OSO$_2$R², a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R², where one or more non-adjacent CH2 groups may be replaced by R²C═CR², C≡C, Si(R²)$_2$, C═O, C═S, C═NR², P(═O)(R²), SO, SO$_2$, NR², O, S or CONR² and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals R², or an aryloxy or heteroaryloxy group having 5 to 60 aromatic ring atoms, which may be substituted by one or more radicals R², or an aralkyl or heteroaralkyl group having 5 to 60 aromatic ring atoms, which may be substituted by one or more radicals R², or a diarylamino group, diheteroarylamino group or arylheteroarylamino group having 10 to 40 aromatic ring atoms, which may be substituted by one or more radicals R², where two or more radicals R¹ here may also form a mono- or polycyclic, aliphatic or aromatic ring system with one another;

R² is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F;

where two or more substituents R² may also form a mono- or polycyclic, aliphatic or aromatic ring system with one another; and p is equal to 0 or 1.

13. The organic electroluminescent device according to claim 12, wherein the at least one monotriarylamine corresponds to a compound of formula (T-2-1).

14. The organic electroluminescent device according to claim 11, wherein X is a single bond and Z is C(R¹)$_2$.

15. A method for producing the organic electroluminescent device according to claim 1 comprising the following steps:
  a. Depositing a hole-injection layer comprising at least 90% by weight, based on the total weight of the hole-injection layer, of at least one bismuth complex or gallium complex on an anode;
  b. Depositing at least one hole-transport layer on the hole-injection layer;
  c. Depositing at least one emitting layer;
  d. Forming a cathode.

16. A method according to claim 15, wherein the hole-injection layer, the hole-transport layer and the emitting layer are deposited, differently or identically, via a vapour deposition process and/or a solution-based process.

17. The organic electroluminescent device according to claim 1, wherein the bismuth or gallium complexes are selected from the group consisting of

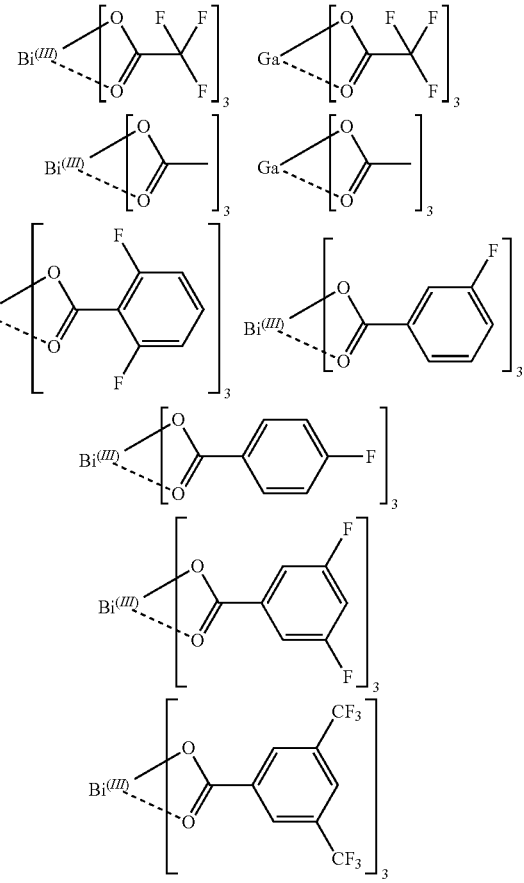

-continued
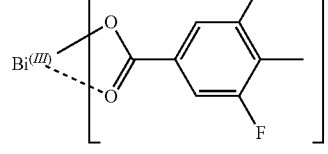
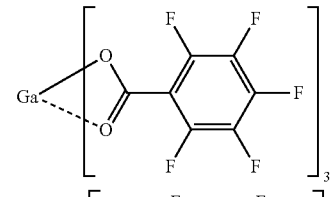
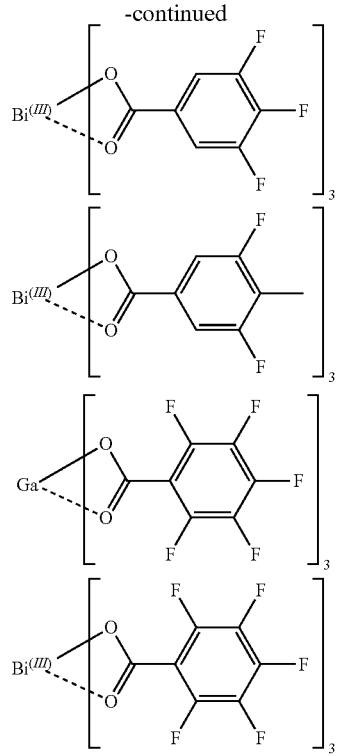
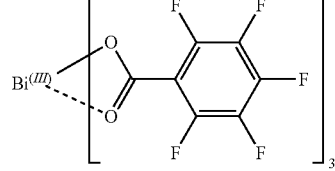
-continued
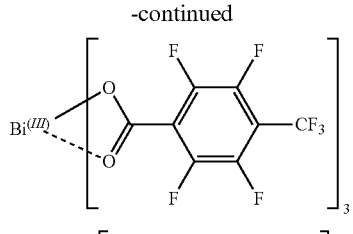
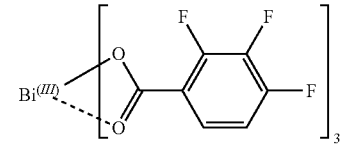
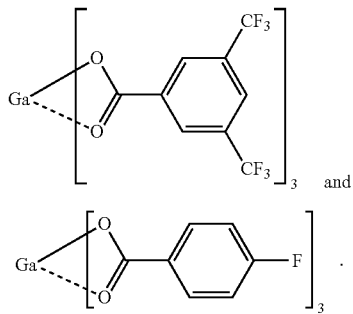
and
* * * * *